US012696625B2

(12) United States Patent
Li et al.

(10) Patent No.: US 12,696,625 B2
(45) Date of Patent: Jul. 28, 2026

(54) ARRAY SUBSTRATE AND DISPLAY APPARATUS WITH SIGNAL LINE OVERLAPPING LIGHT TRANSMISSIVE APERTURE

(71) Applicants: Chengdu BOE Optoelectronics Technology Co., Ltd., Chengdu (CN); BOE Technology Group Co., Ltd., Beijing (CN)

(72) Inventors: Shuo Li, Beijing (CN); Ling Shi, Beijing (CN)

(73) Assignees: Chengdu BOE Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 520 days.

(21) Appl. No.: 18/255,101

(22) PCT Filed: Jul. 28, 2022

(86) PCT No.: PCT/CN2022/108555
§ 371 (c)(1),
(2) Date: May 31, 2023

(87) PCT Pub. No.: WO2024/020928
PCT Pub. Date: Feb. 1, 2024

(65) Prior Publication Data
US 2024/0357869 A1 Oct. 24, 2024

(51) Int. Cl.
*H10K 59/122* (2023.01)
*H10K 59/131* (2023.01)
(52) U.S. Cl.
CPC ......... *H10K 59/122* (2023.02); *H10K 59/131* (2023.02)

(58) Field of Classification Search
CPC ........................... H10K 59/122; H10K 59/131
See application file for complete search history.

(56) References Cited

U.S. PATENT DOCUMENTS 10,217,802 B2 * 2/2019 Hwang .................. H10K 59/35
10,923,543 B1 2/2021 Chen
(Continued)

FOREIGN PATENT DOCUMENTS

CN 101237517 A 8/2008
CN 103177702 A 6/2013
(Continued)

OTHER PUBLICATIONS

International Search Report & Written Opinion mailed Apr. 12, 2023, regarding PCT/CN2022/108555.

*Primary Examiner* — Lex H Malsawma
(74) *Attorney, Agent, or Firm* — Intellectual Valley Law, P.C.

(57) ABSTRACT
An array substrate is provided. The array substrate includes a second signal line layer including a plurality of signal lines on a base substrate; an anode layer on a side of the second signal line layer away from the base substrate; a pixel definition layer on a side of the anode layer away from the second signal line layer; and a plurality of light transmissive apertures extending through the pixel definition layer, the plurality of light transmissive apertures spaced apart from each other. At least one of the plurality of signal lines includes a first segment extending along a first direction, and a second segment. An orthographic projection of a central line of the first segment extending along the first direction on the base substrate intersects with an orthographic projection of at least one light transmissive aperture of the plurality of light transmissive apertures on the base substrate.

18 Claims, 51 Drawing Sheets

(56)     References Cited

U.S. PATENT DOCUMENTS

| | | | | |
|---|---|---|---|---|
| 11,423,840 B2 * | 8/2022 | Shang | .................. | H10K 59/353 |
| 11,462,593 B2 * | 10/2022 | Huang | ................. | H10D 86/481 |
| 11,943,984 B2 * | 3/2024 | Dai | ..................... | H10K 59/353 |
| 12,279,488 B2 * | 4/2025 | Shi | ....................... | H10K 59/353 |
| 2002/0172412 A1 | 11/2002 | Jun et al. | | |
| 2004/0223005 A1 | 11/2004 | Lee | | |
| 2007/0046573 A1 | 3/2007 | Kim | | |
| 2016/0260792 A1 | 9/2016 | Kim et al. | | |
| 2017/0242308 A1 | 8/2017 | Seki et al. | | |
| 2017/0345877 A1 * | 11/2017 | Hwang | ................ | H10K 59/131 |
| 2018/0342570 A1 * | 11/2018 | Hong | .................. | H10K 59/353 |
| 2020/0410921 A1 * | 12/2020 | Kim | ..................... | G09G 3/3233 |
| 2021/0066427 A1 * | 3/2021 | Ma | ......................... | H04N 23/57 |
| 2021/0134926 A1 * | 5/2021 | Song | .................. | H01L 25/167 |
| 2021/0165287 A1 | 6/2021 | Jiang et al. | | |
| 2021/0216157 A1 * | 7/2021 | Jeong | .................. | G06F 3/0446 |
| 2021/0359074 A1 * | 11/2021 | You | ..................... | H10K 59/121 |
| 2021/0391407 A1 * | 12/2021 | Yoon | .................... | G06F 1/1626 |
| 2021/0408203 A1 * | 12/2021 | Shi | ...................... | H10K 59/352 |
| 2022/0059633 A1 * | 2/2022 | Kang | .................. | H10K 50/844 |
| 2022/0115480 A1 * | 4/2022 | Park | .................... | H10K 59/131 |
| 2022/0208866 A1 * | 6/2022 | Park | .................. | H10K 59/1315 |
| 2022/0310708 A1 * | 9/2022 | Dai | ...................... | H10K 59/353 |
| 2022/0328579 A1 | 10/2022 | Shang et al. | | |
| 2022/0328611 A1 | 10/2022 | Lu et al. | | |

FOREIGN PATENT DOCUMENTS

| | | |
|---|---|---|
| CN | 106707627 A | 5/2017 |
| CN | 107121804 A | 9/2017 |
| CN | 112838103 A | 5/2021 |
| CN | 113078201 A | 7/2021 |
| CN | 113437232 A | 9/2021 |
| CN | 113745272 A | 12/2021 |
| CN | 215578568 U | 1/2022 |
| JP | 2007065616 A | 3/2007 |
| KR | 910003480 B1 | 6/1991 |
| KR | 20020056220 A | 7/2002 |
| KR | 20040083786 A | 10/2004 |

* cited by examiner

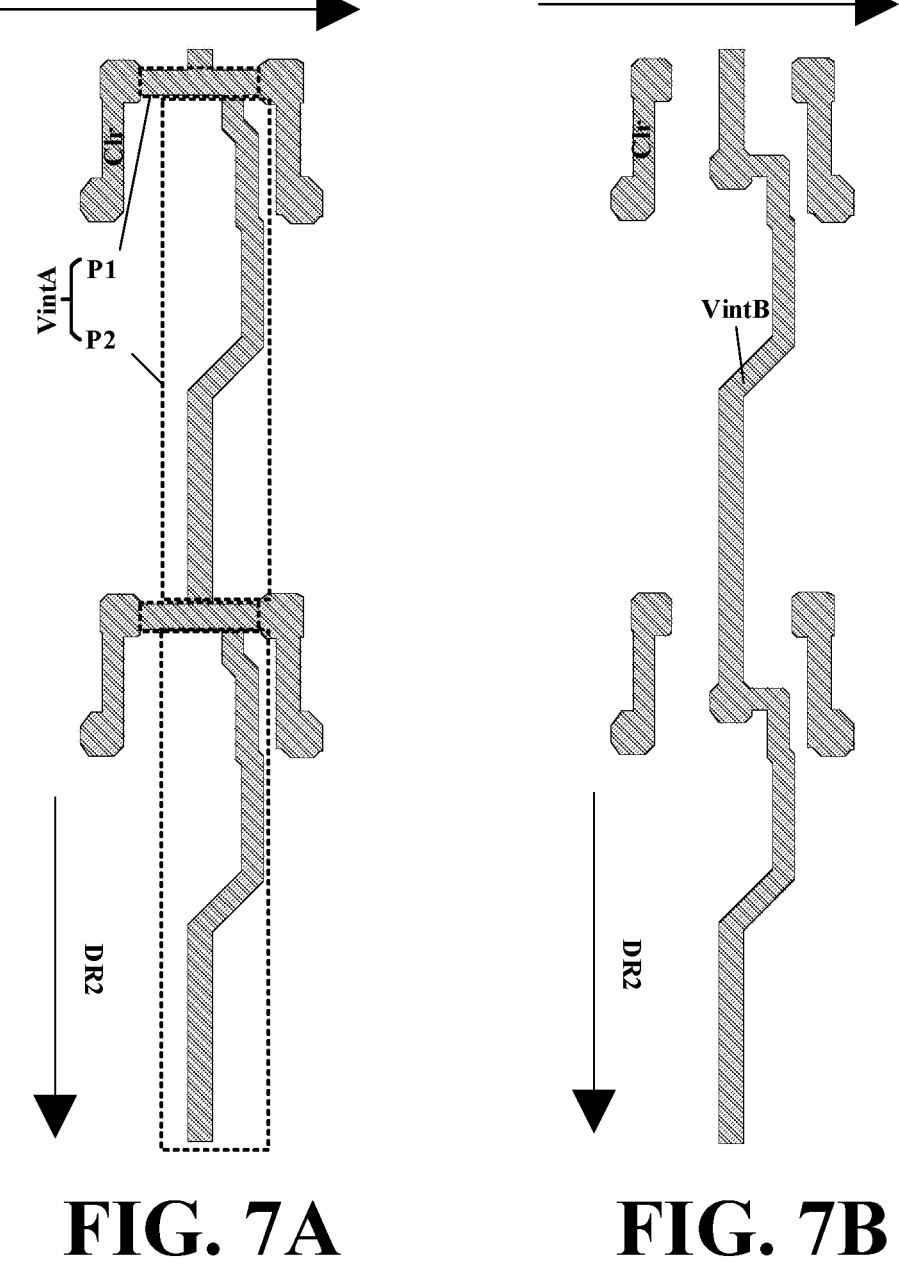
FIG. 7A        FIG. 7B

ARRAY SUBSTRATE AND DISPLAY APPARATUS WITH SIGNAL LINE OVERLAPPING LIGHT TRANSMISSIVE APERTURE

CROSS-REFERENCE TO RELATED APPLICATION

This application is a national stage application under 35 U.S.C. § 371 of International Application No. PCT/CN2022/108555, filed Jul. 28, 2022, the contents of which are incorporated by reference in the entirety.

TECHNICAL FIELD

The present invention relates to display technology, more particularly, to an array substrate and a display apparatus.

BACKGROUND

Organic Light Emitting Diode (OLED) display is one of the hotspots in the field of flat panel display research today. Unlike Thin Film Transistor-Liquid Crystal Display (TFT-LCD), which uses a stable voltage to control brightness, OLED is driven by a driving current required to be kept constant to control illumination. The OLED display panel includes a plurality of pixel units configured with pixel-driving circuits arranged in multiple rows and columns. Each pixel-driving circuit includes a driving transistor having a gate terminal connected to one gate line per row and a drain terminal connected to one data line per column. When the row in which the pixel unit is gated is turned on, the switching transistor connected to the driving transistor is turned on, and the data voltage is applied from the data line to the driving transistor via the switching transistor, so that the driving transistor outputs a current corresponding to the data voltage to an OLED device. The OLED device is driven to emit light of a corresponding brightness.

SUMMARY

In one aspect, the present disclosure provides an array substrate, comprising a second signal line layer on a base substrate; an anode layer on a side of the second signal line layer away from the base substrate; a pixel definition layer on a side of the anode layer away from the second signal line layer; and a plurality of light transmissive apertures extending through the pixel definition layer, the plurality of light transmissive apertures spaced apart from each other; wherein the second signal line layer comprises a plurality of signal lines; at least one of the plurality of signal lines comprises a first segment extending along a first direction, and a second segment; an orthographic projection of a central line of the first segment extending along the first direction on the base substrate intersects with an orthographic projection of at least one light transmissive aperture of the plurality of light transmissive apertures on the base substrate; and the second segment is displaced along a second direction relative to the first segment, the second direction intersecting the first direction.

Optionally, the first segment and the second segment are parts of a respective data line of a plurality of data lines; and an orthographic projection of the second segment on the base substrate is spaced apart from orthographic projections of the plurality of light transmissive apertures on the base substrate.

Optionally, the second segment comprises a first sub-segment extending along the second direction, a second sub-segment extending along the first direction, and a third sub-segment extending along a third direction; the third direction intersecting the first direction and the second direction; and the first segment, the first sub-segment, the second sub-segment, the third sub-segment are sequentially arranged in the at least one of the plurality of signal lines.

Optionally, the anode layer comprises a plurality of anodes respectively in a plurality of subpixels; a second signal line layer comprises a plurality of voltage supply lines and a plurality of data lines configured to provide signals to the plurality of subpixels; and an orthographic projection of the plurality of anodes on a base substrate at least partially overlaps with an orthographic projection of the plurality of voltage supply lines or the plurality of data lines on the base substrate.

Optionally, the plurality of anodes comprise a first respective anode of a subpixel of a first color and a second respective anode of a subpixel of a second color; an orthographic projection of the first respective anode on the base substrate is at least 90% covered by an orthographic projection of a respective voltage supply line of the plurality of voltage supply lines on the base substrate; and an orthographic projection of the second respective anode on the base substrate is at least 90% covered by an orthographic projection of the respective voltage supply line of the plurality of voltage supply lines on the base substrate.

Optionally, an orthographic projection of an effective light emission area of the subpixel of the first color on the base substrate is completely covered by an orthographic projection of a respective voltage supply line of the plurality of voltage supply lines on the base substrate.

Optionally, the plurality of anodes comprise a third respective anode of a subpixel of a third color; the second signal line layer comprises a plurality of voltage supply lines and a plurality of data lines; and an orthographic projection of the third respective anode on the base substrate partially overlaps with orthographic projections of two adjacent data lines of the plurality of data lines on the base substrate, and partially overlaps with orthographic projections of two adjacent voltage supply lines of the plurality of voltage supply lines on the base substrate.

Optionally, the plurality of voltage supply lines comprise a first adjacent voltage supply line and a second adjacent voltage supply line; the plurality of data lines comprise a first adjacent data line and a second adjacent data line; the first adjacent voltage supply line comprises a first main body and a first branch extending away from the first main body; the second adjacent voltage supply line comprises a second main body and a second branch extending away from the second main body; the first main body, the first branch, the first adjacent data line, the second adjacent data line, the second branch, and the second main body are sequentially arranged along a second direction; and the orthographic projection of the third respective anode on the base substrate partially overlaps with orthographic projections of the first main body, the first branch, the first adjacent data line, the second adjacent data line, the second branch, and the second main body on the base substrate.

Optionally, an orthographic projection of the plurality of light transmissive apertures on the base substrate is substantially non-overlapping with orthographic projections of semiconductor material layers and conductive layers of the array substrate on the base substrate.

Optionally, the array substrate further comprises a first conductive layer comprising a plurality of second reset signal lines, the first conductive layer on a side of the second signal line layer closer to the base substrate; wherein the second signal line layer comprises a plurality of data lines; a respective light transmissive aperture of the plurality of light transmissive apertures is in a region surrounded by two adjacent data lines of the plurality of data lines, and a respective second reset signal line of a plurality of second reset signal lines; and at least portions of orthographic projections of the two adjacent data lines on the base substrate and at least portions of orthographic projections of the respective second reset signal line on the base substrate are along an edge of an orthographic projection of the respective light transmissive aperture on the base substrate.

Optionally, the array substrate comprises, in a region surrounding a respective light transmissive aperture of the plurality of light transmissive apertures, a first main body of a first adjacent voltage supply line, a first adjacent data line, a second adjacent data line, a second main body of a second adjacent voltage supply line, sequentially arranged; wherein the respective light transmissive aperture is in a region surrounded by a respective second reset signal line, the first adjacent data line, and the second adjacent data line; and an orthographic projection of the respective second reset signal line on the base substrate partially overlaps with each of orthographic projections of the first main body, the first adjacent data line, the second adjacent data line, and the second main body on the base substrate.

Optionally, corresponding layers of a first pixel driving circuit and corresponding layers of a second pixel driving circuit directly adjacent to each other and in a same row have a substantially mirror symmetry with respect to each other about a plane perpendicular to a main surface of the array substrate and substantially parallel to extension directions of a plurality of data lines.

Optionally, the array substrate further comprises a plurality of first reset signal lines and a plurality of second reset signal lines extending along the second direction; and a plurality of third reset signal lines and a plurality of fourth reset signal lines extending along the first direction; wherein the plurality of third reset signal lines and the plurality of fourth reset signal lines are in a layer different from the plurality of first reset signal lines and the plurality of second reset signal lines.

Optionally, the array substrate comprises a plurality of pixel driving circuits arranged in columns, including (4k−3)-th columns, (4k−2)-th columns, (4k−1)-th columns, and (4k)-th columns of K columns, K and k being positive integers, $1 \leq k \leq (K/4)$; a respective third reset signal line of the plurality of third reset signal lines is configured to provide reset signals to a (4k−3)-th column of pixel driving circuits and a (4k−2)-th column of pixel driving circuits; and a respective fourth reset signal line of the plurality of fourth reset signal lines is configured to provide reset signals to a (4k−1)-th column of pixel driving circuits and a (4k)-th column of pixel driving circuit.

Optionally, a respective third reset signal line of the plurality of third reset signal lines is electrically connected to the plurality of first reset signal lines, and is electrically isolated from the plurality of second reset signal lines; and a respective fourth reset signal line of the plurality of fourth reset signal lines is electrically connected to the plurality of second reset signal lines, and is electrically isolated from the plurality of first reset signal lines.

Optionally, a respective third reset signal line of the plurality of third reset signal lines and a respective fourth reset signal line of the plurality of fourth reset signal lines have different line patterns.

Optionally, the respective third reset signal line and reset signal connecting lines of pixel driving circuits in the (4k−3)-th column and the (4k−2)-th column are part of a unitary structure; and the respective third reset signal line is electrically connected to sources electrodes of first reset transistors of pixel driving circuits in the (4k−3)-th column and the (4k−2)-th column.

Optionally, the respective third reset signal line comprises multiple first parts and multiple second parts alternately arranged; a respective first part of the multiple first parts connects two adjacent second parts of the multiple second parts together; a respective second part of the multiple second parts connects two adjacent first parts of the multiple first parts together; and the respective first part connects two adjacent reset signal connecting lines respectively from two adjacent pixel driving circuits in the (4k−3)-th column and the (4k−2)-th column together.

Optionally, the respective fourth reset signal line is electrically connected to sources electrodes of second reset transistors of pixel driving circuits in the (4k−1)-th column and the (4k)-th column; and the respective fourth reset signal line is disconnected from reset signal connecting lines of pixel driving circuits in the (4k−1)-th column and the (4k)-th column.

Optionally, corresponding layers other than a first signal line layer of a first pixel driving circuit and corresponding layers other than the first signal line layer of a second pixel driving circuit have a substantially mirror symmetry with respect to each other about a plane perpendicular to a main surface of the array substrate and substantially parallel to extension directions of a plurality of data lines, the first pixel driving circuit and the second pixel driving circuit being directly adjacent to each other and in a same row.

Optionally, the array substrate comprises a first interconnected reset signal supply network configured to provide reset signals to source electrodes of first reset transistors and a second interconnected reset signal supply network configured to provide reset signals to source electrodes of second reset transistors; wherein the first interconnected reset signal supply network comprises the plurality of first reset signal lines and the plurality of third reset signal lines; a respective first reset signal line is connected to one or more of the plurality of third reset signal lines; a respective third reset signal line is connected to one or more of the plurality of first reset signal lines; and the plurality of first reset signal lines respectively cross over the plurality of third reset signal lines; wherein the second interconnected reset signal supply network comprises the plurality of second reset signal lines respectively and the plurality of fourth reset signal lines; a respective second reset signal line is connected to one or more of the plurality of fourth reset signal lines; a respective fourth reset signal line is connected to one or more of the plurality of second reset signal lines; and the plurality of second reset signal lines respectively cross over the plurality of fourth reset signal lines.

Optionally, source electrodes of second reset transistors respectively from two adjacent subpixels are connected together; and a respective second reset signal line of a plurality of second reset signal lines is connected to the source electrodes of the second reset transistors respectively from the two adjacent subpixels through a same via.

Optionally, the array substrate further comprises a semiconductor material layer; and a second conductive layer on a side of the semiconductor material layer away from the base substrate; wherein the second conductive layer comprises an interference preventing block; an orthographic projection of the interference preventing block on the base substrate at least partially overlaps with orthographic projections of two semiconductor material portions of the semiconductor material layer on the base substrate; the two semiconductor material portions comprises a first semiconductor material portion and a second semiconductor material portion; an orthographic projection of the first semiconductor material portion on the base substrate is between orthographic projections of double gates of a compensating transistor in a first adjacent pixel driving circuit on the base substrate; the first semiconductor material portion connects two channel parts of the compensating transistor in the first adjacent pixel driving circuit; an orthographic projection of the second semiconductor material portion on the base substrate is between the orthographic projections of double gates of a compensating transistor in a second adjacent pixel driving circuit on the base substrate; and the second semiconductor material portion connects two channel parts of the compensating transistor in the second adjacent pixel driving circuit.

In another aspect, the present disclosure provides a display apparatus, comprising the array substrate described herein, and one or more integrated circuits connected to the array substrate.

BRIEF DESCRIPTION OF THE FIGURES

The following drawings are merely examples for illustrative purposes according to various disclosed embodiments and are not intended to limit the scope of the present invention.

FIG. 7A illustrates the structure of a respective third reset signal line in some embodiments according to the present disclosure.

FIG. 7B illustrates the structure of a respective fourth reset signal line in some embodiments according to the present disclosure.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, an array substrate and a display apparatus that substantially obviate one or more of the problems due to limitations and disadvantages of the related art. In one aspect, the present disclosure provides an array substrate. In some embodiments, the array substrate includes a second signal line layer on a base substrate; an anode layer on a side of the second signal line layer away from the base substrate; a pixel definition layer on a side of the anode layer away from the second signal line layer; and a plurality of light transmissive apertures extending through the pixel definition layer, the plurality of light transmissive apertures spaced apart from each other. Optionally, the second signal line layer comprises a plurality of signal lines. Optionally, at least one of the plurality of signal lines comprises a first segment extending along a first direction, and a second segment. Optionally, an orthographic projection of a central line of the first segment extending along the first direction on the base substrate intersects with an orthographic projection of at least one light transmissive aperture of the plurality of light transmissive apertures on the base substrate. Optionally, the second segment is displaced along a second direction relative to the first segment, the second direction intersecting the first direction.

Various appropriate pixel driving circuits may be used in the present array substrate. Examples of appropriate driving circuits include 3T1C, 2T1C, 4T1C, 4T2C, 5T2C, 6T1C, 7T1C, 7T2C, 8T1C, and 8T2C. In some embodiments, the respective one of the plurality of pixel driving circuits is an 7T1C driving circuit. Various appropriate light emitting elements may be used in the present array substrate. Examples of appropriate light emitting elements include organic light emitting diodes, quantum dots light emitting diodes, and micro light emitting diodes. Optionally, the light emitting element is micro light emitting diode. Optionally, the light emitting element is an organic light emitting diode including an organic light emitting layer.

Figure 1:
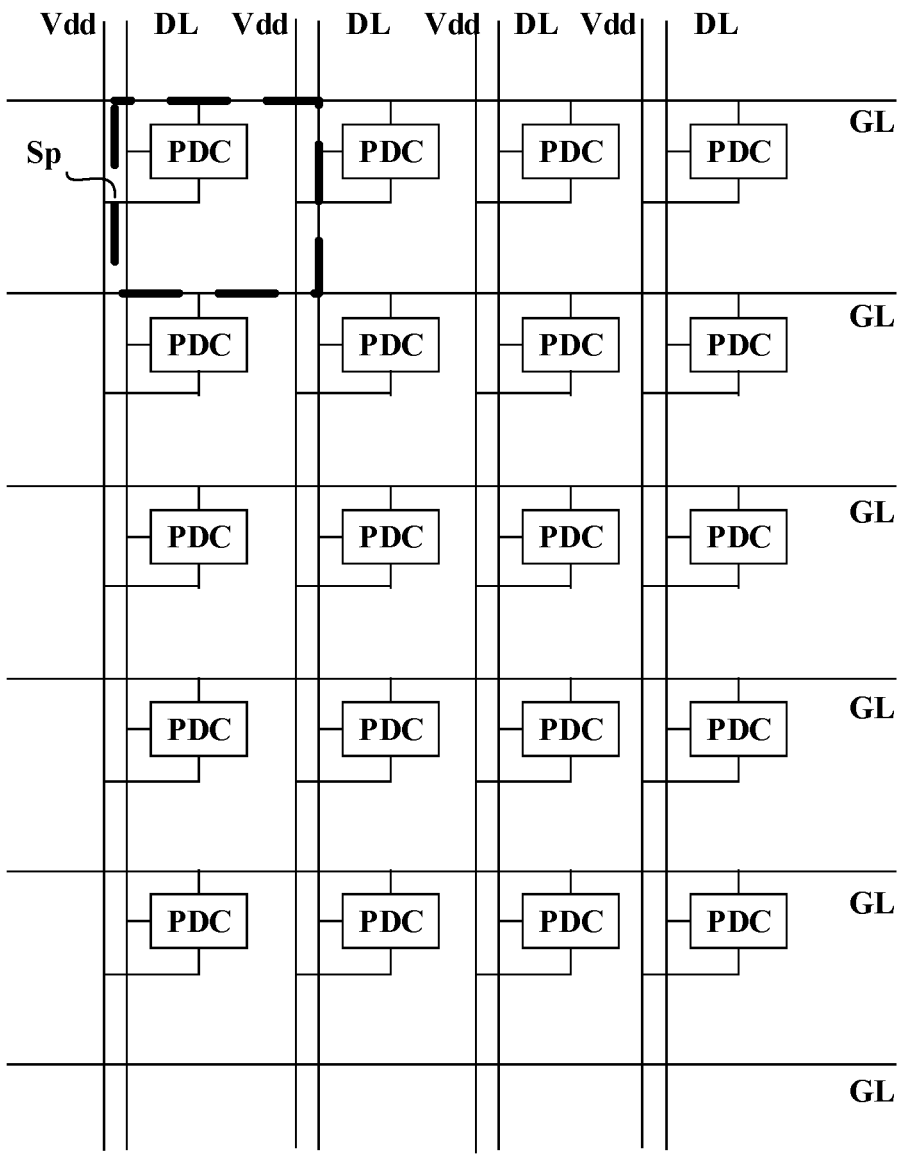
FIG. 1 is a plan view of an array substrate in some embodiments according to the present disclosure.

FIG. 1 is a plan view of an array substrate in some embodiments according to the present disclosure. Referring to FIG. 1, the array substrate includes an array of subpixels Sp. Each subpixel includes an electronic component, e.g., a light emitting element. In one example, the light emitting element is driven by a respective pixel driving circuit PDC. The array substrate includes a plurality of gate lines GL, a plurality of data lines DL, and a plurality of voltage supply lines Vdd. Light emission in a respective subpixel is driven by a respective pixel driving circuit PDC. In one example, a high voltage signal is input, through a respective one of the plurality of voltage supply lines Vdd, to the respective pixel driving circuit PDC connected to an anode of the light emitting element; a low voltage signal is input to a cathode of the light emitting element. A voltage difference between the high voltage signal (e.g., the VDD signal) and the low voltage signal (e.g., the VSS signal) is a driving voltage $\Delta V$ that drives light emission in the light emitting element.

The array substrate in some embodiments includes a plurality of subpixels. In some embodiments, the plurality of subpixels includes a respective first subpixel, a respective second subpixel, a respective third subpixel, and a respective fourth subpixel. Optionally, a respective pixel of the array substrate includes the respective first subpixel, the respective second subpixel, the respective third subpixel, and the respective fourth subpixel. The plurality of subpixels in the array substrate are arranged in an array. In one example, the array of the plurality of subpixels includes a S1-S2-S3-S4 format repeating array, in which S1 stands for the respective first subpixel, S2 stands for the respective second subpixel, S3 stands for the respective third subpixel, and S4 stands for the respective fourth subpixel. In another example, the S1-S2-S3-S4 format is a C1-C2-C3-C4 format, in which C1 stands for the respective first subpixel of a first color, C2 stands for the respective second subpixel of a second color, C3 stands for the respective third subpixel of a third color, and C4 stands for the respective fourth subpixel of a fourth color. In another example, the S1-S2-S3-S4 format is a C1-C2-C3-C2' format, in which C1 stands for the respective first subpixel of a first color, C2 stands for the respective second subpixel of a second color, C3 stands for the respective third subpixel of a third color, and C2' stands for the respective fourth subpixel of the second color. In another example, the C1-C2-C3-C2' format is a R-G-B-G format, in which the respective first subpixel is a red subpixel, the respective second subpixel is a green subpixel, the respective third subpixel is a blue subpixel, and the respective fourth subpixel is a green subpixel.

In some embodiments, a minimum repeating unit of the plurality of subpixels of the array substrate includes the respective first subpixel, the respective second subpixel, the respective third subpixel, and the respective fourth subpixel. Optionally, each of the respective first subpixel, the respective second subpixel, the respective third subpixel, and the respective fourth subpixel, includes the first transistor T1, the second transistor T2, the third transistor T3, the fourth transistor T4, the fifth transistor T5, the sixth transistor T6, and the driving transistor Td.

Figure 2A:
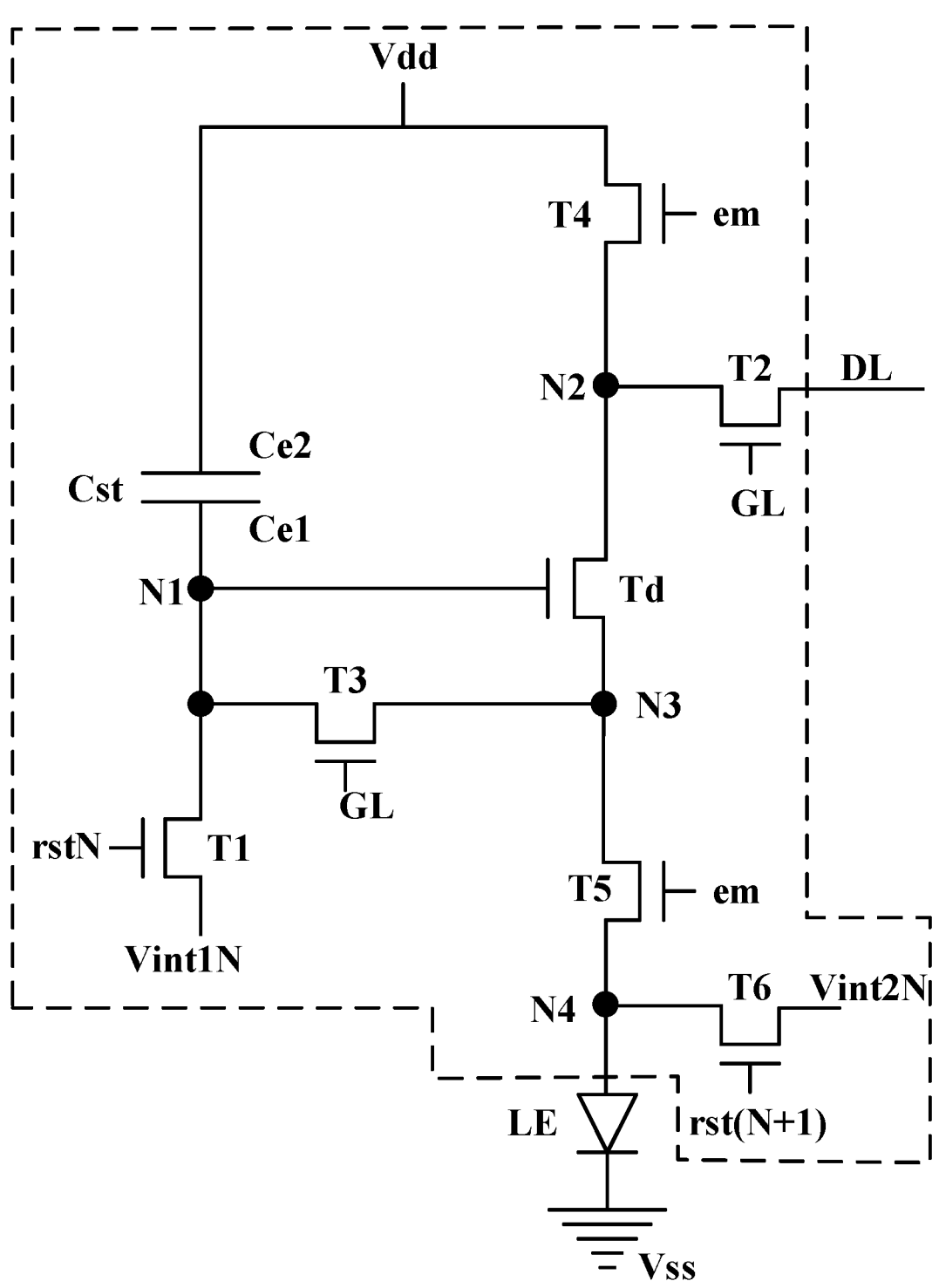
FIG. 2A is a circuit diagram illustrating the structure of a pixel driving circuit in some embodiments according to the present disclosure.

FIG. 2A is a circuit diagram illustrating the structure of a pixel driving circuit in some embodiments according to the present disclosure. Referring to FIG. 2A, in some embodiments, the respective pixel driving circuit includes a driving transistor Td; a storage capacitor Cst having a first capacitor electrode Ce1 and a second capacitor electrode Ce2; a first transistor T1 having a gate electrode connected to a respective reset control signal line rstN in a present stage (or a present row) of a plurality of reset control signal lines, a source electrode connected to a respective first reset signal line Vint1N in a present stage (or a present row) of a plurality of first reset signal lines, and a drain electrode connected to a first capacitor electrode Ce1 of the storage capacitor Cst and a gate electrode of the driving transistor Td; a second transistor T2 having a gate electrode connected to a respective gate line of a plurality of gate lines GL, a source electrode connected to a respective data line of a plurality of data lines DL, and a drain electrode connected to a source electrode of the driving transistor Td; a third transistor T3 having a gate electrode connected to the respective gate line, a source electrode connected to the first capacitor electrode Ce1 of the storage capacitor Cst and the gate electrode of the driving transistor Td, and a drain electrode connected to a drain electrode of the driving transistor Td; a fourth transistor T4 having a gate electrode connected to a respective light emitting control signal line of a plurality of light emitting control signal lines em, a source electrode connected to a respective voltage supply line of a plurality of voltage supply lines Vdd, and a drain electrode connected to the source electrode of the driving transistor Td and the drain electrode of the second transistor T2; a fifth transistor T5 having a gate electrode connected to the respective light emitting control signal line, a source electrode connected to drain electrodes of the driving transistor Td and the third transistor T3, and a drain electrode connected to an anode of a light emitting element LE; and a sixth transistor T6 having a gate electrode connected to a respective reset control signal line rst(N+1) in a next adjacent stage (or a next adjacent row) of a plurality of reset control signal lines, a source electrode connected to a respective second reset signal line Vint2N in the present stage (or the present row) of the plurality of second reset signal lines, and a drain electrode connected to the drain electrode of the fifth transistor and the anode of the light emitting element LE. The second capacitor electrode Ce2 is connected to the respective voltage supply line and the source electrode of the fourth transistor T4.

Figure 2B:
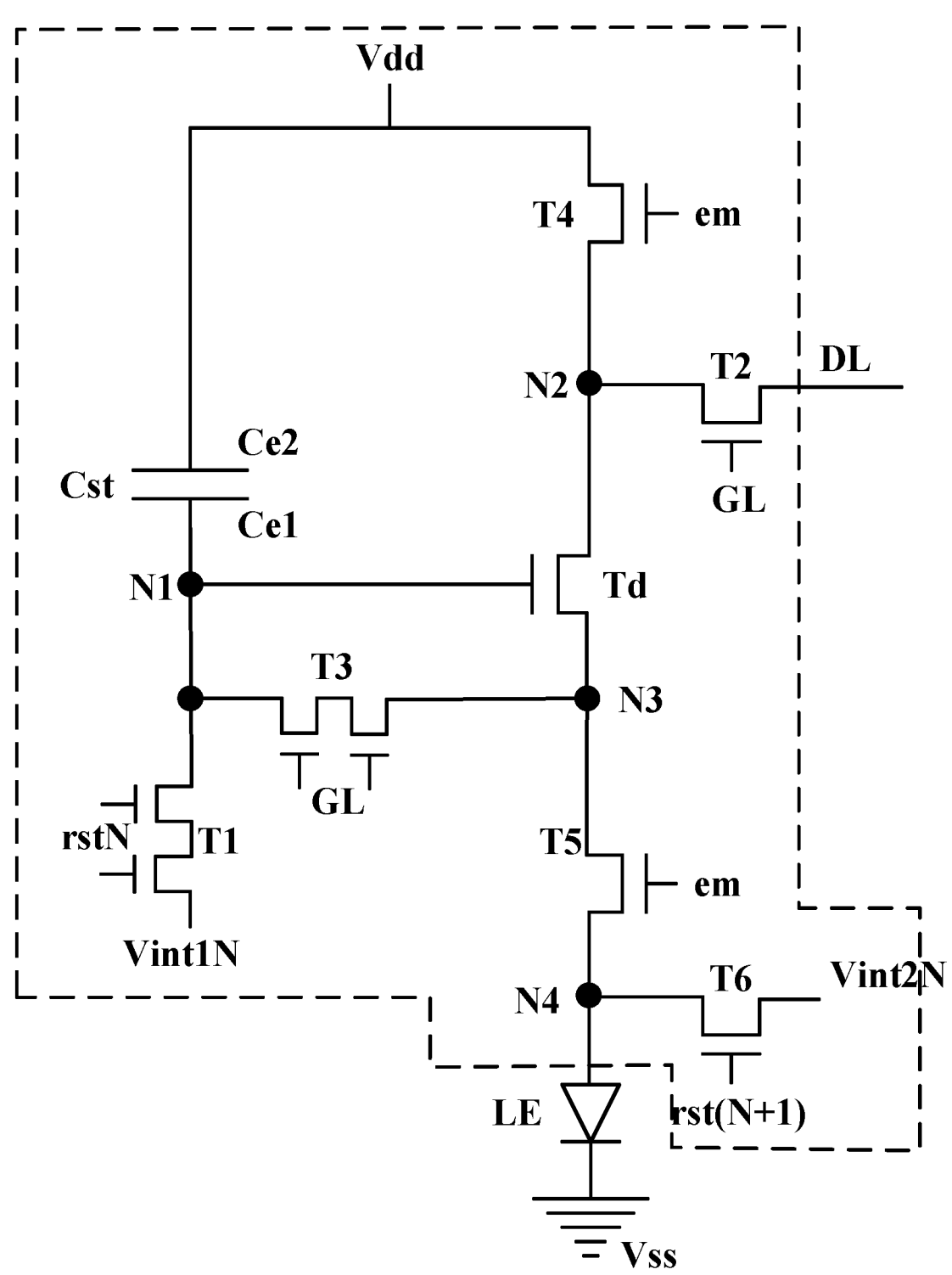
FIG. 2B is a circuit diagram illustrating the structure of a pixel driving circuit in some embodiments according to the present disclosure.

FIG. 2B is a circuit diagram illustrating the structure of a pixel driving circuit in some embodiments according to the present disclosure. Referring to FIG. 2B, in some embodiments, the third transistor T3 is a "double gate" transistor, and the first transistor T1 is a "double gate" transistor. Optionally, in a "double gate" first transistor, the active layer of the first transistor crosses over a respective reset control signal lines twice (alternatively, the respective reset control signal line crosses over the active layer of the first transistor T1 twice). Similarly, in a "double gate" third transistor, the active layer of the third transistor T3 crosses over a respective gate line of the plurality of gate lines GL twice (alternatively, the respective gate line crosses over the active layer of the third transistor T3 twice).

The pixel driving circuit further include a first node N1, a second node N2, a third node N3, and a fourth node N4. The first node N1 is connected to the gate electrode of the driving transistor Td, the first capacitor electrode Ce1, and the source electrode of the third transistor T3. The second node N2 is connected to the drain electrode of the fourth transistor T4, the drain electrode of the second transistor T2, and the source electrode of the driving transistor Td. The third node N3 is connected to the drain electrode of the driving transistor Td, the drain electrode of the third transistor T3, and the source electrode of the fifth transistor T5. The fourth node N4 is connected to the drain electrode of the fifth transistor T5, the drain electrode of the sixth transistor T6, and the anode of the light emitting element LE.

As used herein, a source electrode or a drain electrode refers to one of a first terminal and a second terminal of a transistor, the first terminal and the second terminal being connected to an active layer of the transistor. A direction of a current flowing through the transistor may be configured to be from a source electrode to a drain electrode, or from a drain electrode to a source electrode. Accordingly, depending on the direction of the current flowing through the transistor, in one example, the source electrode is configured to receive an input signal and the drain electrode is configured to output an output signal; in another example, the drain electrode is configured to receive an input signal and the source electrode is configured to output an output signal.

Figure 2C:
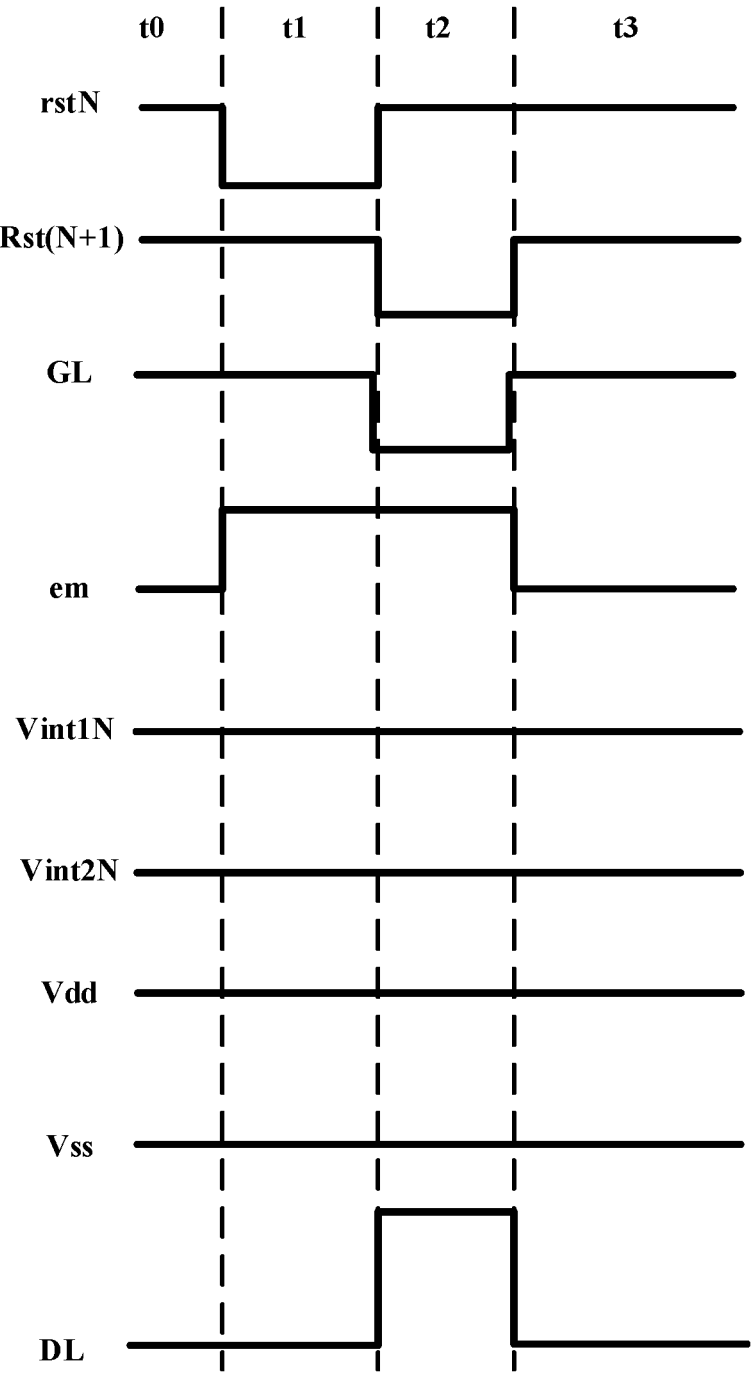
FIG. 2C is a timing diagram illustrating the operation of a pixel driving circuit in some embodiments according to the present disclosure.

FIG. 2C is a timing diagram illustrating the operation of a pixel driving circuit in some embodiments according to the present disclosure. Referring to FIG. 2A, FIG. 2B, and FIG. 2C, during one frame of image, the operation of the pixel driving circuit includes a reset sub-phase t1, a data write sub-phase t2, and a light emitting sub-phase t3. In the initial sub-phase to, a turning-off reset control signal is provided through the reset control signal line of a present stage rstN to the gate electrode of the first transistor T1 to turn off the first transistor T1. In the initial sub-phase t0, the gate line GL is provided with a turning-off signal, thus the second transistor T2 and the third transistor T3 are turned off.

In the reset sub-phase t1, a turning-on reset control signal is provided through the reset control signal line of a present stage rstN to the gate electrode of the first transistor T1 to turn on the first transistor T1; allowing an initialization voltage signal from the respective first reset signal line of a present stage Vint1N to pass from a first electrode of the first transistor T1 to a second electrode of the first transistor T1, and in turn to the first capacitor electrode Ce1 and the gate electrode of the driving transistor Td. The gate electrode of the driving transistor Td is initialized. The second capacitor electrode Ce2 receives a high voltage signal from the respective voltage supply line of the plurality of voltage supply lines Vdd. The first capacitor electrode Ce1 is charged in the reset sub-phase t1 due to an increasing voltage difference between the first capacitor electrode Ce1 and the second capacitor electrode Ce2. In the reset sub-phase t1, the respective gate line of the plurality of gate lines GL is provided with a turning-off signal, thus the second transistor T2 and the third transistor T3 are turned off. The respective light emitting control signal line of the plurality of light emitting control signal lines em is provided with a high voltage signal to turn off the fourth transistor T4 and the fifth transistor T5.

In the data write sub-phase t2, the turning-off reset control signal is again provided through the reset control signal line of a present stage rstN to the gate electrode of the first transistor T1 to turn off the first transistor T1. The respective gate line of the plurality of gate lines GL is provided with a turning-on signal, thus the second transistor T2 and the third transistor T3 are turned on. A second electrode of the driving transistor Td is connected with the second electrode of the third transistor T3. A gate electrode of the driving transistor Td is electrically connected with the first electrode of the third transistor T3. Because the third transistor T3 is turned on in the data write sub-phase t2, the gate electrode and the second electrode of the driving transistor Td are connected and short circuited, and only the PN junction between the gate electrode and a first electrode of the driving transistor Td is effective, thus rendering the driving transistor Td in a diode connecting mode. The second transistor T2 is turned on in the data write sub-phase t2. The data voltage signal transmitted through the respective data line of a plurality of data lines DL is received by a first electrode of the second transistor T2, and in turn transmitted to the first electrode of the driving transistor Td, which is connected to the second electrode of the second transistor T2. A node N2 connecting to the first electrode of the driving transistor Td has a voltage level of the data voltage signal. Because only the PN junction between the gate electrode and a first electrode of the driving transistor Td is effective, the voltage level at the node N1 in the data write sub-phase t2 increase gradually to (Vdata+Vth), wherein the Vdata is the voltage level of the data voltage signal, and the Vth is the voltage level of the threshold voltage Th of the PN junction. The storage capacitor Cst is discharged because the voltage difference between the first capacitor electrode Ce1 and the second capacitor electrode Ce2 is reduced to a relatively small value. The respective light emitting control signal line of the plurality of light emitting control signal lines em is provided with a high voltage signal to turn off the fourth transistor T4 and the fifth transistor T5.

In the data write sub-phase t2, a turning-on reset control signal is provided through the respective reset control signal line rst(N+1) in a next adjacent stage to the gate electrode of the sixth transistor T6 to turn on the sixth transistor T6; allowing an initialization voltage signal from the respective second reset signal line of a present stage Vint2N to pass from a first electrode of the sixth transistor T6 to a second electrode of the sixth transistor T6; and in turn to the node N4. The anode of the light emitting element LE is initialized.

In the light emitting sub-phase t3, the turning-off reset control signal is again provided through the reset control signal line of a present stage rstN to the gate electrode of the first transistor T1 to turn off the first transistor T1. The respective gate line of the plurality of gate lines GL is provided with a turning-off signal, the second transistor T2 and the third transistor T3 are turned off. The respective light emitting control signal line of the plurality of light emitting control signal lines em is provided with a low voltage signal to turn on the fourth transistor T4 and the fifth transistor T5. The voltage level at the node N1 in the light emitting sub-phase t3 is maintained at (Vdata+Vth), the driving transistor Td is turned on by the voltage level, and working in the saturation area. A path is formed through the fourth transistor T4, the driving transistor Td, the fifth transistor T5, to the light emitting element LE. The driving transistor Td generates a driving current for driving the light emitting element LE to emit light. A voltage level at a node N3 connected to the second electrode of the driving transistor Td equals to a light emitting voltage of the light emitting element LE.

Figure 3A:
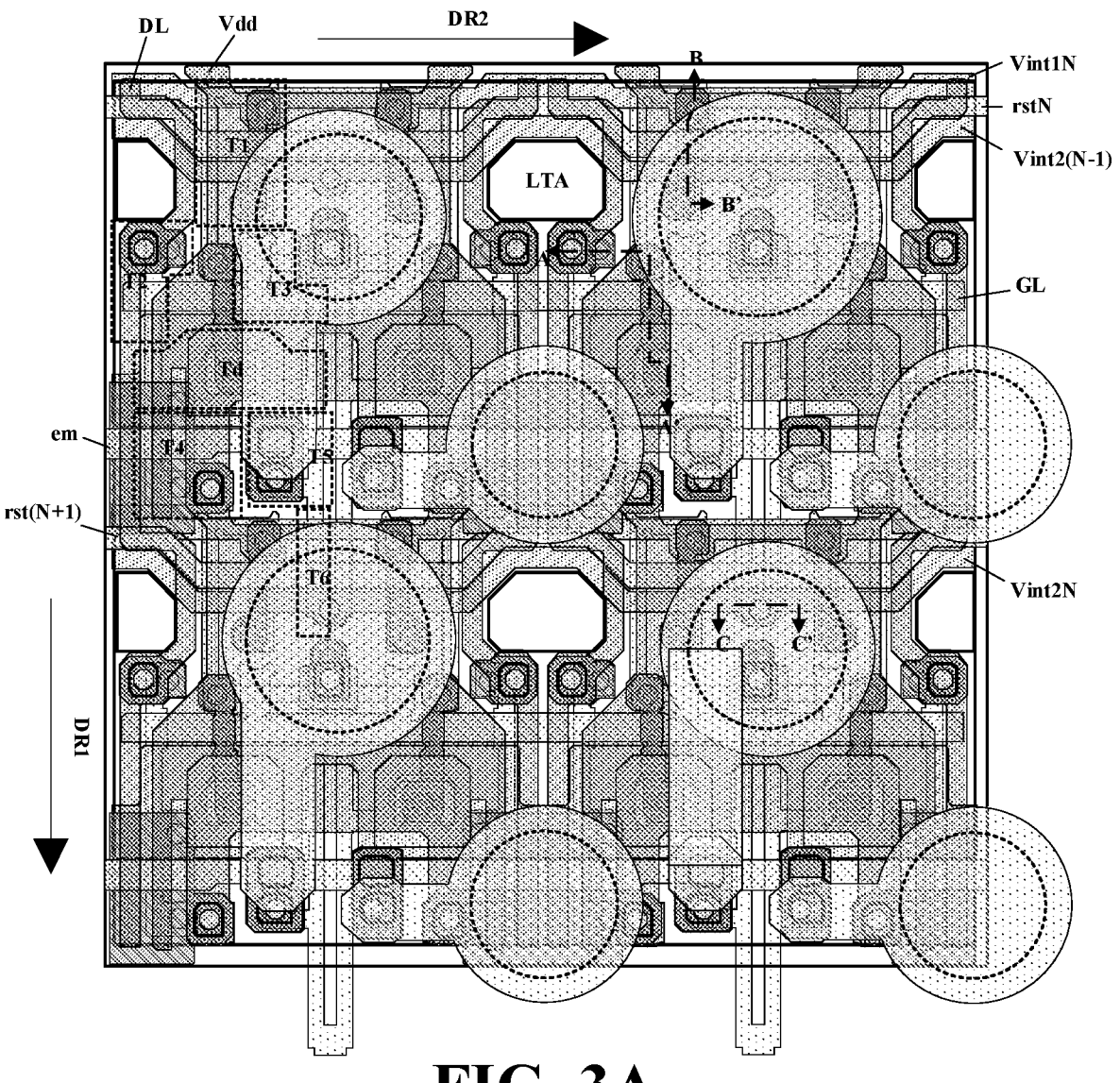
FIG. 3A is a diagram illustrating the structure of an array substrate in some embodiments according to the present disclosure.
Figure 3B:
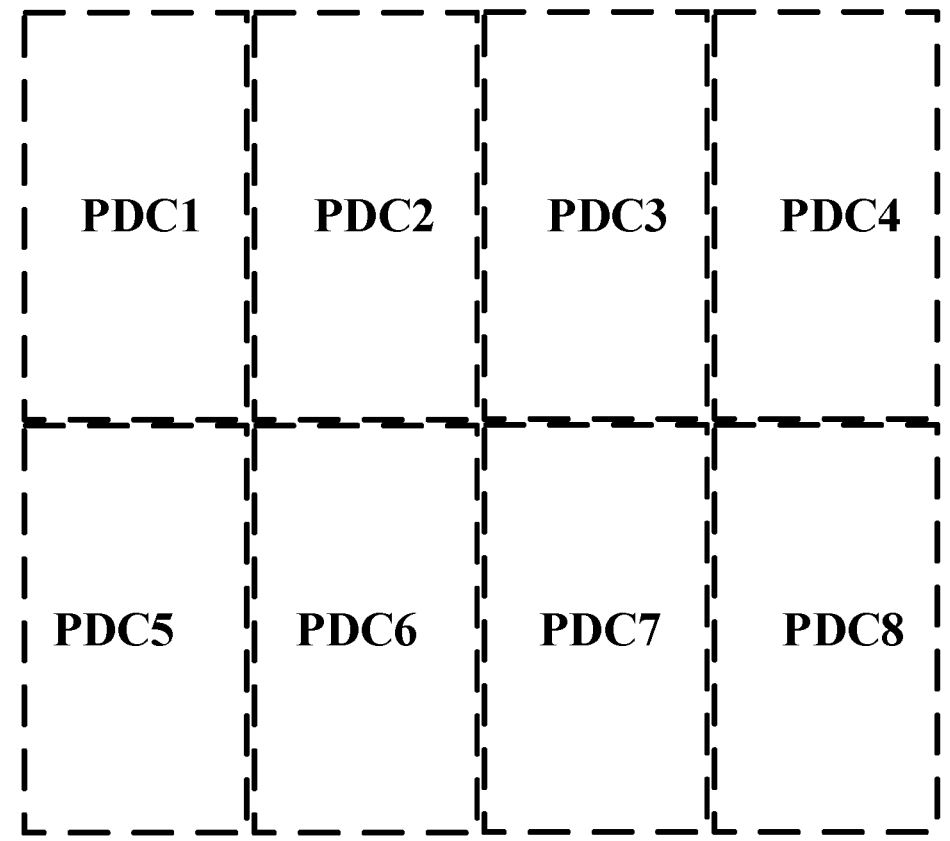
FIG. 3B is a schematic diagram illustrating an arrangement of a plurality of pixel driving circuits in an array substrate depicted in FIG. 3A.

FIG. 3A is a diagram illustrating the structure of an array substrate in some embodiments according to the present disclosure. FIG. 3B is a schematic diagram illustrating an arrangement of a plurality of pixel driving circuits in an array substrate depicted in FIG. 3A. FIG. 3A and FIG. 3B depicts a portion of the array substrate having eight pixel driving circuits, including PDC1, PDC2, PDC3, PDC4, PDC5, PDC6, PDC7, and PDC8.

FIG. 3A illustrates the structures of several layers of the array substrate, including a semiconductor material layer, a first conductive layer, a second conductive layer, and a first signal line layer. Corresponding positions of the plurality of transistors in a pixel driving circuit are depicted in FIG. 3A. The pixel driving circuit includes the first transistor T1, the second transistor T2, the third transistor T3, the fourth transistor T4, the fifth transistor T5, the sixth transistor T6, and the driving transistor Td. Referring to FIG. 3A, the array substrate in some embodiments includes a plurality of subpixels (e.g., a red subpixel, a green subpixel, and a blue subpixel). The array substrate in some embodiments includes a plurality of gate lines GL respectively extending along a second direction DR2, a plurality of reset control signal lines (including a reset control signal line of a present stage rstN) respectively extending along the second direction DR2; a plurality of first reset signal lines (including a respective first reset signal line of a present stage Vint1N) respectively extending along the second direction DR2, a plurality of second reset signal lines (including a respective second reset signal line of a present stage Vinit2N) respectively extending along the second direction DR2; a plurality of light emitting control signal lines em respectively extending along the second direction DR2; a plurality of voltage supply lines Vdd respectively extending along the first direction DR1; and a plurality of data lines DL respectively extending along the first direction DR1. Optionally, the plurality of gate lines GL, the plurality of light emitting control signal lines em, and the plurality of reset control signal lines are in a first conductive layer. Optionally, the plurality of first reset signal lines and the plurality of second reset signal lines are in the second conductive layer. Optionally, the plurality of voltage supply lines Vdd and the plurality of data lines DL are in a second signal line layer.

Figure 3C:
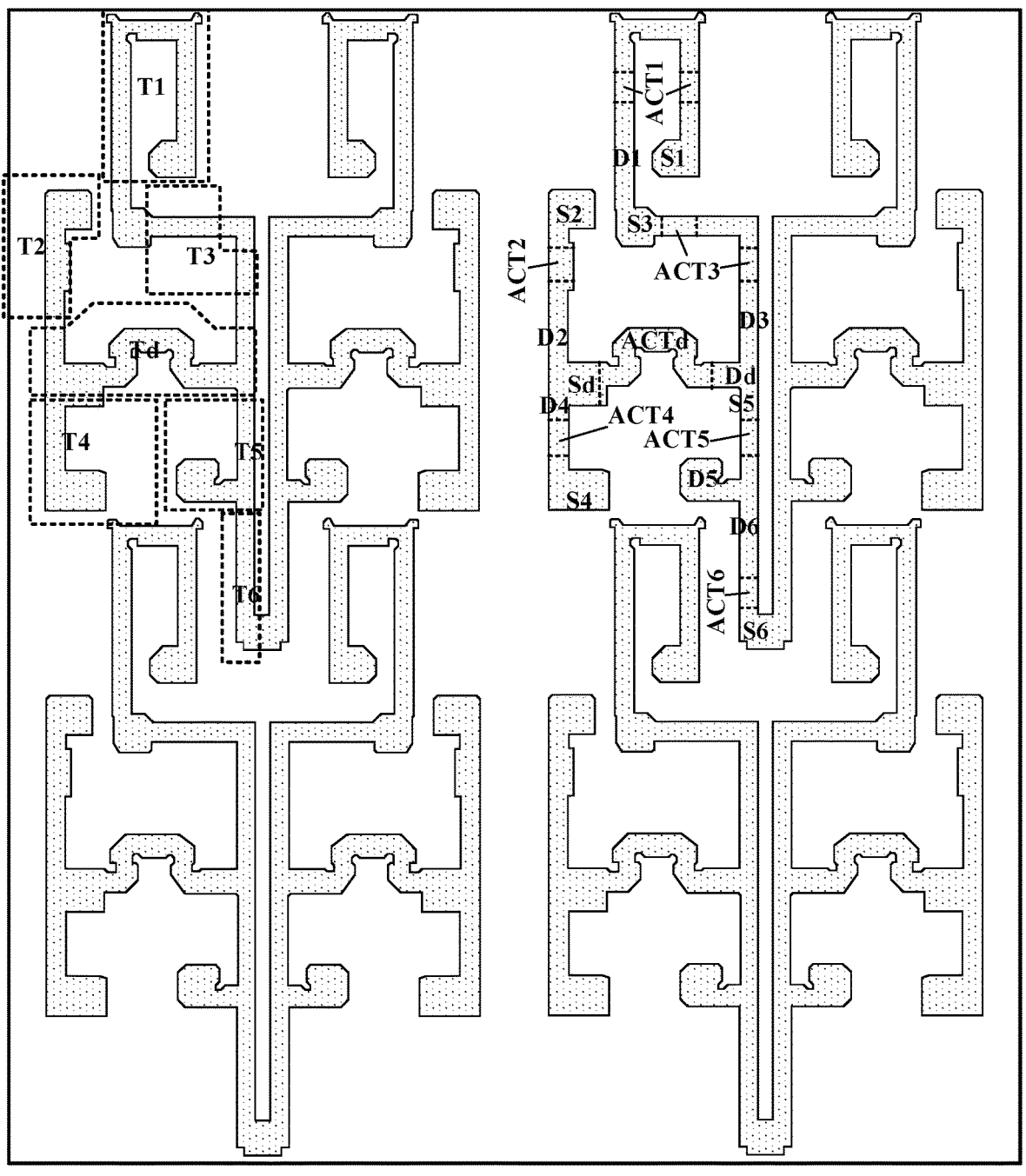
FIG. 3C is a diagram illustrating the structure of a semiconductor material layer in an array substrate depicted in FIG. 3A.
Figure 3D:
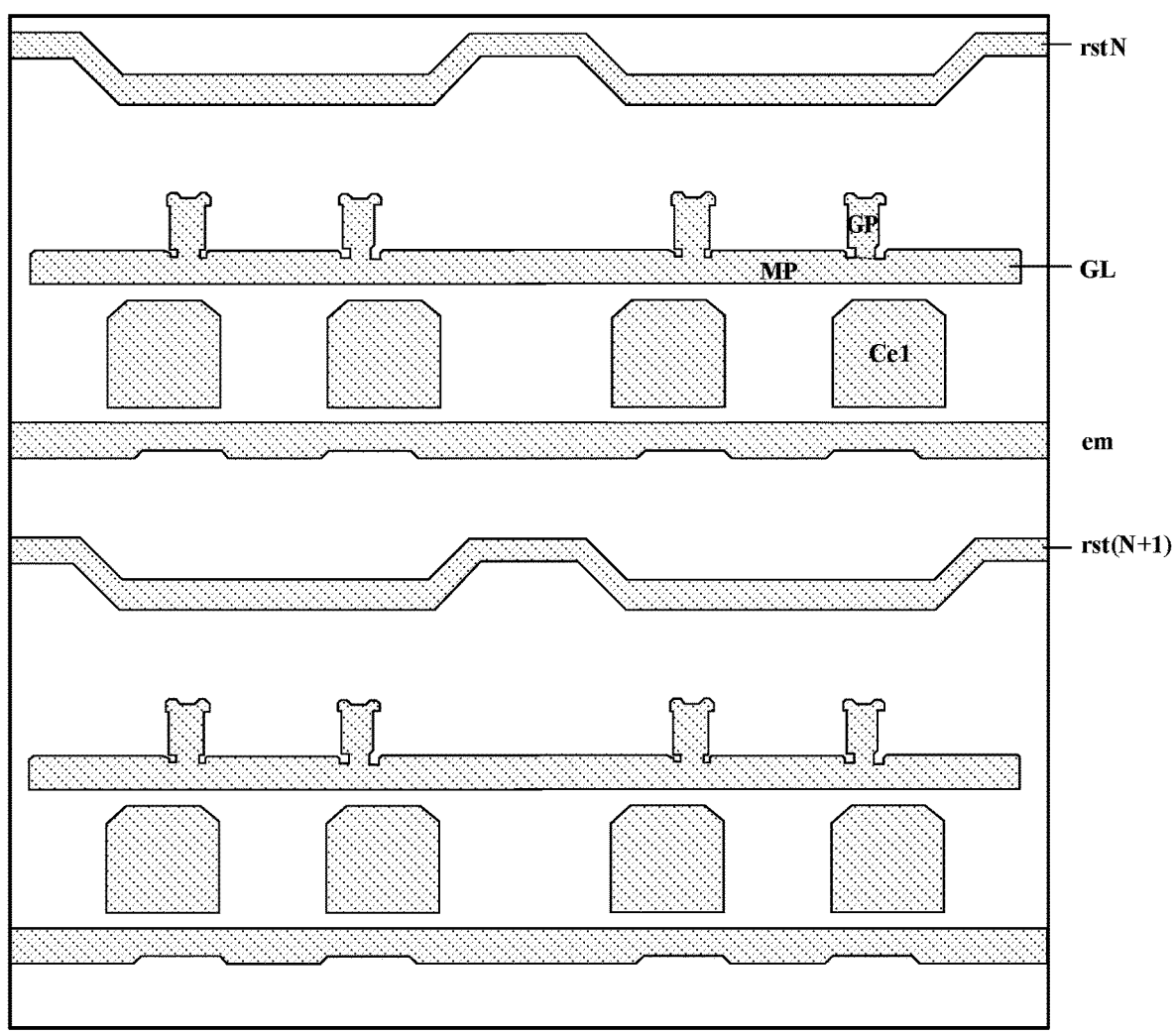
FIG. 3D is a diagram illustrating the structure of a first conductive layer in an array substrate depicted in FIG. 3A.
Figure 3E:
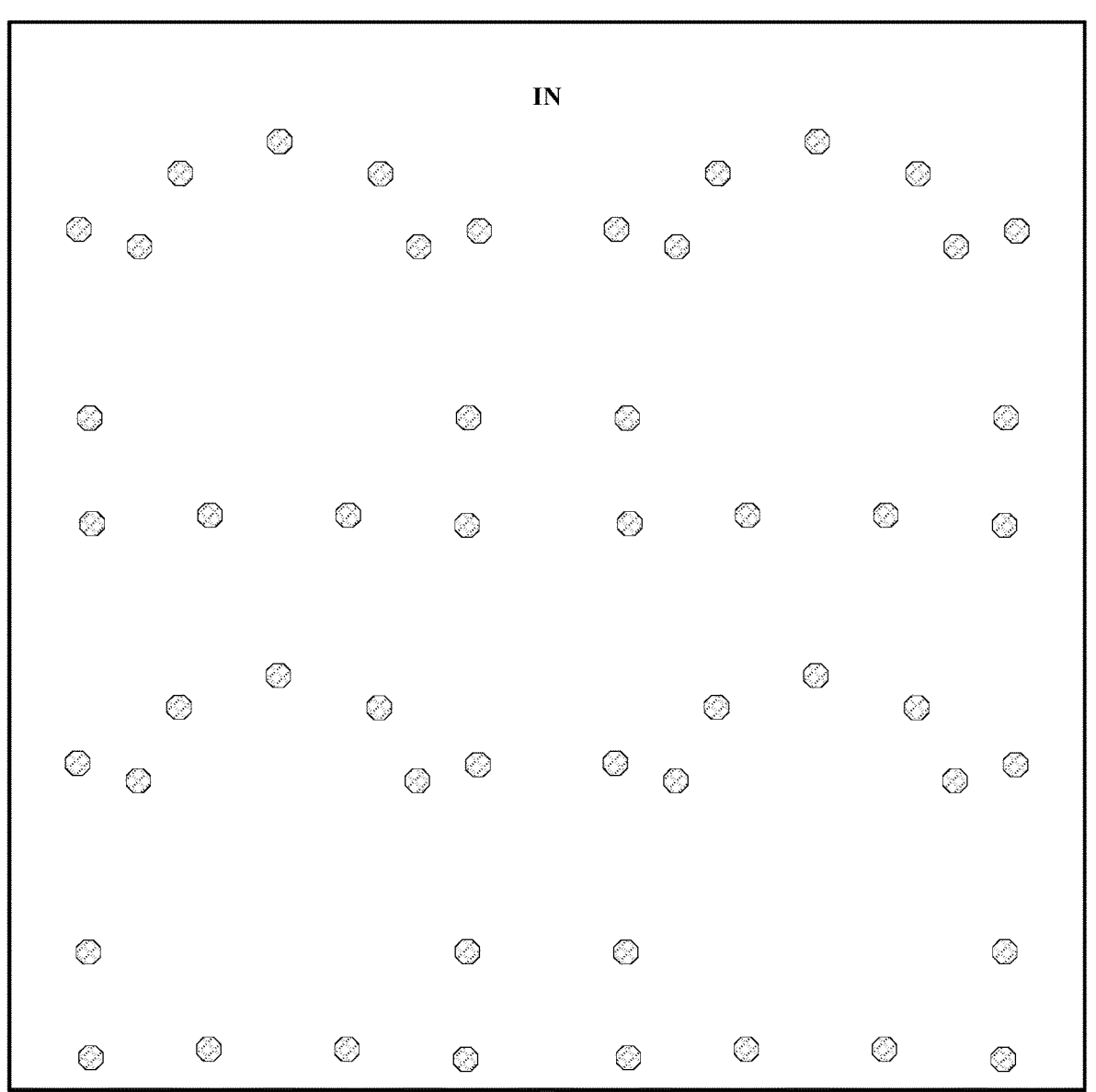
FIG. 3E is a diagram illustrating the structure of an insulating layer in an array substrate depicted in FIG. 3A.
Figure 3F:
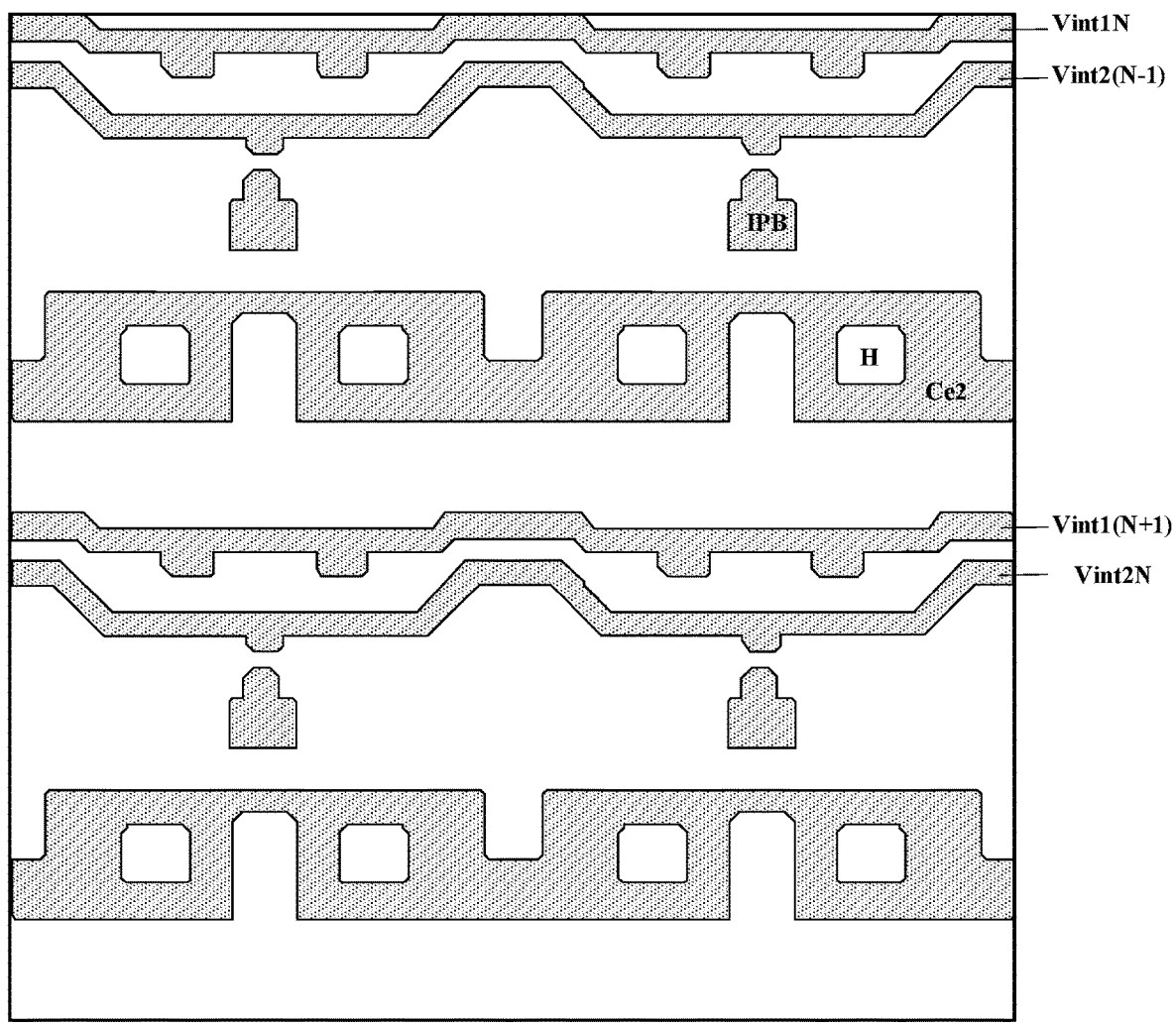
FIG. 3F is a diagram illustrating the structure of a second conductive layer in an array substrate depicted in FIG. 3A.
Figure 3G:
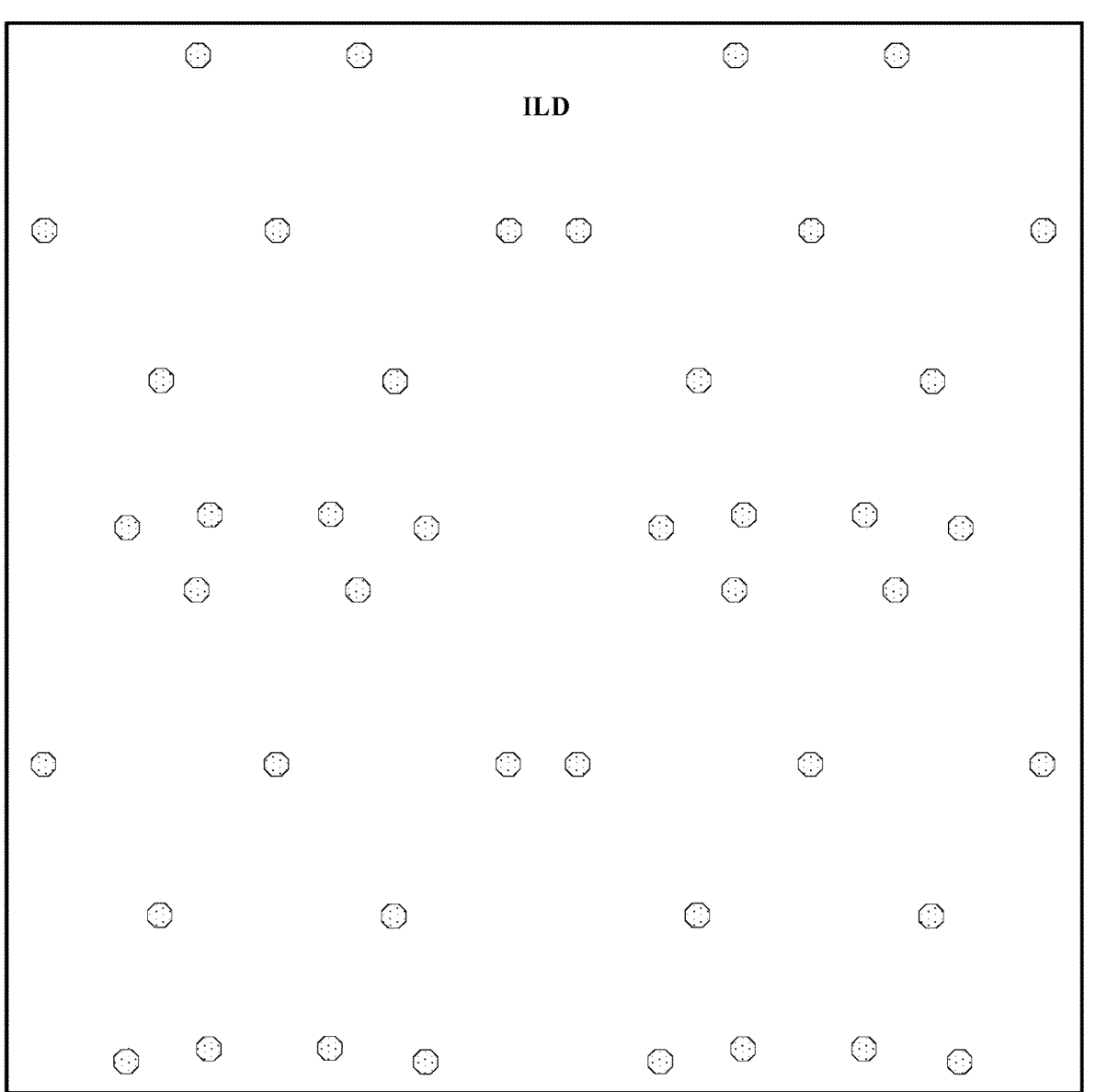
FIG. 3G is a diagram illustrating the structure of an inter-layer dielectric layer in an array substrate depicted in FIG. 3A.
Figure 3H:
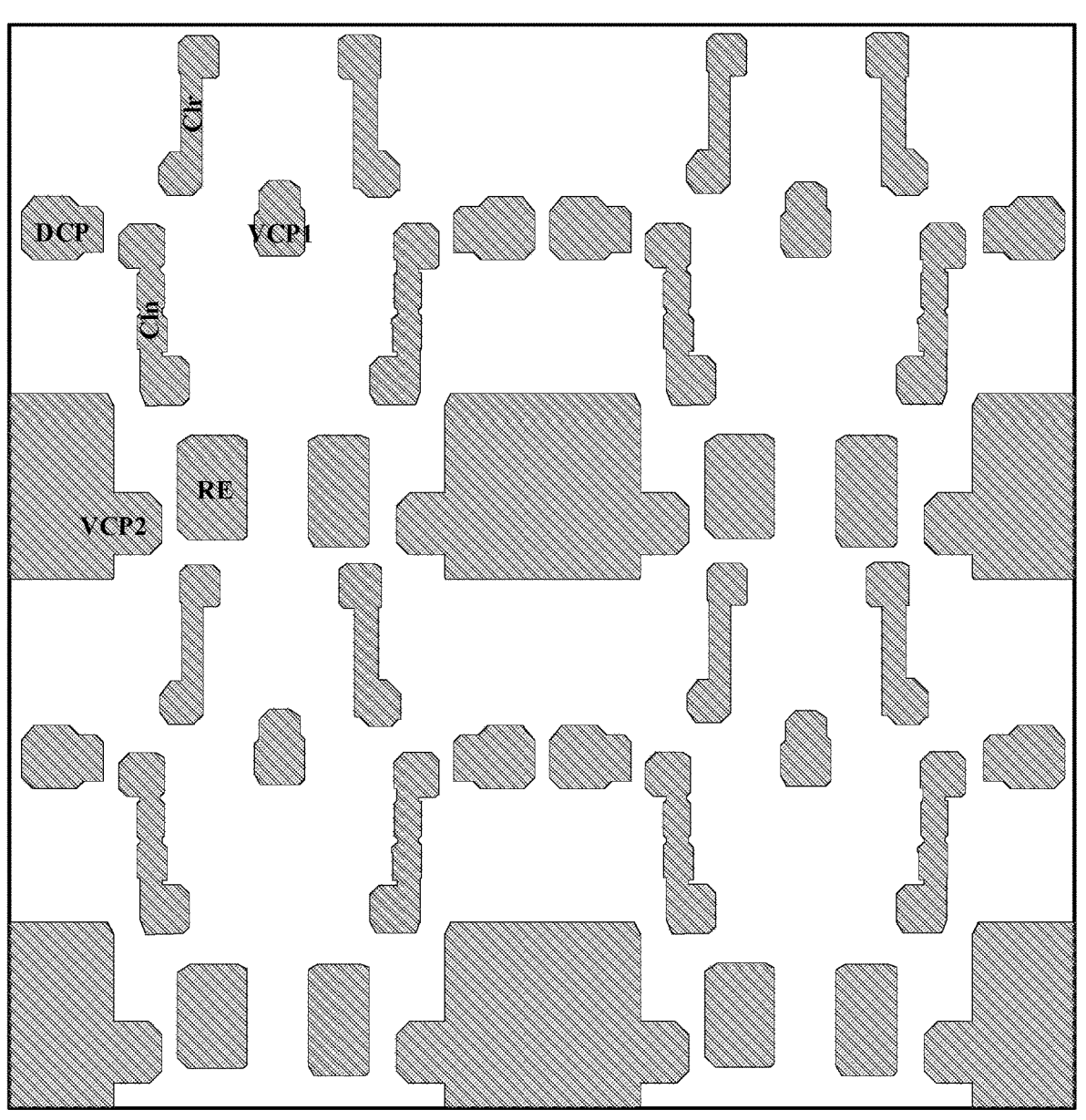
FIG. 3H is a diagram illustrating the structure of a first signal line layer in an array substrate depicted in FIG. 3A.
Figure 3I:
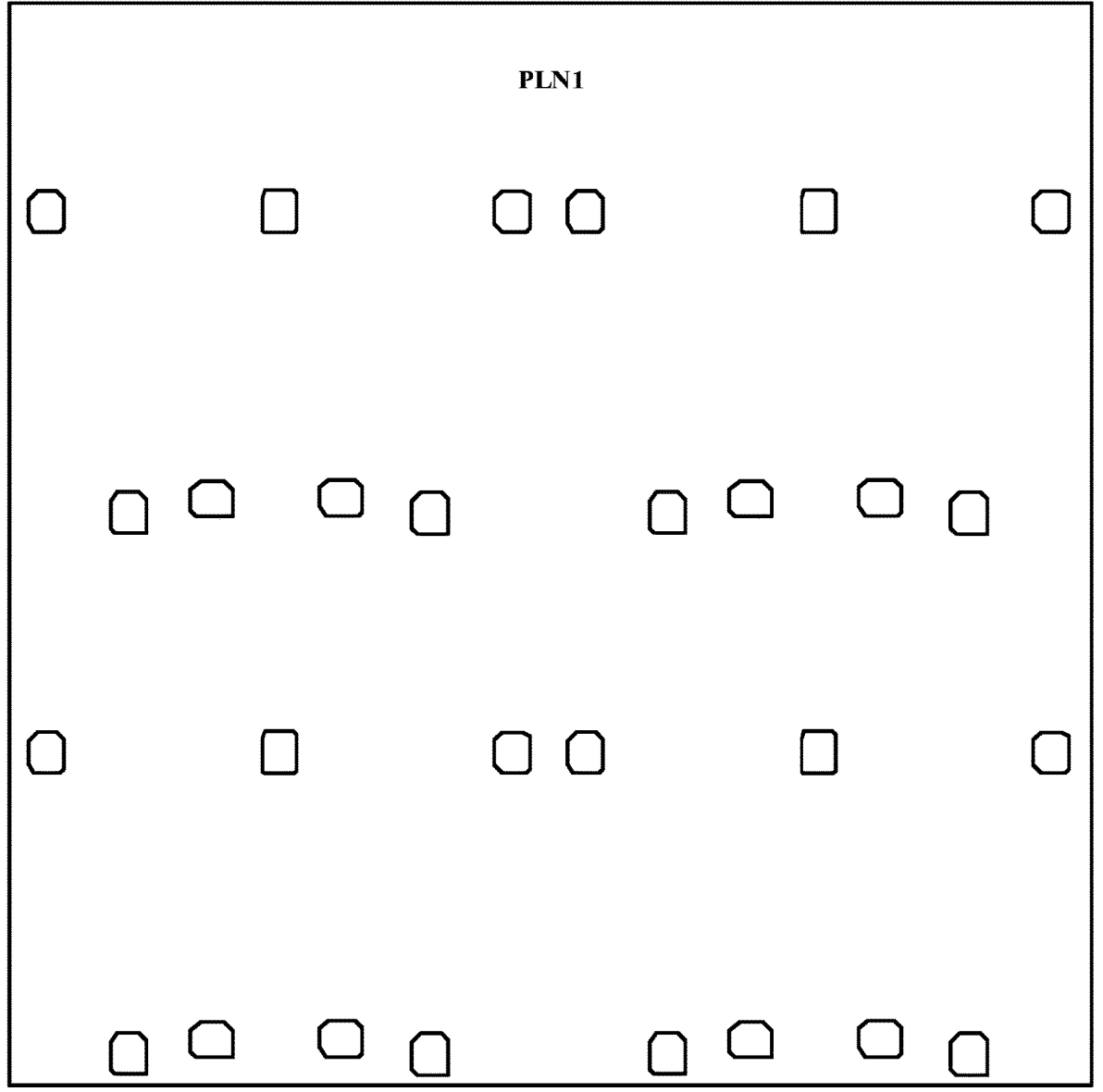
FIG. 3I is a diagram illustrating the structure of a first planarization layer in an array substrate depicted in FIG. 3A.
Figure 3J:
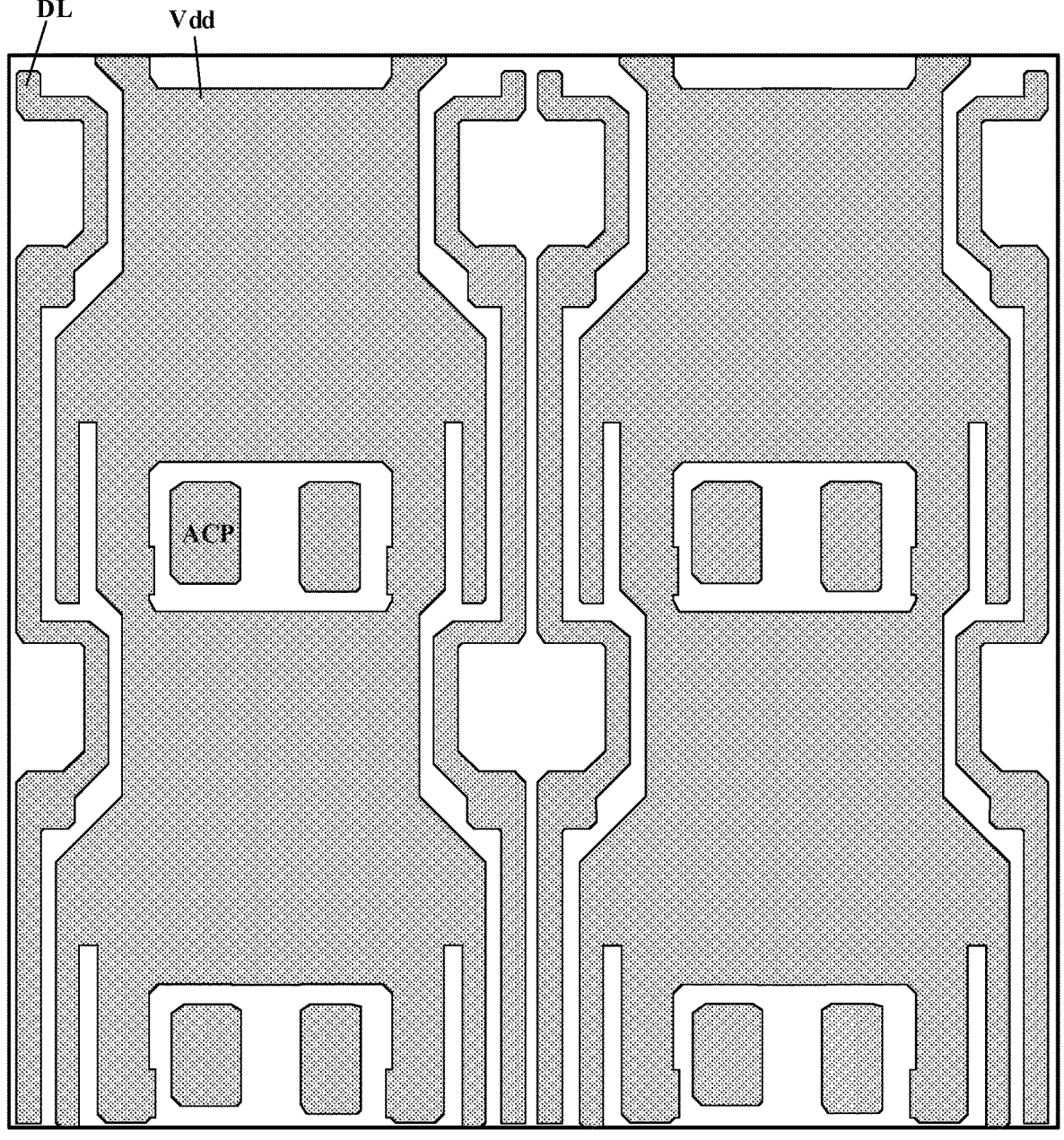
FIG. 3J is a diagram illustrating the structure of a second signal line layer in an array substrate depicted in FIG. 3A.
Figure 3K:
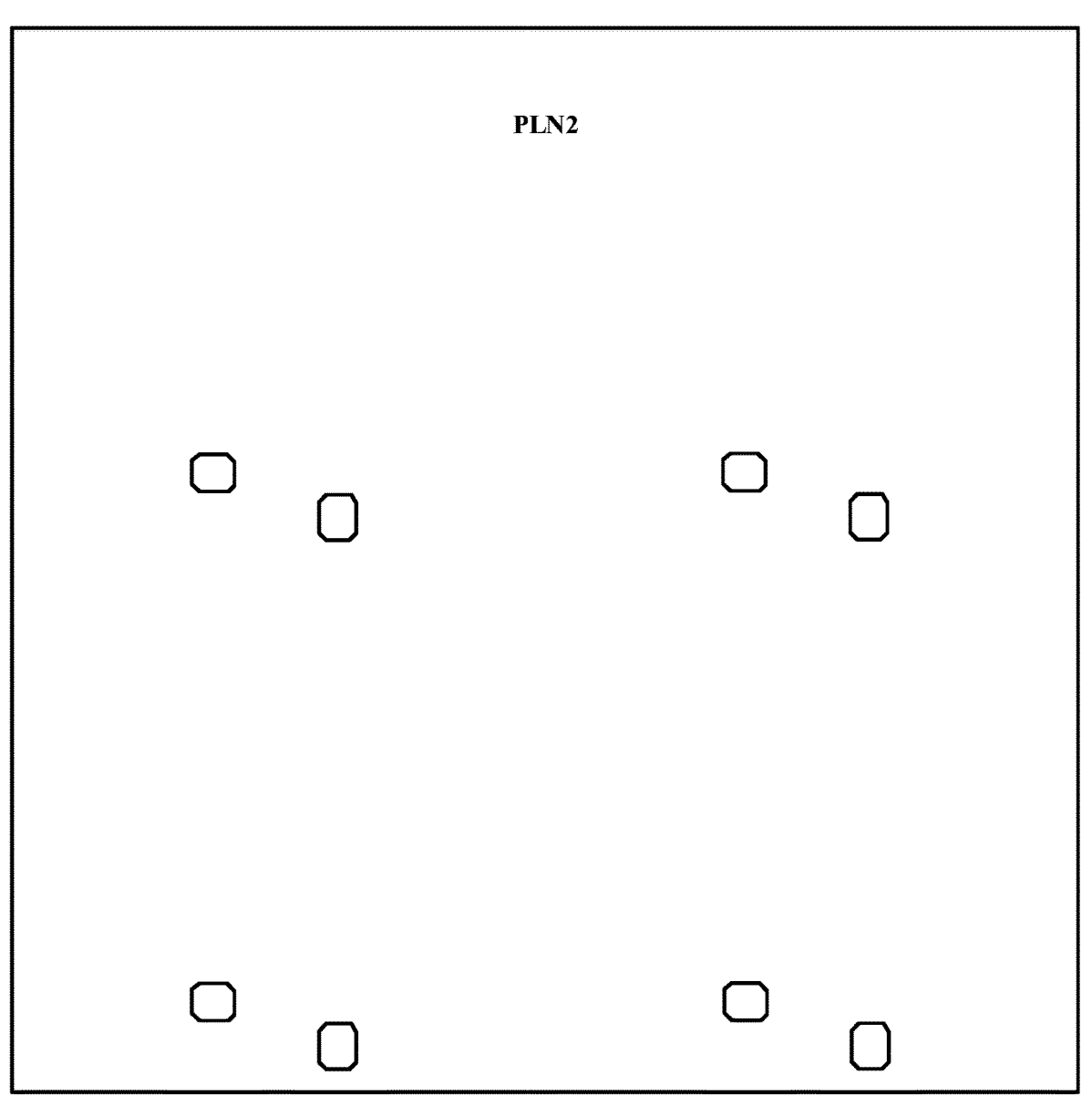
FIG. 3K is a diagram illustrating the structure of a second planarization layer in an array substrate depicted in FIG. 3A.
Figure 3L:
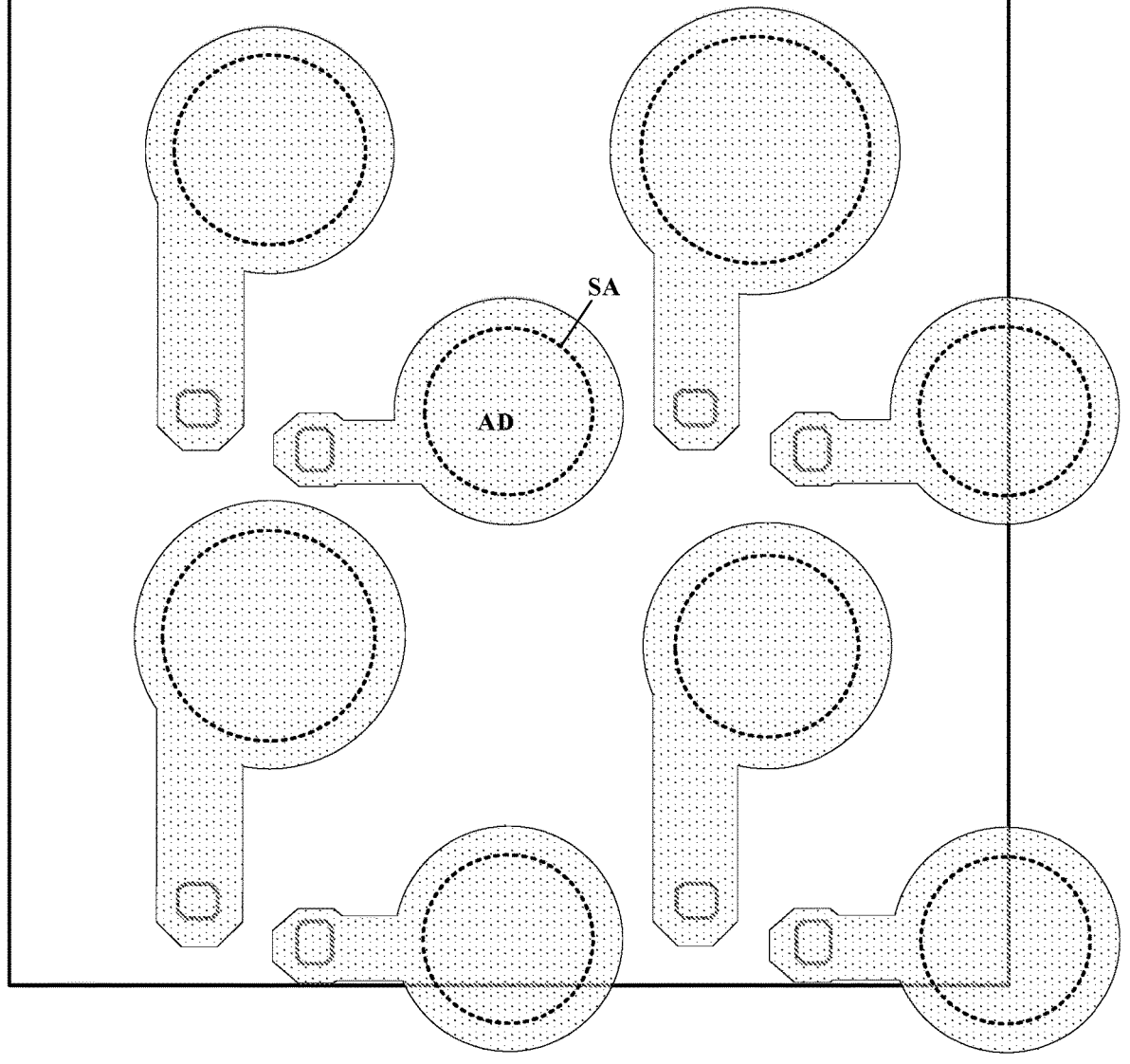
FIG. 3L is a diagram illustrating the structure of an anode layer in an array substrate depicted in FIG. 3A.
Figure 3M:
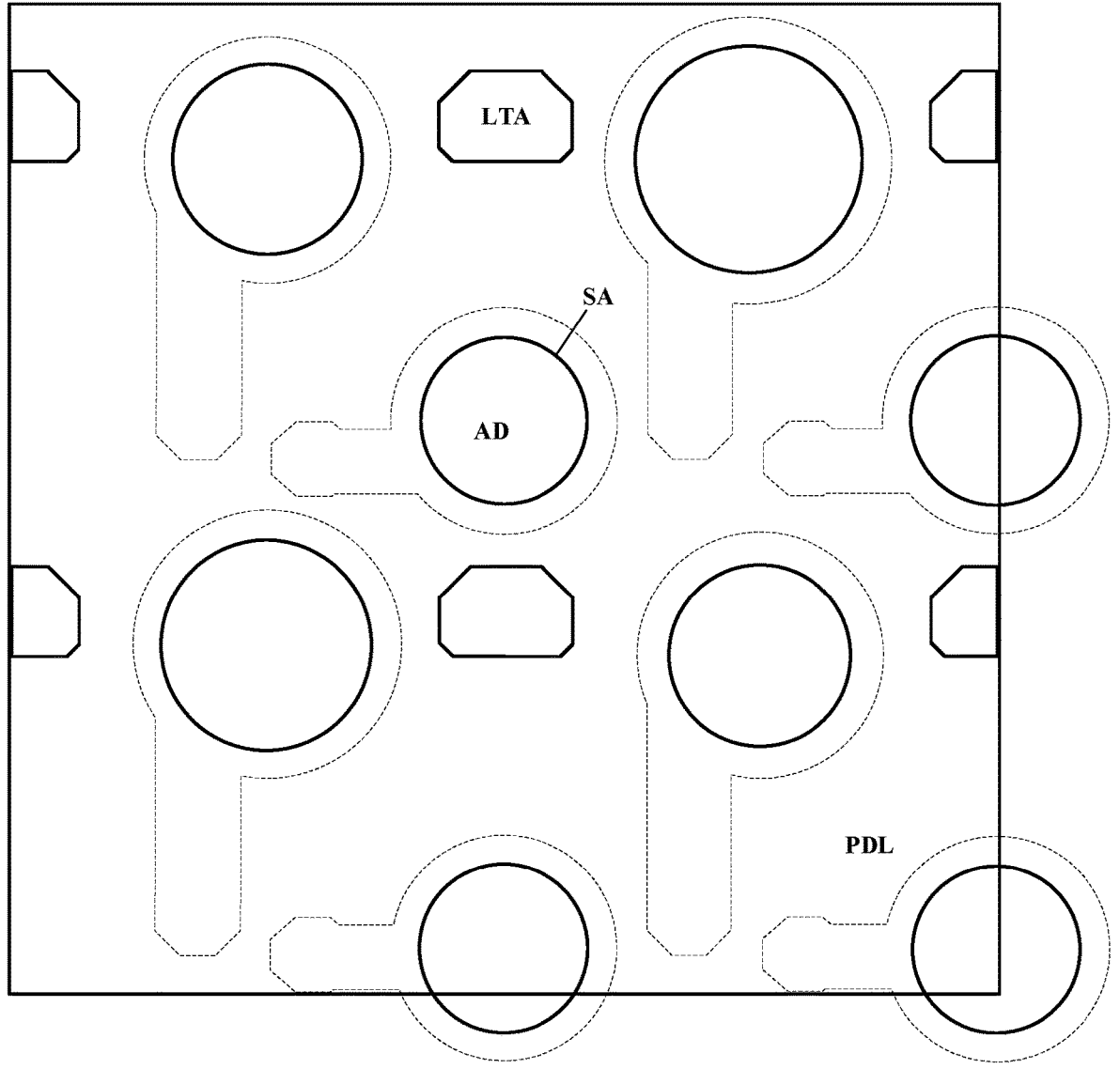
FIG. 3M is a diagram illustrating the structure of a pixel definition layer in an array substrate depicted in FIG. 3A.
Figure 4A:
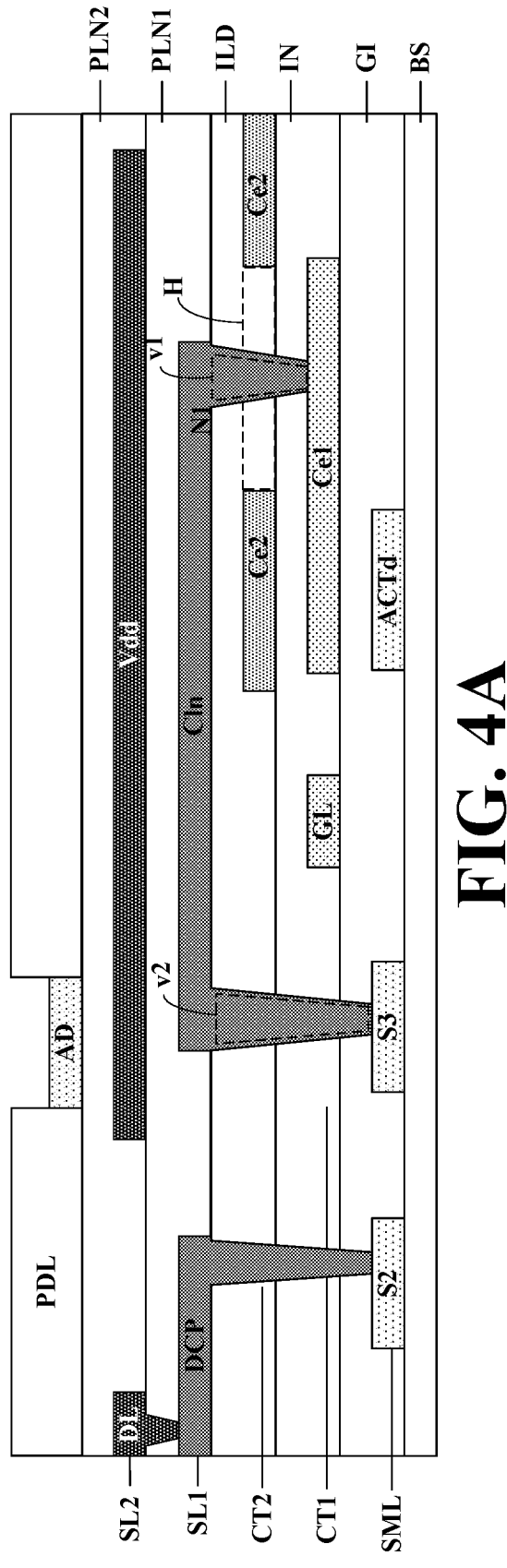
FIG. 4A is a cross-sectional view along an A-A' line in FIG. 3A.
Figure 4B:
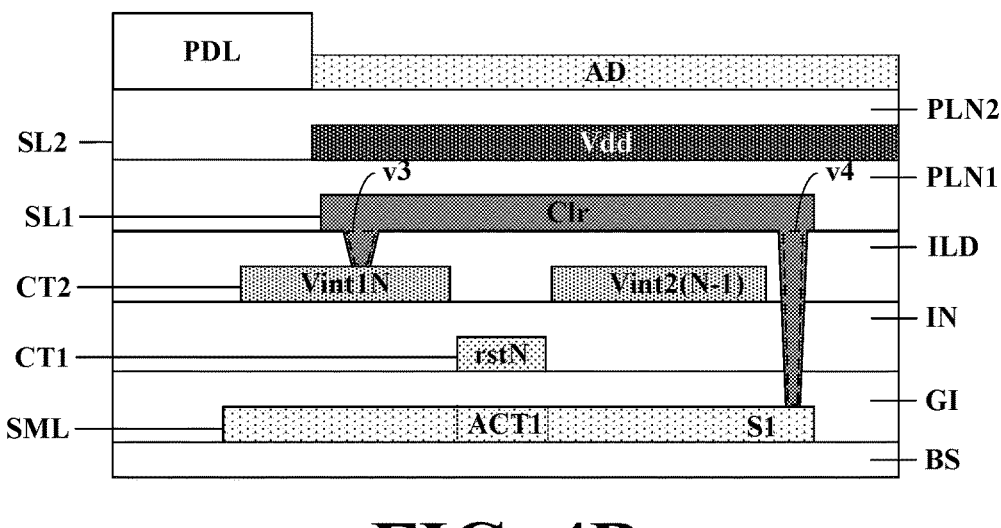
FIG. 4B is a cross-sectional view along a B-B' line in FIG. 3A.
Figure 4C:
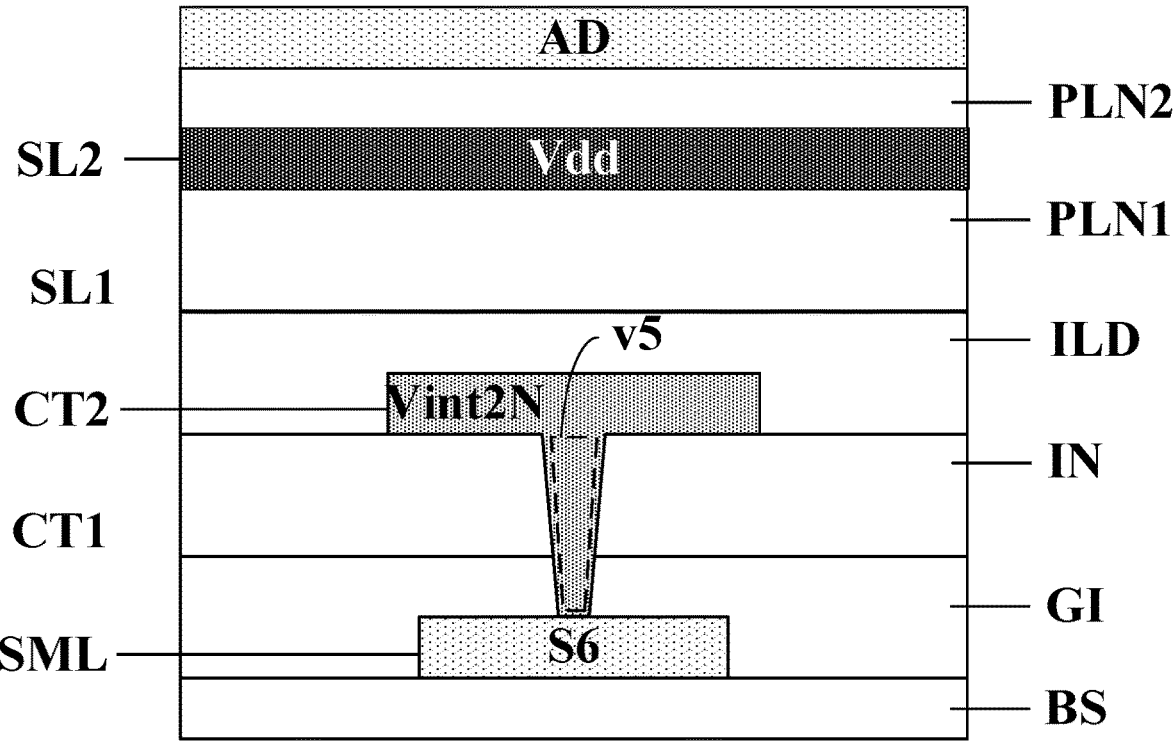
FIG. 4C is a cross-sectional view along a C-C' line in FIG. 3A.

FIG. 3C is a diagram illustrating the structure of a semiconductor material layer in an array substrate depicted in FIG. 3A. FIG. 3D is a diagram illustrating the structure of a first conductive layer in an array substrate depicted in FIG. 3A. FIG. 3E is a diagram illustrating the structure of an insulating layer in an array substrate depicted in FIG. 3A. FIG. 3F is a diagram illustrating the structure of a second conductive layer in an array substrate depicted in FIG. 3A. FIG. 3G is a diagram illustrating the structure of an inter-layer dielectric layer in an array substrate depicted in FIG. 3A. FIG. 3H is a diagram illustrating the structure of a first signal line layer in an array substrate depicted in FIG. 3A. FIG. 3I is a diagram illustrating the structure of a first planarization layer in an array substrate depicted in FIG. 3A. FIG. 3J is a diagram illustrating the structure of a second signal line layer in an array substrate depicted in FIG. 3A. FIG. 3K is a diagram illustrating the structure of a second planarization layer in an array substrate depicted in FIG. 3A. FIG. 3L is a diagram illustrating the structure of an anode layer in an array substrate depicted in FIG. 3A. FIG. 3M is a diagram illustrating the structure of a pixel definition layer in an array substrate depicted in FIG. 3A. FIG. 4A is a cross-sectional view along an A-A' line in FIG. 3A. FIG. 4B is a cross-sectional view along a B-B' line in FIG. 3A. FIG. 4C is a cross-sectional view along a C-C' line in FIG. 3A.

Referring to FIG. 3A to FIG. 3M, and FIG. 4A to FIG. 4C, in some embodiments, the display panel includes a base substrate BS, a semiconductor material layer SML on the base substrate BS, a gate insulating layer GI on a side of the semiconductor material layer SML away from the base substrate BS, a first conductive layer CT1 on a side of the gate insulating layer GI away from the semiconductor material layer SML, an insulating layer IN on a side of the first conductive layer away from the gate insulating layer GI, a second conductive layer CT2 on a side of the insulating layer IN away from the first conductive layer CT1, an inter-layer dielectric layer ILD on a side of the second conductive layer CT2 away from the insulating layer IN, a first signal line layer SL1 on a side of the inter-layer dielectric layer ILD away from the second conductive layer CT2, a planarization layer PLN1 on a side of the first signal line layer SL1 away from the inter-layer dielectric layer ILD, and a second signal line layer SL2 on a side of the planarization layer PLN1 away from the first signal line layer SL1.

Referring to FIG. 2A, FIG. 2B, FIG. 3A, and FIG. 3C, a respective pixel driving circuit is annotated with labels indicating regions corresponding to the plurality of transistors in the respective pixel driving circuit, including the first transistor T1, the second transistor T2, the third transistor T3, the fourth transistor T4, the fifth transistor T5, the sixth transistor T6, and the driving transistor Td. The respective pixel driving circuit is further annotated with labels indicating components of each of the plurality of transistors in the pixel driving circuit. For example, the first transistor T1 includes an active layer ACT1, a source electrode S1, and a drain electrode D1. The second transistor T2 includes an active layer ACT2, a source electrode S2, and a drain electrode D2. The third transistor T3 includes an active layer ACT3, a source electrode S3, and a drain electrode D3. The fourth transistor T4 includes an active layer ACT4, a source electrode S4, and a drain electrode D4. The fifth transistor T5 includes an active layer ACT5, a source electrode S5, and a drain electrode D5. The sixth transistor T6 includes an active layer ACT6, a source electrode S6, and a drain electrode D6. The driving transistor Td includes an active layer ACTd, a source electrode Sd, and a drain electrode Dd. In one example, the active layers (ACT1, ACT2, ACT3, ACT4, ACT5, ACT6, and ACTd) of the transistors (T1, T2, T3, T4, T5, T6, and Td) in the respective pixel driving circuit are parts of a unitary structure. In another example, the active layers (ACT1, ACT2, ACT3, ACT4, ACT5, ACT6, and ACTd), the source electrodes (S1, S2, S3, S4, S5, S6, and Sd), and the drain electrodes (D1, D2, D3, D4, D5, D6, and Dd) of the transistors (T1, T2, T3, T4, T5, T6, and Td) in the respective pixel driving circuit are parts of a unitary structure. In another example, the active layers (ACT1, ACT2, ACT3, ACT4, ACT5, ACT6, and ACTd) of the transistors (T1, T2, T3, T4, T5, T6, and Td) are in a same layer. In another example, the active layers (ACT1, ACT2, ACT3, ACT4, ACT5, ACT6, and ACTd), the source electrodes (S1, S2, S3, S4, S5, S6, and Sd), and the drain electrodes (D1, D2, D3, D4, D5, D6, and Dd) of the transistors (T1, T2, T3, T4, T5, T6, and Td) are in a same layer.

As used herein, the active layer refers to a component of the transistor comprising at least a portion of the semiconductor material layer whose orthographic projection on the base substrate overlaps with an orthographic projection of a gate electrode on the base substrate. As used herein, a source electrode refers to a component of the transistor connected to one side of the active layer, and a drain electrode refers to a component of the transistor connected to another side of the active layer. In the context of a double-gate type transistor (for example, the third transistor T3), the active layer refers to a component of the transistor comprising a first portion of the semiconductor material layer whose orthographic projection on the base substrate overlaps with an orthographic projection of a first gate on the base substrate, a second portion of the semiconductor material layer whose orthographic projection on the base substrate overlaps with an orthographic projection of a second gate on the base substrate, and a third portion between the first portion and the second portion. In the context of a double-gate type transistor, a source electrode refers to a component of the transistor connected to a side of the first portion distal to the third portion, and a drain electrode refers to a component of the transistor connected to a side of the second portion distal to the third portion.

Referring to FIG. 2A, FIG. 2B, FIG. 3A, and FIG. 3D, the first conductive layer in some embodiments includes a plurality of gate lines GL, a plurality of reset control signal lines (including a respective reset control signal line of a present stage rstN and a reset control signal line of a next stage rst(N+1)), a plurality of light emitting control signal lines em, and a first capacitor electrode Ce1 of the storage capacitor Cst. Various appropriate electrode materials and various appropriate fabricating methods may be used to make the first conductive layer. For example, a conductive material may be deposited on the substrate by a plasma-enhanced chemical vapor deposition (PECVD) process and patterned. Examples of appropriate conductive materials for making the first conductive layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of gate lines GL, the plurality of reset control signal lines, the plurality of light emitting control signal lines em, and the first capacitor electrode Ce1 are in a same layer.

As used herein, the term "same layer" refers to the relationship between the layers simultaneously formed in the same step. In one example, the plurality of gate lines GL and the first capacitor electrode Ce1 are in a same layer when they are formed as a result of one or more steps of a same patterning process performed in a same layer of material. In another example, the plurality of gate lines GL and the first capacitor electrode Ce1 can be formed in a same layer by simultaneously performing the step of forming the plurality of gate lines GL, and the step of forming the first capacitor electrode Ce1. The term "same layer" does not always mean that the thickness of the layer or the height of the layer in a cross-sectional view is the same.

Vias extending through the insulating layer IN are depicted in FIG. 3E.

Referring to FIG. 2A, FIG. 2B, FIG. 3A, and FIG. 3F, the second conductive layer in some embodiments includes a plurality of first reset signal lines (including a respective first reset signal line of a present stage Vint1N and a respective first reset signal line of a next adjacent stage Vinit1(N+1)), a plurality of second reset signal lines (including a respective second reset signal line of a present stage Vint2N and a respective second reset signal line of a previous adjacent stage Vinit2(N−1)), an interference preventing block IPB, and a second capacitor electrode Ce2 of the storage capacitor Cst. Various appropriate conductive materials and various appropriate fabricating methods may be used to make the second conductive layer. For example, a conductive material may be deposited on the substrate by a plasma-enhanced chemical vapor deposition (PECVD) process and patterned. Examples of appropriate conductive materials for making the second conductive layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of first reset signal lines, the plurality of second reset signal lines, an interference preventing block IPB, and the second capacitor electrode Ce2 are in a same layer.

Vias extending through the inter-layer dielectric layer ILD are depicted in FIG. 3G.

Referring to FIG. 2A, FIG. 2B, FIG. 3A, and FIG. 3H, the first signal line layer in some embodiments includes a node connecting line Cln, a reset signal connecting line Clr, a first voltage signal connecting pad VCP1, a data signal connecting pad DCP, a second voltage signal connecting pad VCP2, and a relay electrode RE. The node connecting line Cln connects the first capacitor electrode Ce1 and the source electrode of the third transistor T3 in a respective pixel driving circuit together. The data signal connecting pad DCP connects a respective data line and the source electrode of the second transistor T2 in a respective pixel driving circuit together. The second voltage signal connecting pad VCP2 connects a respective voltage supply line and the second capacitor electrode Ce2 of the storage capacitor Cst together, and connect the respective voltage supply line and the source electrode of the fourth transistor T4 together. The relay electrode RE connects the node N4 and an anode connecting pad together. The node N4 is connected to drain electrodes of the fifth transistor T5 and the sixth transistor T6. The anode connecting pad is in the second signal line layer, and is connected to a respective anode in a respective pixel driving circuit. The reset signal connecting line Clr connects a respective first reset signal line (e.g., a respective first reset signal line of a present stage Vint1N) to the source electrode of the first transistor T1. The first voltage signal connecting pad VCP1 connects a respective voltage supply line and the interference preventing block IPB together.

In the example depicted in FIG. 3A to FIG. 3M, transmission of the first reset signal is accomplished by discrete reset signal connecting lines (e.g., the reset signal connecting line Clr) respectively for the plurality of pixel driving circuits. The discrete reset signal connecting lines respectively for the plurality of pixel driving circuits are not directly connected to each other. Each discrete reset signal connecting line is connected to an individual first reset signal line (e.g., Vint1N).

In the example depicted in FIG. 3A to FIG. 3M, transmission of the second reset signal is accomplished by discrete reset signal connecting lines/pads respectively for the plurality of pixel driving circuits. The discrete reset signal connecting lines/pads respectively for the plurality of pixel driving circuits are not directly connected to each other. Each discrete reset signal connecting line/pad is connected to an individual second reset signal line (e.g., Vint2N).

Various appropriate conductive materials and various appropriate fabricating methods may be used to make the first signal line layer. For example, a conductive material may be deposited on the substrate by a plasma-enhanced chemical vapor deposition (PECVD) process and patterned. Examples of appropriate conductive materials for making the first signal line layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the node connecting line Cln, the reset signal connecting line Clr, the first voltage signal connecting pad VCP1, the data signal connecting pad DCP, the second voltage signal connecting pad VCP2, and the relay electrode RE are in a same layer.

Vias extending through at least the first planarization layer PLN1 are depicted in FIG. 3I.

Referring to Referring to FIG. 2A, FIG. 2B, FIG. 3A, and FIG. 3J, the second signal line layer in some embodiments includes a plurality of data line DL, a plurality of voltage supply lines Vdd, and an anode contact pad ACP. The anode contact pad ACP is electrically connected to a source electrode of the fifth transistor T5 in the respective pixel driving circuit through a relay electrode. The anode contact pad ACP is electrically connected to an anode in a respective subpixel. A respective one of the plurality of voltage supply lines Vdd is electrically connected to the second capacitor electrode Ce2 of the storage capacitor Cst through the second voltage signal connecting pad VCP2, and is electrically connected to the source electrode of the fourth transistor T4 through the second voltage signal connecting pad VCP2.

Various appropriate conductive materials and various appropriate fabricating methods may be used to make the second signal line layer. For example, a conductive material may be deposited on the substrate by a plasma-enhanced chemical vapor deposition (PECVD) process and patterned. Examples of appropriate conductive materials for making the second signal line layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of data line DL, the plurality of voltage supply lines Vdd, and the anode contact pad ACP are in a same layer.

Vias extending through the second planarization layer PLN2 are depicted in FIG. 3K.

Referring to FIG. 2A, FIG. 2B, FIG. 3A, and FIG. 3L, the array substrate further includes an anode layer AD. A plurality of subpixel apertures SA respectively corresponding to a plurality of anodes are denoted in FIG. 3L. Vias extending through the second planarization layer PLN2 are depicted in FIG. 3K. A respective anode is connected to a respective anode contact pad through a respective via extending through the second planarization layer PLN2.

Referring to FIG. 2A, FIG. 2B, FIG. 3A, and FIG. 3M, the array substrate further includes a pixel definition layer PDL defining a plurality of subpixel apertures SA. In FIG. 3M, corresponding positions of the plurality of anodes are depicted in dotted lines. Optionally, the array substrate further includes a plurality of light transmissive apertures LTA extending through the pixel definition layer PLN. The presence of the plurality of light transmissive apertures LTA in the array substrate significantly increases aperture ratio of the array substrate. Optionally, the array substrate has an aperture ratio greater than 2.0%, e.g., greater than 2.5%, greater than 3.0%, greater than 3.5%, greater than 4.0%, or greater than 4.5%. In one example, the array substrate has an aperture ratio of 4.7%.

Referring to FIG. 2A, FIG. 2B, FIG. 3A, FIG. 3F, and FIG. 4A, in some embodiments, an orthographic projection of the second capacitor electrode Ce2 on a base substrate BS completely covers, with a margin, an orthographic projection of the first capacitor electrode Ce1 on the base substrate BS except for a hole region H in which a portion of the second capacitor electrode Ce2 is absent. In some embodiments, the first signal line layer includes a node connecting line Cln on a side of the inter-layer dielectric layer ILD away from the second capacitor electrode Ce2. The node connecting line Cln is in a same layer as the reset signal connecting line Clr, the first voltage signal connecting pad VCP1, the data signal connecting pad DCP, the second voltage signal connecting pad VCP2, and the relay electrode RE.

In some embodiments, the first capacitor electrode Ce1 is on a side of the gate insulating layer IN away from the base substrate BS. Optionally, the array substrate further includes a first via v1 and a second via v2. The first via v1 is in the hole region H and extends through the inter-layer dielectric layer ILD and the insulating layer IN. The second via v2 extends through the inter-layer dielectric layer ILD, the insulating layer IN, and the gate insulating layer GI. Optionally, the node connecting line Cln is connected to the first capacitor electrode Ce1 through the first via v1, and the node connecting line Cln is connected the semiconductor material layer SML through the second via v2. Optionally, the node connecting line Cln is connected to the source electrode S3 of third transistor, as depicted in FIG. 4A.

Referring to FIG. 2A, FIG. 2B, FIG. 3A to FIG. 3M, and FIG. 4B, in some embodiments, the array substrate further includes a third via v3 and a fourth via v4. The third via v3 extends through the inter-layer dielectric layer ILD. The fourth via v4 extends through the inter-layer dielectric layer ILD, the insulating layer IN, and the gate insulating layer GI. The reset signal connecting line Clr is connected to a respective first reset signal line (e.g., a respective first reset signal line of a present stage Vint1N) through the third via v3, and the reset signal connecting line Clr is connected to the source electrode S1 of the first transistor T1 through the fourth via v4. The reset signal connecting line Clr crosses over a respective second reset signal line of a previous adjacent stage Vinit2(N−1)). Optionally, the reset signal connecting line Clr crosses over a respective reset control signal line rstN in a present stage. Optionally, an orthographic projection of the reset signal connecting line Clr on the base substrate BS partially overlaps with an orthographic projection of the active layer ACT1 of the first transistor T1 on the base substrate BS.

Referring to FIG. 2A, FIG. 2B, FIG. 3A to FIG. 3M, and FIG. 4C, in some embodiments, the array substrate further includes a fifth via v5. The fifth via v5 extends through the insulating layer IN and the gate insulating layer GI. A respective second reset signal line Vint2N in the present stage of the plurality of second reset signal lines is connected to the source electrode S6 of the sixth transistor T6 through the fifth via v5. In some embodiments, source electrodes of sixth transistors respectively from two adjacent subpixels are connected together. The respective second reset signal line Vint2N in the present stage of the plurality of second reset signal lines is connected to the source electrodes of sixth transistors respectively from two adjacent subpixels through a same via (e.g., the fifth via v5).

Referring to FIG. 3A and FIG. 3D, in a respective pixel driving circuit, a respective gate line of the plurality of gate lines GL in some embodiments includes a main portion MP extending along an extension direction of the respective gate line, and a gate protrusion GP protruding away from the main portion MP, e.g., along a direction from the respective gate line of the plurality of gate lines GL in a present stage toward the respective reset control signal line rstN in the present stage.

In some embodiments, as discussed above, the third transistor T3 is a double gate transistor. In some embodiments, the gate protrusion GP is one of the double gates in the third transistor T3. In some embodiments, an orthographic projection of the gate protrusion GP on the base substrate BS at least partially overlaps with an orthographic projection of the active layer ACT3 of the third transistor T3 on the base substrate BS.

In some embodiments, an orthographic projection of the interference preventing block IPB on the base substrate BS at least partially overlaps with an orthographic projection of a portion of the semiconductor material layer connecting two portions of the active layer ACT3 of the third transistor T3 on the base substrate BS.

Referring to FIG. 3A to FIG. 3M, in some embodiments, corresponding layers of a first pixel driving circuit and corresponding layers of a second pixel driving circuit directly adjacent to each other and in the present stage (or the present row) have a substantially mirror symmetry with respect to each other, e.g., about a plane perpendicular to a main surface of the array substrate and substantially parallel to extension directions of the plurality of data lines DL in FIG. 3A. As used herein, the term "corresponding layers of a first pixel driving circuit and corresponding layers of a second pixel driving circuit" is not intended to include layers that are not parts of the pixel driving circuits. For example, the "corresponding layers of a first pixel driving circuit and corresponding layers of a second pixel driving circuit" do not include an anode layer AD or a pixel definition layer PDL. In one example, the "corresponding layers of a first pixel driving circuit and corresponding layers of a second pixel driving circuit" refers to conductive layers of the first pixel driving circuit and conductive layers of a second pixel driving circuit. In one specific example, "corresponding layers" includes at least one of a first semiconductor material layer SML, a first conductive layer CT1, a second conductive layer CT2, a first signal line layer SL1, or a second signal line layer SL2. In another specific example, "corresponding layers" further includes at least one of a gate insulating layer GI, an insulating layer IN, an inter-layer dielectric layer ILD, a first planarization layer PLN1, or a second planarization layer PLN2.

Figure 5A:
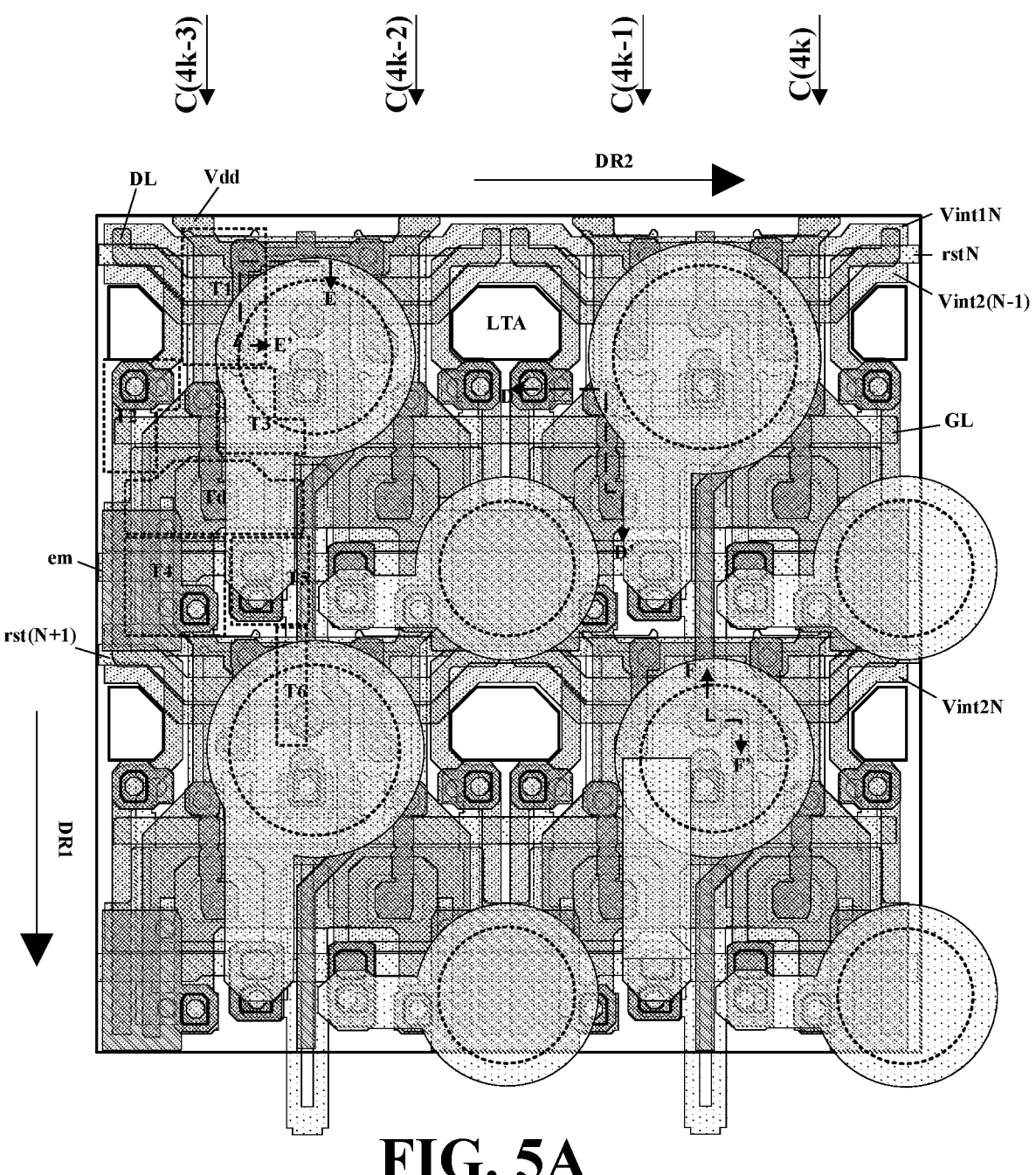
FIG. 5A is a diagram illustrating the structure of an array substrate in some embodiments according to the present disclosure.
Figure 5B:
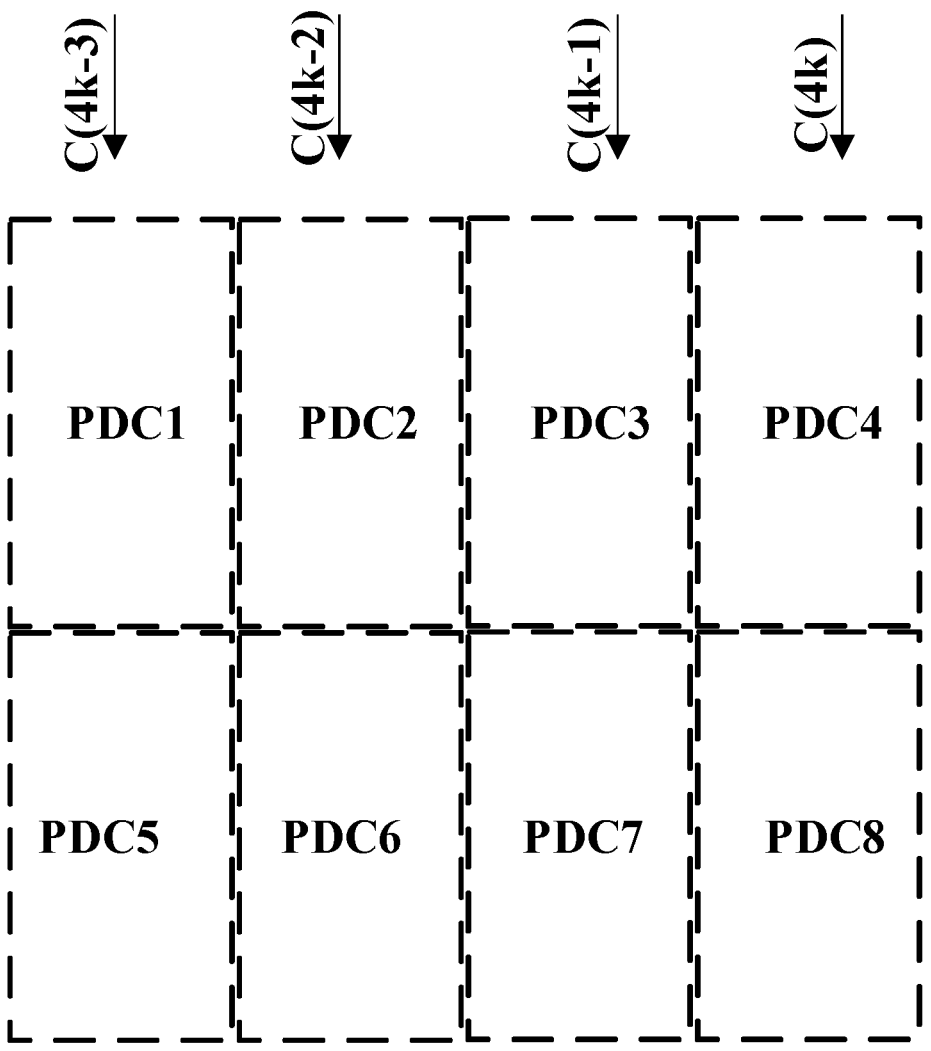
FIG. 5B is a schematic diagram illustrating an arrangement of a plurality of pixel driving circuits in an array substrate depicted in FIG. 5A.
Figure 5C:
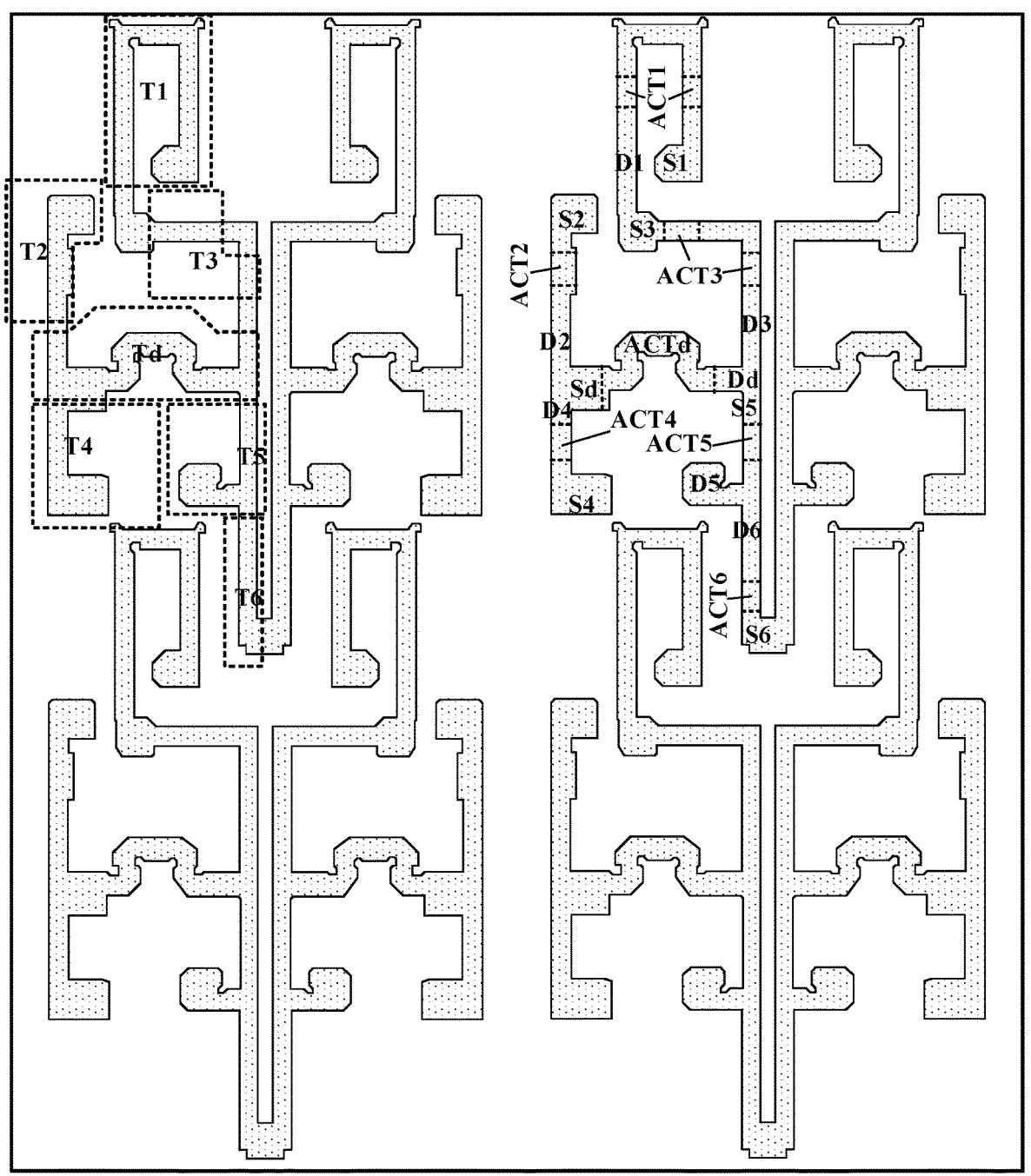
FIG. 5C is a diagram illustrating the structure of a semiconductor material layer in an array substrate depicted in FIG. 5A.
Figure 5D:
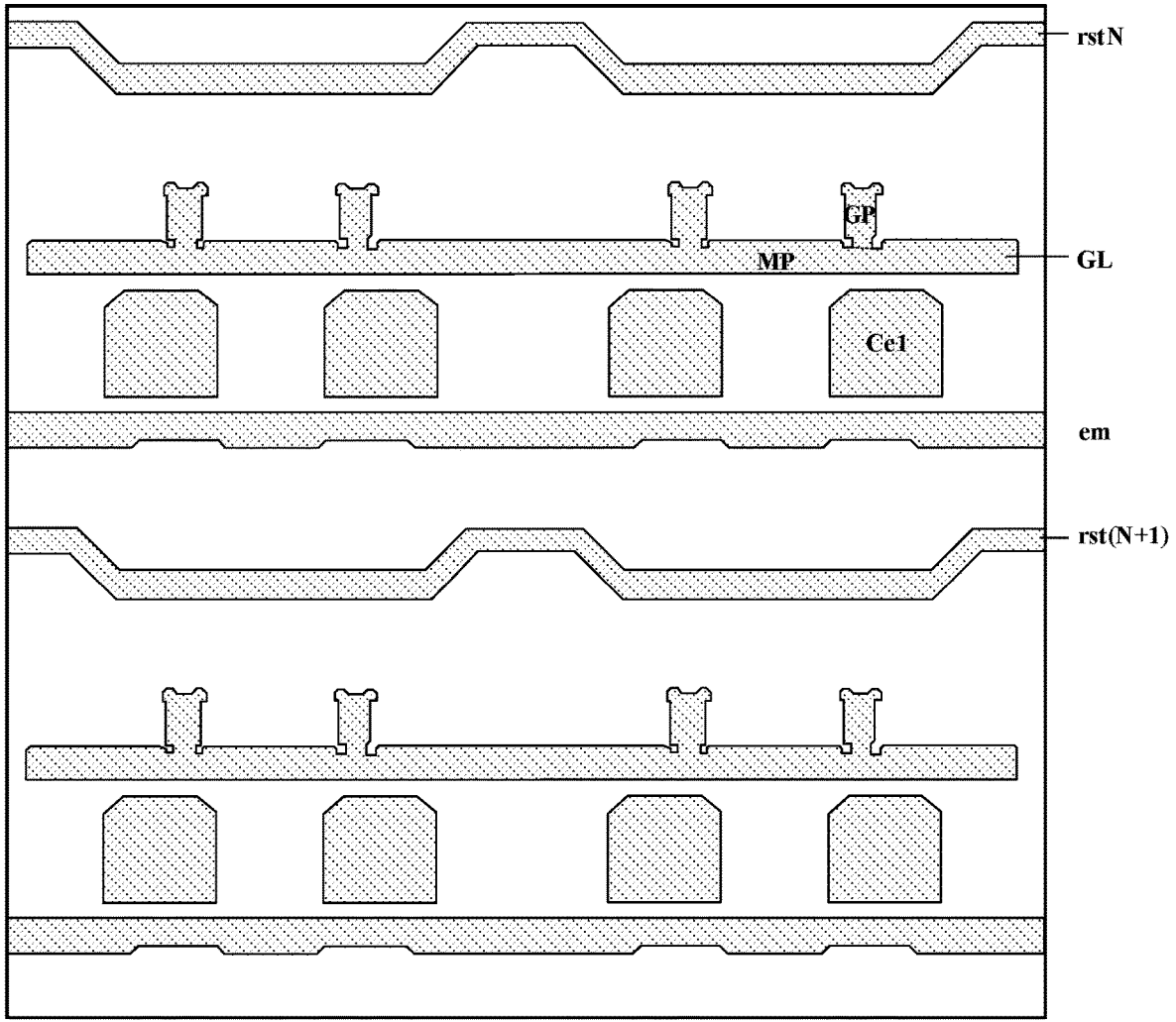
FIG. 5D is a diagram illustrating the structure of a first conductive layer in an array substrate depicted in FIG. 5A.
Figure 5E:
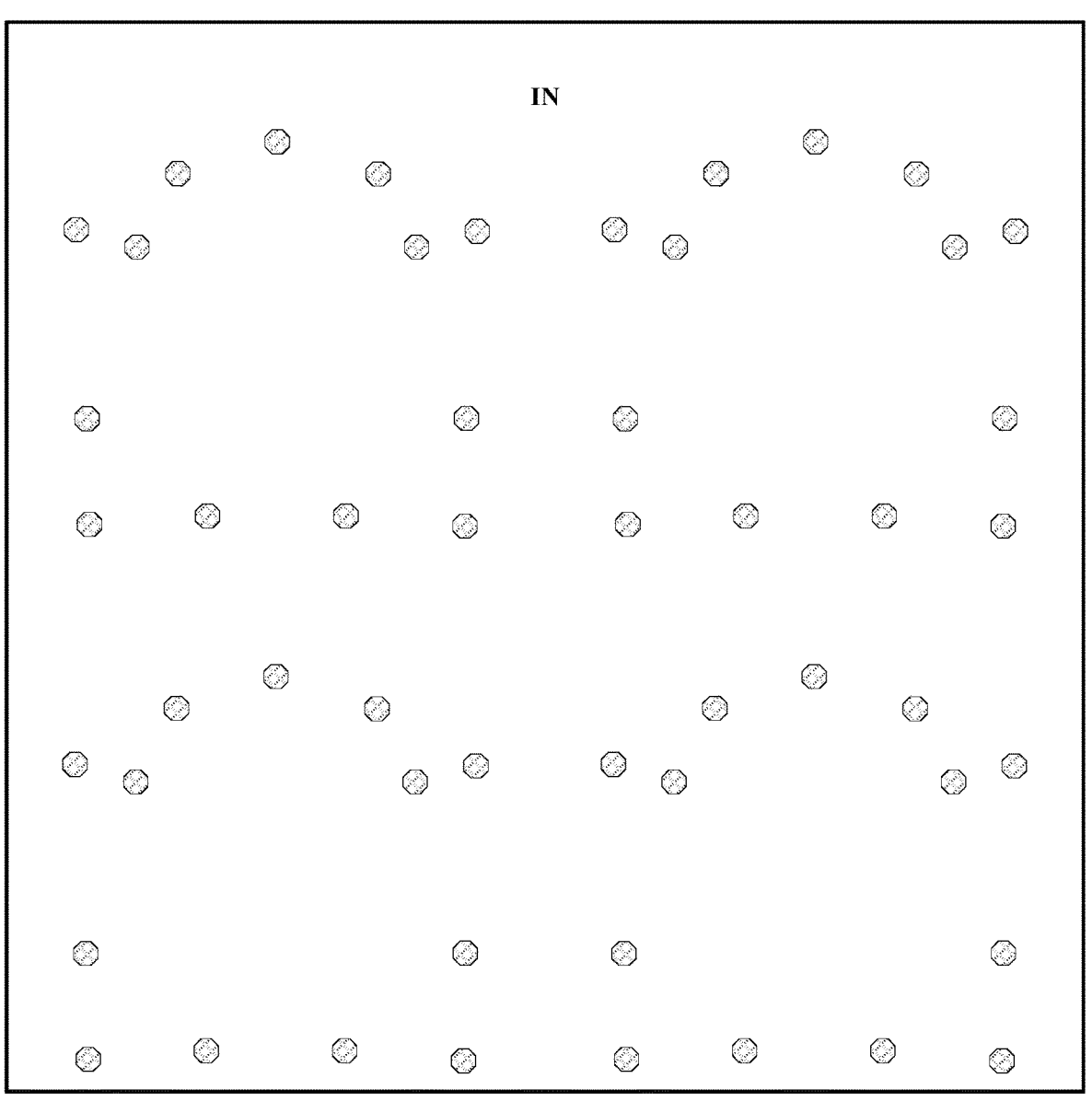
FIG. 5E is a diagram illustrating the structure of an insulating layer in an array substrate depicted in FIG. 5A.
Figure 5F:
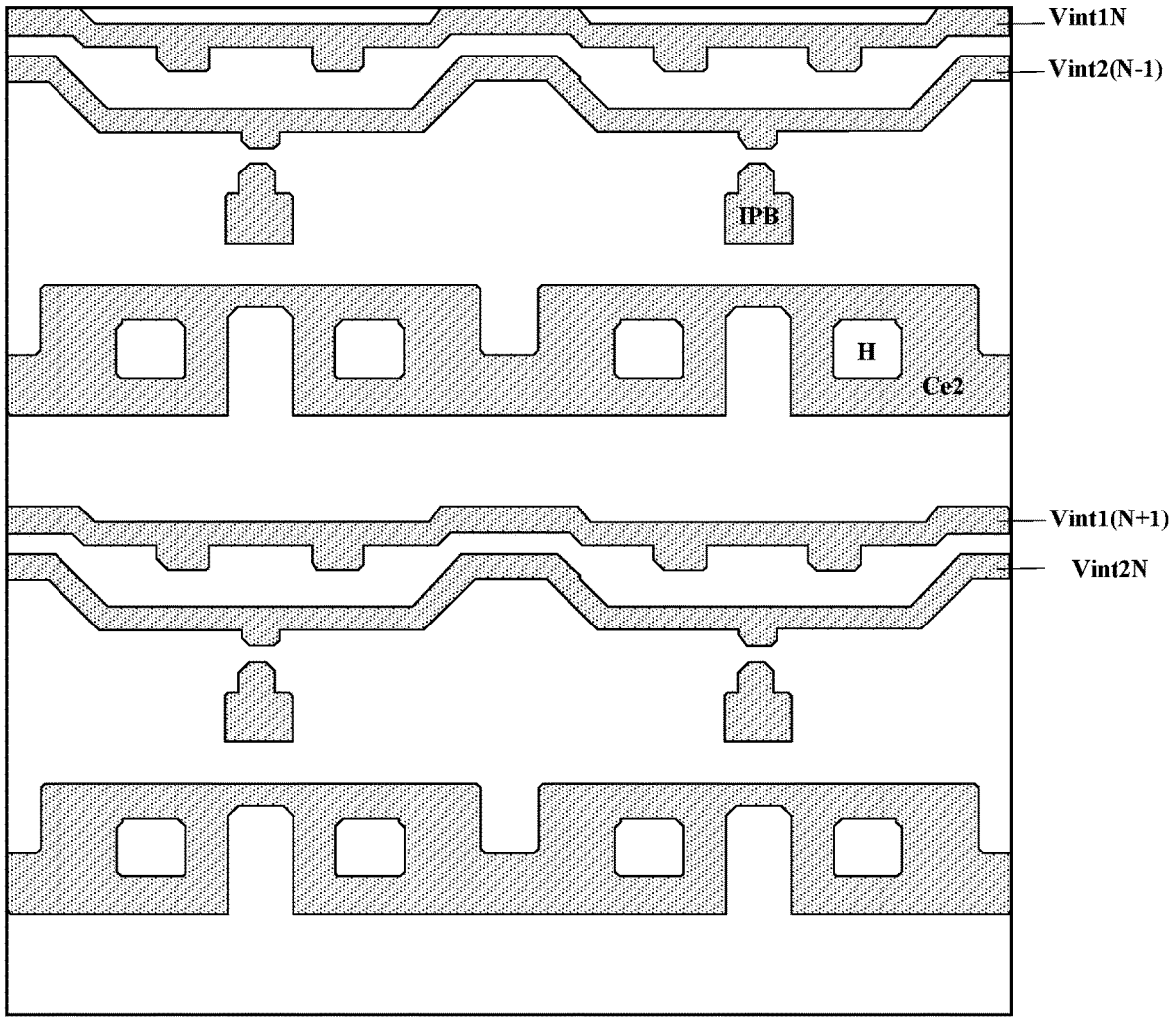
FIG. 5F is a diagram illustrating the structure of a second conductive layer in an array substrate depicted in FIG. 5A.
Figure 5G:
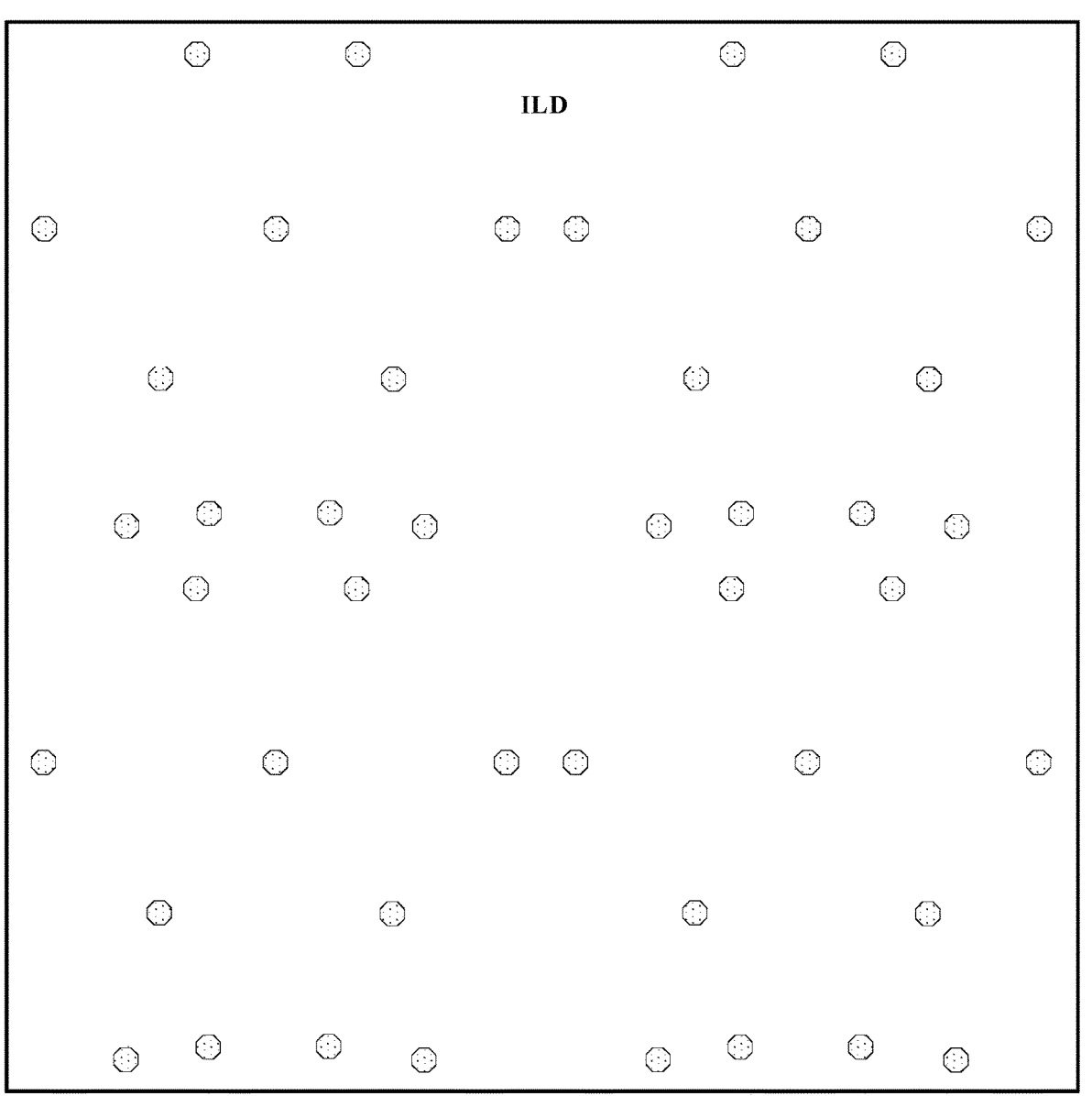
FIG. 5G is a diagram illustrating the structure of an inter-layer dielectric layer in an array substrate depicted in FIG. 5A.
Figure 5H:
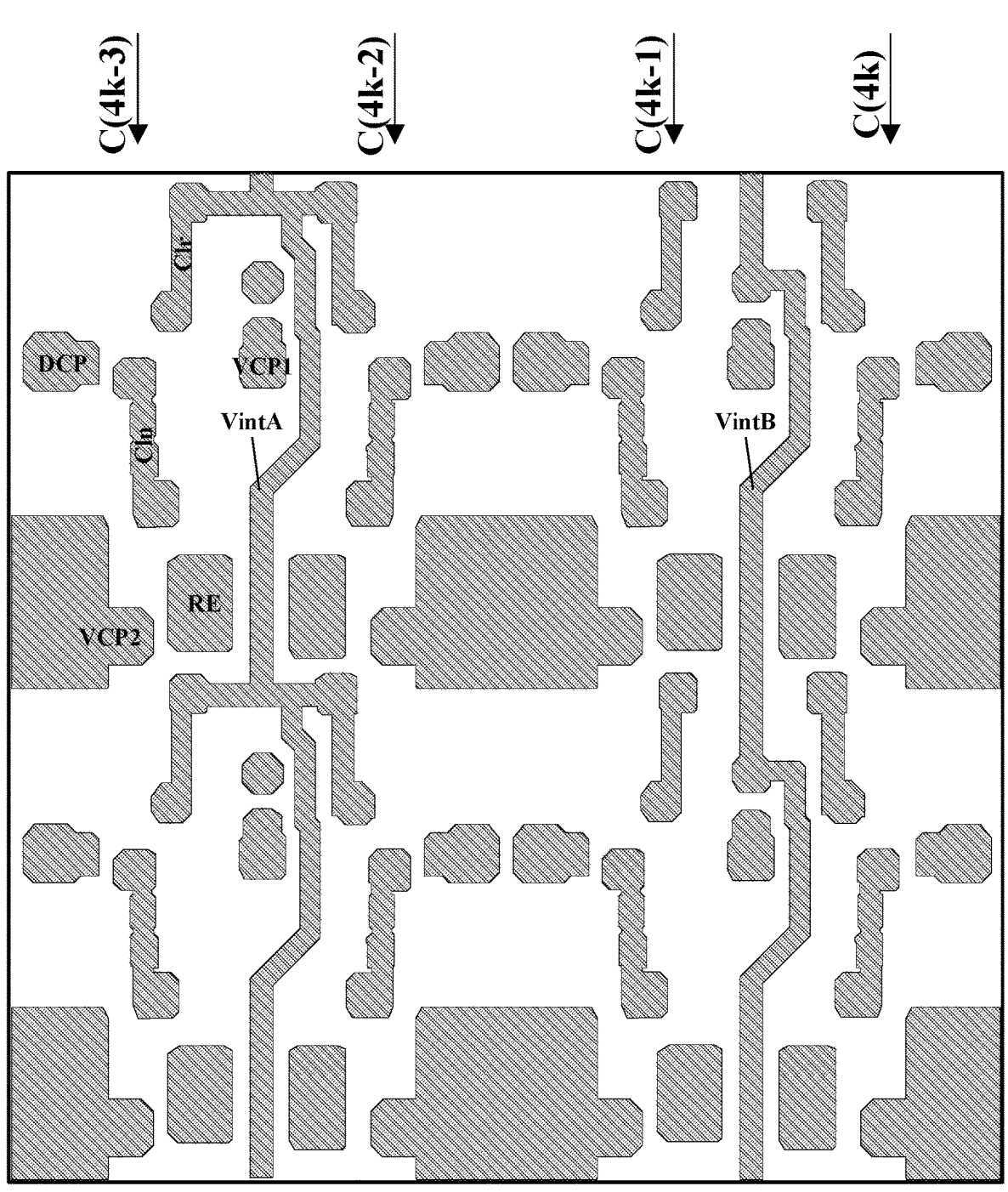
FIG. 5H is a diagram illustrating the structure of a first signal line layer in an array substrate depicted in FIG. 5A.
Figure 5I:
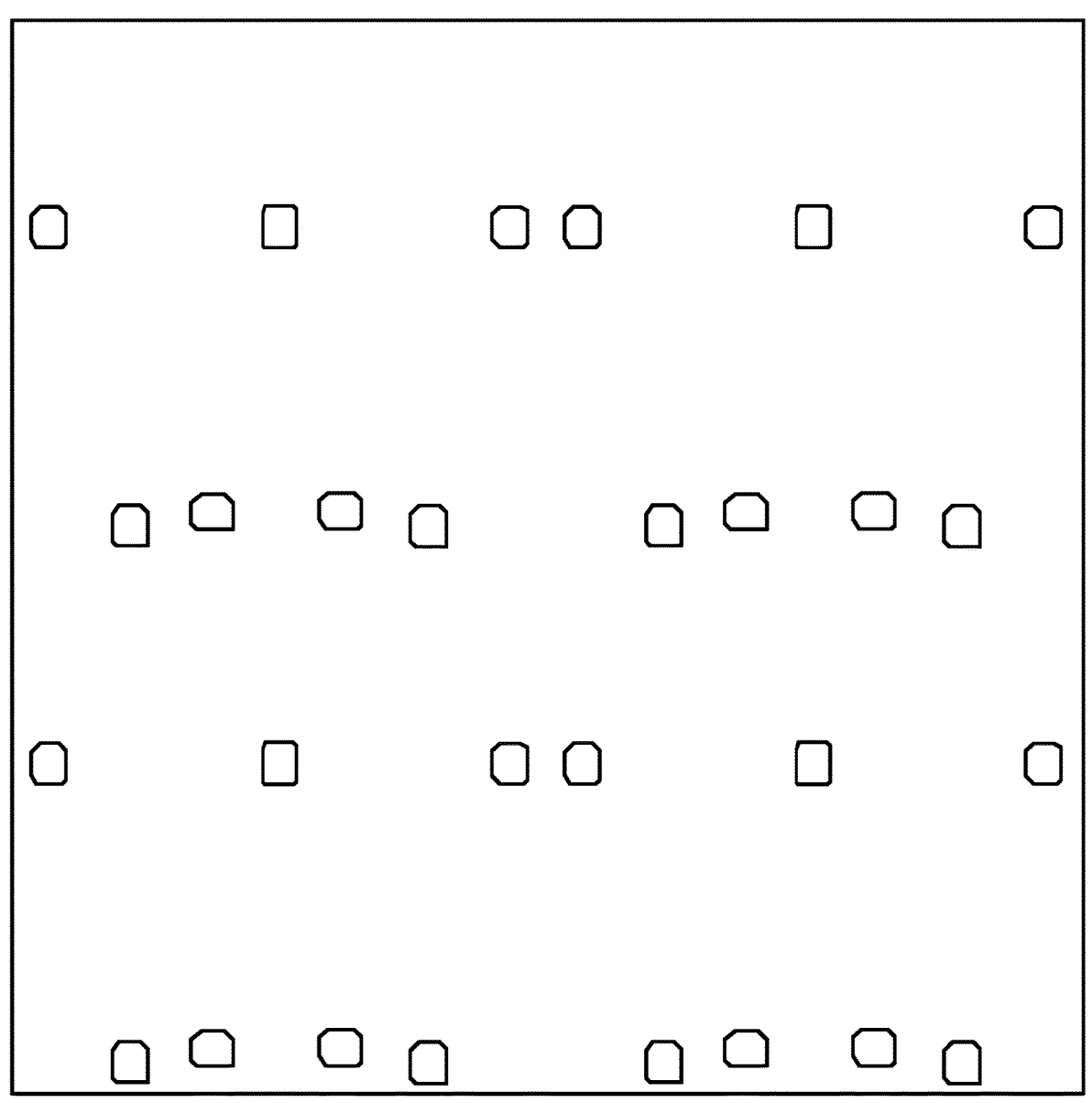
FIG. 5I is a diagram illustrating the structure of a first planarization layer in an array substrate depicted in FIG. 5A.
Figure 5J:
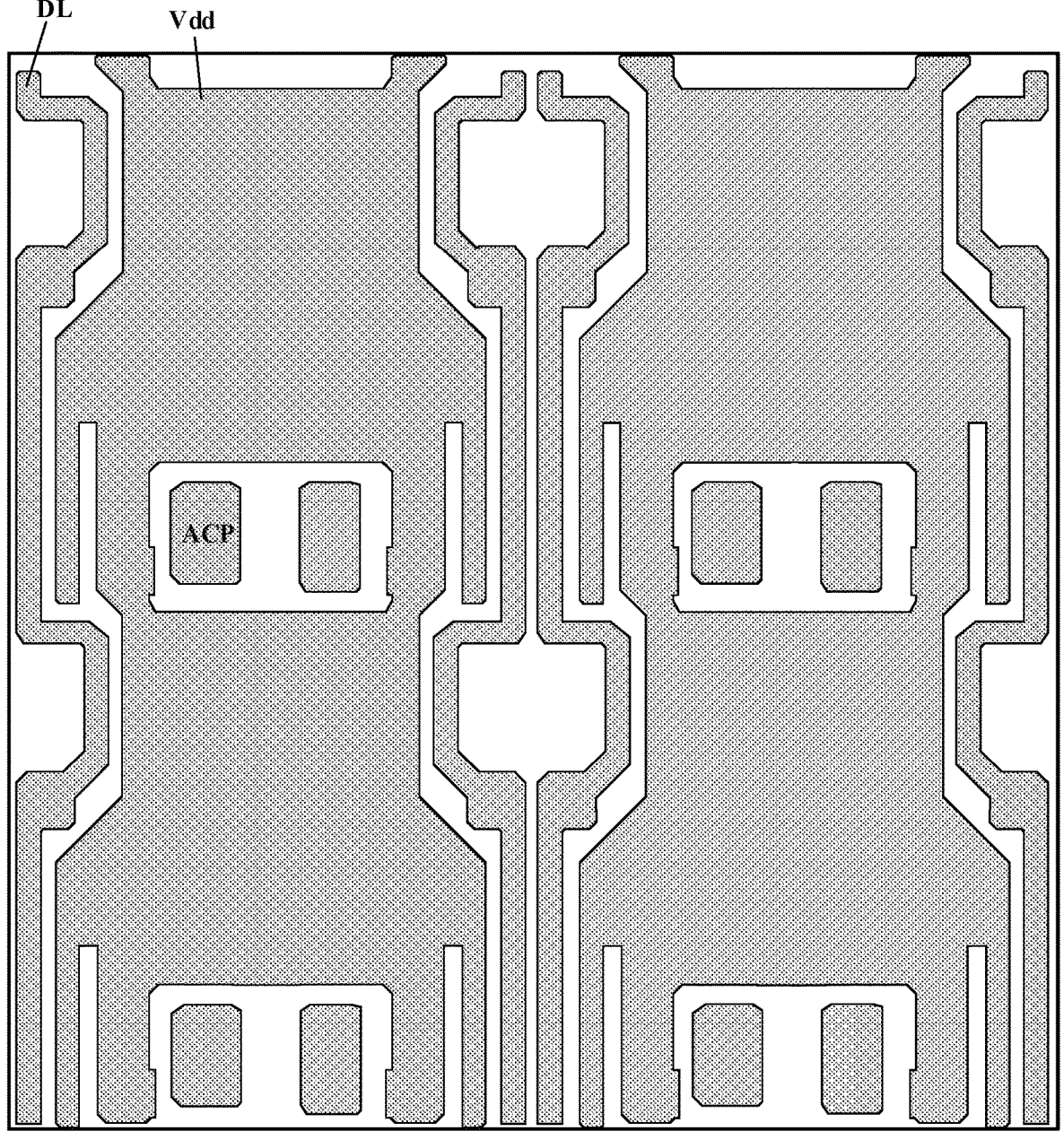
FIG. 5J is a diagram illustrating the structure of a second signal line layer in an array substrate depicted in FIG. 5A.
Figure 5K:
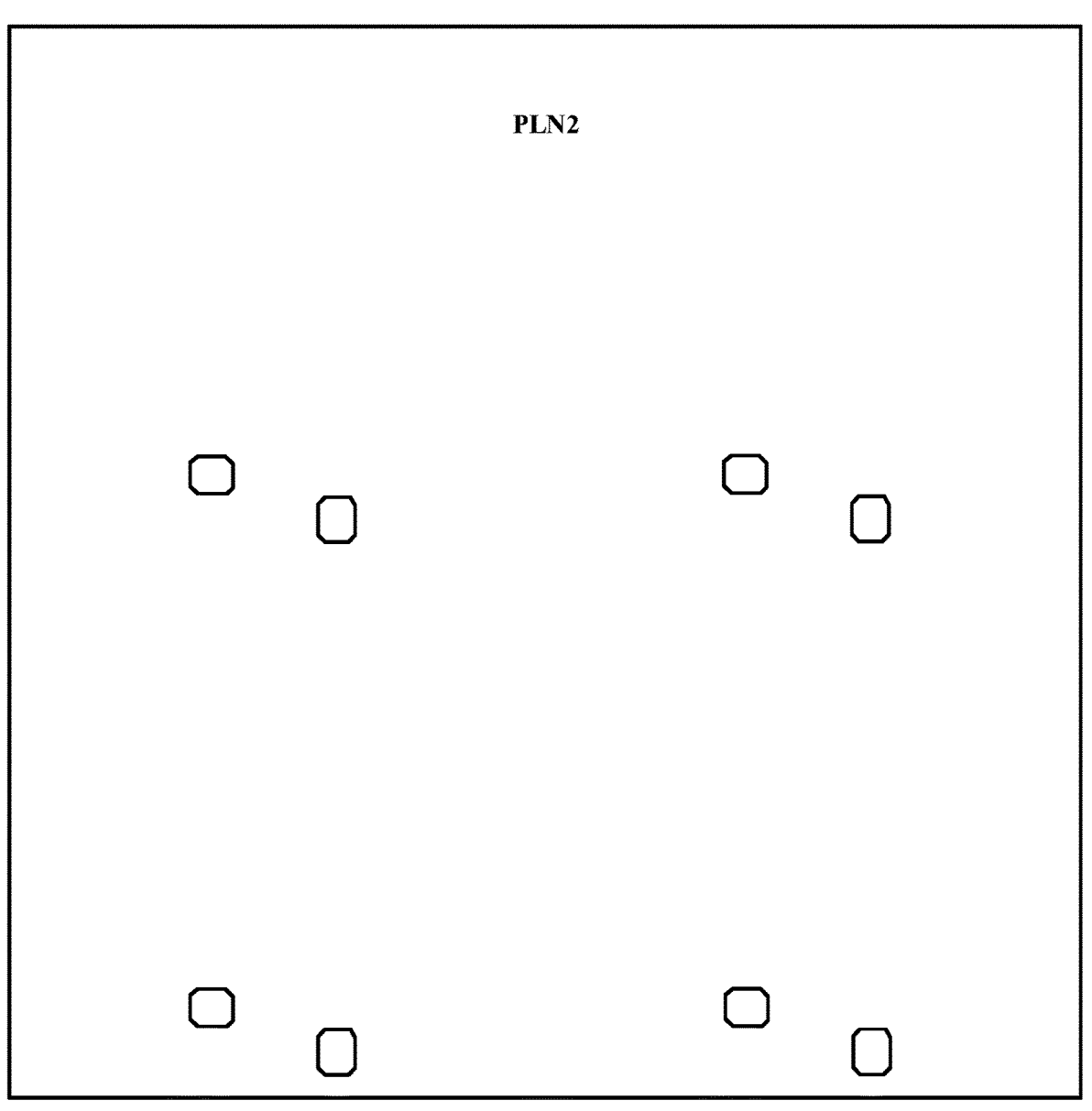
FIG. 5K is a diagram illustrating the structure of a second planarization layer in an array substrate depicted in FIG. 5A.
Figure 5L:
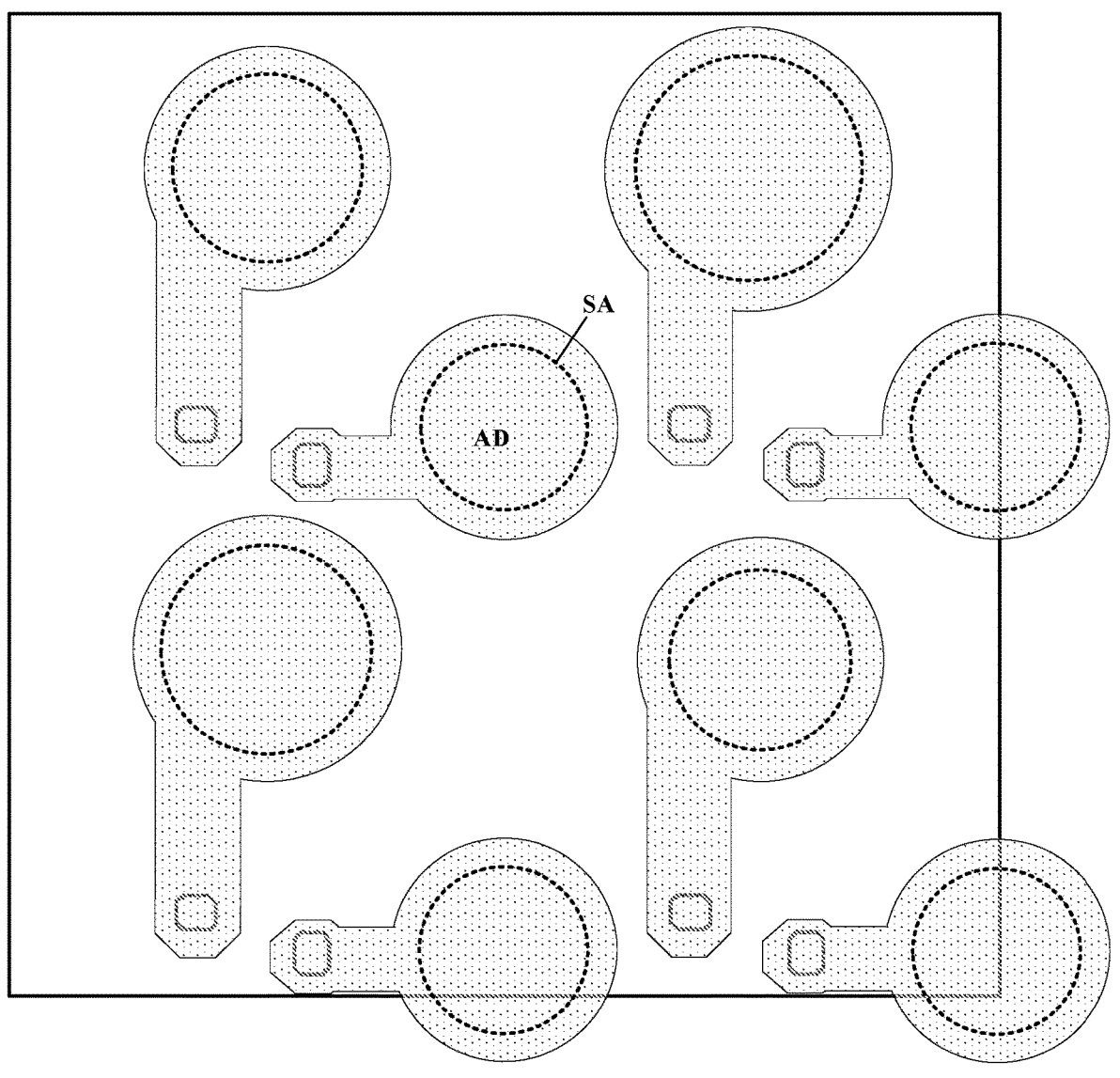
FIG. 5L is a diagram illustrating the structure of an anode layer in an array substrate depicted in FIG. 5A.
Figure 5M:
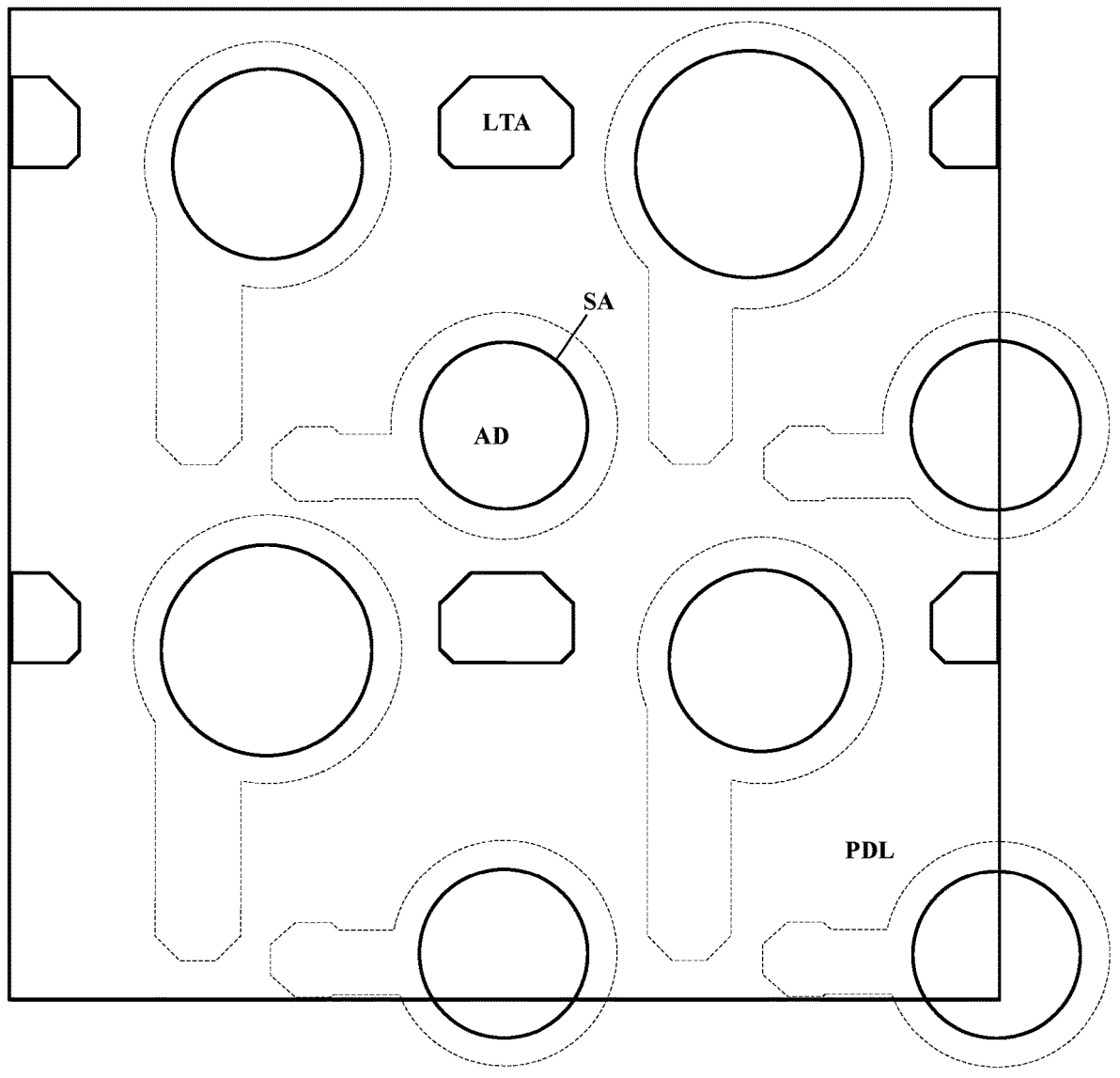
FIG. 5M is a diagram illustrating the structure of a pixel definition layer in an array substrate depicted in FIG. 5A.
Figure 6A:
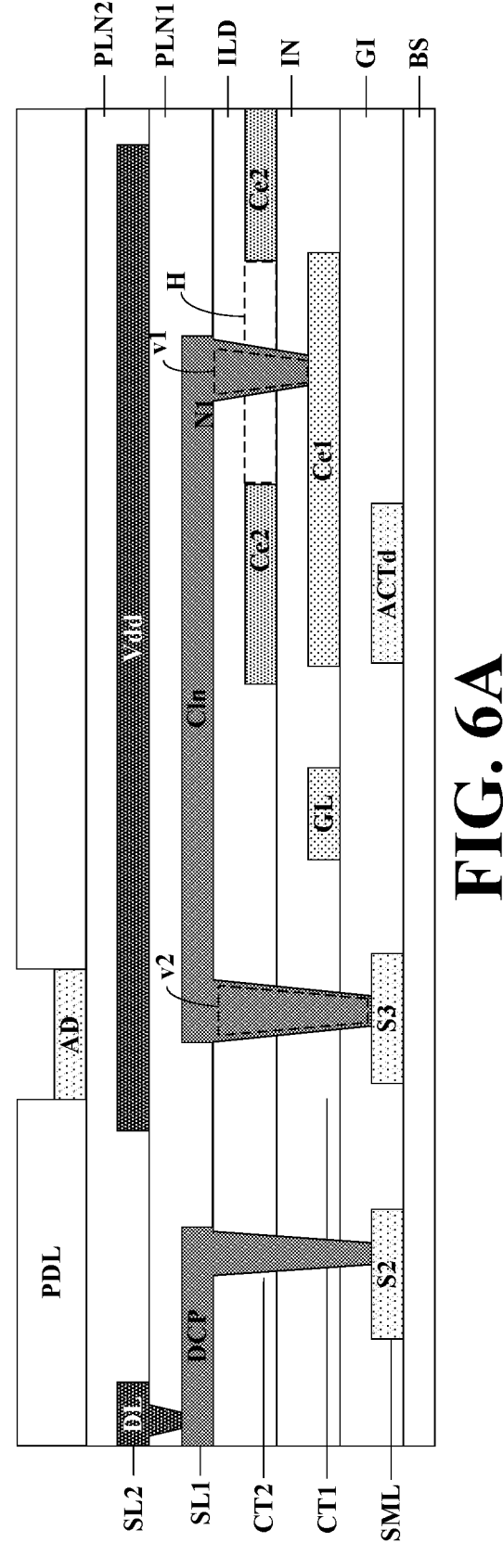
FIG. 6A is a cross-sectional view along a D-D' line in FIG. 5A.
Figure 6B:
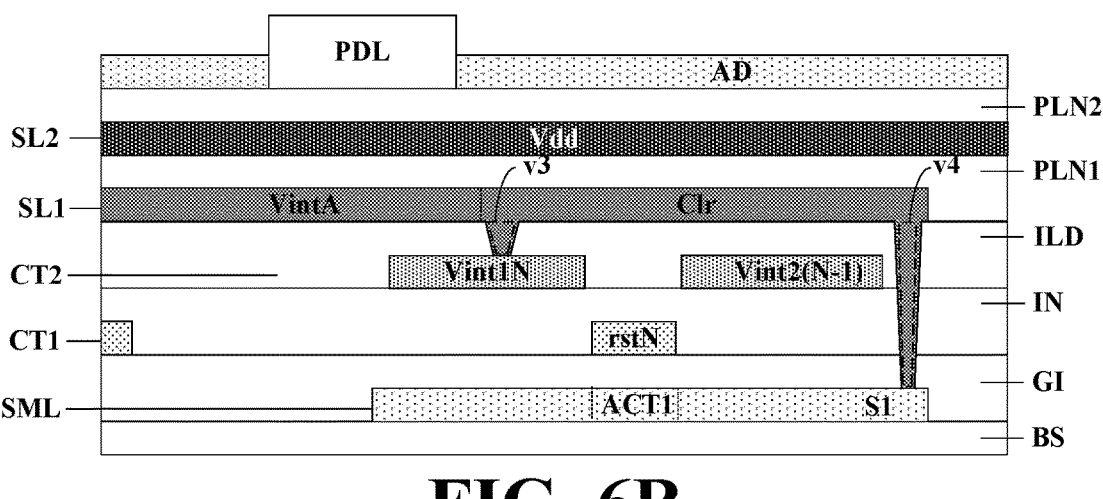
FIG. 6B is a cross-sectional view along a E-E' line in FIG. 5A.
Figure 6C:
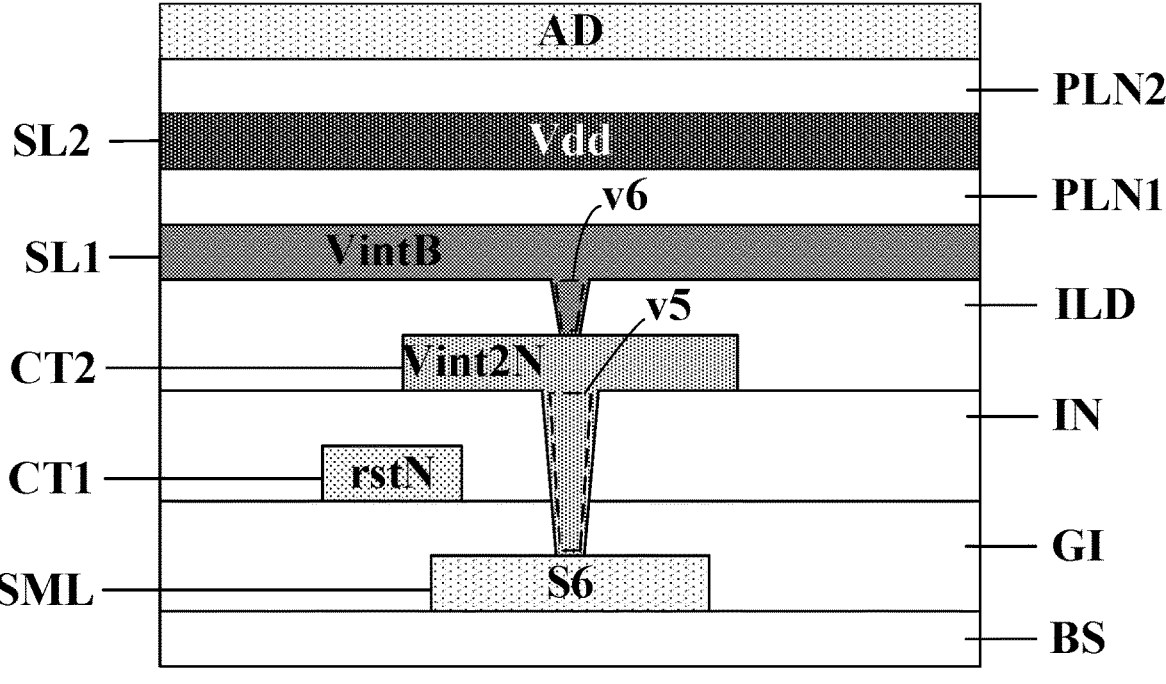
FIG. 6C is a cross-sectional view along an F-F' line in FIG. 5A.

FIG. 5A is a diagram illustrating the structure of an array substrate in some embodiments according to the present disclosure. FIG. 5B is a schematic diagram illustrating an arrangement of a plurality of pixel driving circuits in an array substrate depicted in FIG. 5A. FIG. 5C is a diagram illustrating the structure of a semiconductor material layer in an array substrate depicted in FIG. 5A. FIG. 5D is a diagram illustrating the structure of a first conductive layer in an array substrate depicted in FIG. 5A. FIG. 5E is a diagram illustrating the structure of an insulating layer in an array substrate depicted in FIG. 5A. FIG. 5F is a diagram illustrating the structure of a second conductive layer in an array substrate depicted in FIG. 5A. FIG. 5G is a diagram illustrating the structure of an inter-layer dielectric layer in an array substrate depicted in FIG. 5A. FIG. 5H is a diagram illustrating the structure of a first signal line layer in an array substrate depicted in FIG. 5A. FIG. 5I is a diagram illustrating the structure of a first planarization layer in an array substrate depicted in FIG. 5A. FIG. 5J is a diagram illustrating the structure of a second signal line layer in an array substrate depicted in FIG. 5A. FIG. 5K is a diagram illustrating the structure of a second planarization layer in an array substrate depicted in FIG. 5A. FIG. 5L is a diagram illustrating the structure of an anode layer in an array substrate depicted in FIG. 5A. FIG. 5M is a diagram illustrating the structure of a pixel definition layer in an array substrate depicted in FIG. 5A. FIG. 6A is a cross-sectional view along a D-D' line in FIG. 5A. FIG. 6B is a cross-sectional view along a E-E' line in FIG. 5A. FIG. 6C is a cross-sectional view along an F-F' line in FIG. 5A. The structure of the array substrate depicted in FIG. 5A to FIG. 5M, and FIG. 6A to FIG. 6C are similar to the array substrate depicted in FIG. 3A to FIG. 3M, and FIG. 4A to FIG. 4C, except for the structure of the first signal line layer.

FIG. 5A illustrates the structures of several layers of the array substrate, including a semiconductor material layer, a first conductive layer, a second conductive layer, and a first signal line layer. Corresponding positions of the plurality of transistors in a pixel driving circuit are depicted in FIG. 5A. The pixel driving circuit includes the first transistor T1, the second transistor T2, the third transistor T3, the fourth transistor T4, the fifth transistor T5, the sixth transistor T6, and the driving transistor Td. Referring to FIG. 5A, the array substrate in some embodiments includes a plurality of subpixels (e.g., a red subpixel, a green subpixel, and a blue subpixel). Referring to FIG. 5A and FIG. 5B, the pixel driving circuits are arranged in columns, including (4k−3)-th columns C(4k−3), (4k−2)-th columns C(4k−2), (4k−1)-th columns C(4k−1), and (4k)-th columns C(4k) of K columns, K and k being positive integers, 1≤k≤(K/4).

As used herein, the terms "(4k−3)-th column", "(4k−2)-th column", "(4k−1)-th column", and "(4k)-th column" are used in the context of the K columns. The array substrate may or may not include additional column(s) before the first column of the K columns and/or additional columns after the last column of the K columns. In the context of the array substrate, the terms "(4k−3)-th column" and "(4k−1)-th column" does not necessarily denote an odd-numbered column, and the term "(4k−2)-th column" and "(4k)-th column does not necessarily denote an even-numbered column. In one example, the (4k−3)-th column is an odd-numbered column in the context of the K columns, but may be an even-numbered column in the context of the array substrate. In another example, the (4k−3)-th column is an odd-numbered column in the context of the K columns, and also an odd-numbered column in the context of the array substrate. In one example, the (4k−2)-th column is an even-numbered column in the context of the K columns, but may be an odd-numbered column in the context of the array substrate. In another example, the (4k−2)-th column is an even-numbered column in the context of the K columns, and also an even-numbered column in the context of the array substrate. In one example, the (4k−1)-th column is an odd-numbered column in the context of the K columns, but may be an even-numbered column in the context of the array substrate. In another example, the (4k−1)-th column is an odd-numbered column in the context of the K columns, and also an odd-numbered column in the context of the array substrate. In one example, the (4k)-th column is an even-numbered column in the context of the K columns, but may be an odd-numbered column in the context of the array substrate. In another example, the (4k)-th column is an even-numbered column in the context of the K columns, and also an even-numbered column in the context of the array substrate.

Referring to FIG. 5A to FIG. 5M, the array substrate in some embodiments includes a plurality of gate lines GL respectively extending along a second direction DR2, a plurality of reset control signal lines (including a reset control signal line of a present stage rstN) respectively extending along the second direction DR2; a plurality of first reset signal lines (including a respective first reset signal line of a present stage Vint1N) respectively extending along the second direction DR2, a plurality of second reset signal lines (including a respective second reset signal line of a present stage Vinit2N) respectively extending along the second direction DR2; a plurality of light emitting control signal lines em respectively extending along the second direction DR2; a plurality of voltage supply lines Vdd respectively extending along the first direction DR1; a plurality of data lines DL respectively extending along the first direction DR1; a plurality of third reset signal lines (including a respective third reset signal line VintA) respectively extending along the first direction DR1; and a plurality of fourth reset signal lines (including a respective fourth reset signal line VintB) extending along the first direction DR1. Optionally, the plurality of gate lines GL, the plurality of light emitting control signal lines em, and the plurality of reset control signal lines are in a first conductive layer. Optionally, the plurality of first reset signal lines and the plurality of second reset signal lines are in the second conductive layer. Optionally, the plurality of third reset signal lines and the plurality of fourth reset signal lines are in the first signal line layer. Optionally, the plurality of voltage supply lines Vdd and the plurality of data lines DL are in a second signal line layer.

Referring to FIG. 5A to FIG. 5M, in some embodiments, corresponding layers other than a first signal line layer of a first pixel driving circuit and corresponding layers other than a first signal line layer of a second pixel driving circuit directly adjacent to each other and in the present stage (or the present row) have a substantially mirror symmetry with respect to each other, e.g., about a plane perpendicular to a main surface of the array substrate and substantially parallel to extension directions of the plurality of data lines DL in FIG. 5A.

Referring to FIG. 5A to FIG. 5M, in some embodiments, the respective third reset signal line VintA is shared between a (4k−3)-th column C(4k−3) of pixel driving circuits and a (4k−2)-th column C(4k−2) of pixel driving circuits; and the respective fourth reset signal line VintB is shared between a (4k−1)-th column C(4k−1) of pixel driving circuits and a (4k)-th column C(4k) of pixel driving circuit. For example, the respective third reset signal line VintA is configured to provide reset signals to pixel driving circuits in the (4k−3)-th column C(4k−3) and in the (4k−2)-th column C(4k−2); the respective fourth reset signal line VintB is configured to provide reset signals to pixel driving circuits in the (4k−1)-th column C(4k−1) and in the (4k)-th column C(4k).

In some embodiments, the respective third reset signal line VintA is electrically connected to the plurality of first reset signal lines (e.g., Vint1N, Vint1(N+1)). Optionally, the respective third reset signal line VintA is electrically isolated from the plurality of second reset signal lines (e.g., Vint2N, Vint2(N−1)).

In some embodiments, the respective fourth reset signal line VintB is electrically connected to the plurality of second reset signal lines (e.g., Vint2N, Vint2(N−1)). Optionally, the respective fourth reset signal line VintB is electrically isolated from the plurality of first reset signal lines (e.g., Vint1N, Vint1(N+1)).

In some embodiments, the plurality of third reset signal lines have a same line pattern. The plurality of fourth reset signal lines have a same line pattern. Optionally, a respective third reset signal line and a respective fourth reset signal line have different line patterns.

In some embodiments, the plurality of third reset signal lines are substantially parallel to each other, and the plurality of fourth reset signal lines are substantially parallel to each other. A respective third reset signal line is non-parallel to a respective fourth reset signal line.

Referring to FIG. 5H, in some embodiments, conductive components of the first signal line layer other than the respective third reset signal line VintA in a first pixel driving circuit in the (4k–3)-th column C(4k–3) and conductive components of the first signal line layer other than the respective third reset signal line VintA in a second pixel driving circuit in the (4k–2)-th column C(4k–2) have a substantially mirror symmetry with respect to each other, e.g., about a plane perpendicular to a main surface of the array substrate and substantially parallel to extension directions of the plurality of data lines DL in FIG. 5A, wherein the first pixel driving circuit in the (4k–3)-th column C(4k–3) and the second pixel driving circuit in the (4k–2)-th column C(4k–2) are directly adjacent to each other and in the present stage (or the present row).

Referring to FIG. 5H, in some embodiments, conductive components of the first signal line layer other than the respective fourth reset signal line VintB in a third pixel driving circuit in the (4k–1)-th column C(4k–1) and conductive components of the first signal line layer other than the respective fourth reset signal line VintB in a fourth pixel driving circuit in the (4k)-th column C(4k) have a substantially mirror symmetry with respect to each other, e.g., about a plane perpendicular to a main surface of the array substrate and substantially parallel to extension directions of the plurality of data lines DL in FIG. 5A, wherein the third pixel driving circuit in the (4k–1)-th column C(4k–1) and the fourth pixel driving circuit in the (4k)-th column C(4k) are directly adjacent to each other and in the present stage (or the present row).

FIG. 7A illustrates the structure of a respective third reset signal line in some embodiments according to the present disclosure. Referring to FIG. 5H and FIG. 7A, in some embodiments, the respective third reset signal line VintA and reset signal connecting lines (e.g., Clr) of pixel driving circuits in the (4k–3)-th column C(4k–3) and the (4k–2)-th column C(4k–2) are part of a unitary structure. The respective third reset signal line VintA is electrically connected to sources electrodes of first transistors of pixel driving circuits in the (4k–3)-th column C(4k–3) and the (4k–2)-th column C(4k–2).

In some embodiments, the respective third reset signal line VintA includes multiple first parts P1 and multiple second parts P2 alternately arranged. A respective first part of the multiple first parts P1 connects two adjacent second parts of the multiple second parts P2 together. A respective second part of the multiple second parts P2 connects two adjacent first parts of the multiple first parts P1 together. The respective first part connects two adjacent reset signal connecting lines respectively from two adjacent pixel driving circuits in the (4k–3)-th column C(4k–3) and the (4k–2)-th column C(4k–2) together. In one example, the respective first part extends along a direction substantially parallel to the second direction DR2. In another example, the respective second part extends along a direction substantially parallel to the first direction DR1.

As used herein, the term "substantially parallel" means that an angle is in the range of 0 degree to approximately 45 degrees, e.g., 0 degree to approximately 5 degrees, 0 degree to approximately 10 degrees, 0 degree to approximately 15 degrees, 0 degree to approximately 20 degrees, 0 degree to approximately 25 degrees, 0 degree to approximately 30 degrees.

Referring to FIG. 6B, in some embodiments, the array substrate further includes a third via v3 and a fourth via v4. The third via v3 extends through the inter-layer dielectric layer ILD. The fourth via v4 extends through the inter-layer dielectric layer ILD, the insulating layer IN, and the gate insulating layer GI. The reset signal connecting line Clr is connected to a respective first reset signal line (e.g., a respective first reset signal line of a present stage Vint1N) through the third via v3, and the reset signal connecting line Clr is connected to the source electrode S1 of the first transistor T1 through the fourth via v4. The reset signal connecting line Clr crosses over a respective second reset signal line of a previous adjacent stage Vinit2(N–1)). Optionally, the reset signal connecting line Clr crosses over a respective reset control signal line rstN in a present stage. Optionally, an orthographic projection of the reset signal connecting line Clr on the base substrate BS partially overlaps with an orthographic projection of the active layer ACT1 of the first transistor T1 on the base substrate BS. As shown in FIG. 6B, the respective third reset signal line VintA and the reset signal connecting line Clr are parts of a unitary structure.

FIG. 7B illustrates the structure of a respective fourth reset signal line in some embodiments according to the present disclosure. Referring to FIG. 5H and FIG. 7B, in some embodiments, the respective fourth reset signal line VintB is electrically connected to sources electrodes of sixth transistors of pixel driving circuits in the (4k–1)-th column C(4k–1) and the (4k)-th column C(4k). Optionally, the respective fourth reset signal line VintB is spaced apart (e.g., disconnected) from reset signal connecting lines (e.g., Clr) of pixel driving circuits in the (4k–1)-th column C(4k–1) and the (4k)-th column C(4k).

Referring to FIG. 6C, in some embodiments, the array substrate further includes a fifth via v5 and a sixth via v6. The fifth via v5 extends through the insulating layer IN and the gate insulating layer GI. The sixth via v6 extends through the inter-layer dielectric layer ILD. A respective second reset signal line Vint2N in the present stage of the plurality of second reset signal lines is connected to the source electrode S6 of the sixth transistor T6 through the fifth via v5. The respective fourth reset signal line VintB is connected to the respective second reset signal line Vint2N in the present stage through the sixth via v6. The respective fourth reset signal line VintB crosses over the respective second reset signal line Vint2N in the present stage.

Figure 8A:
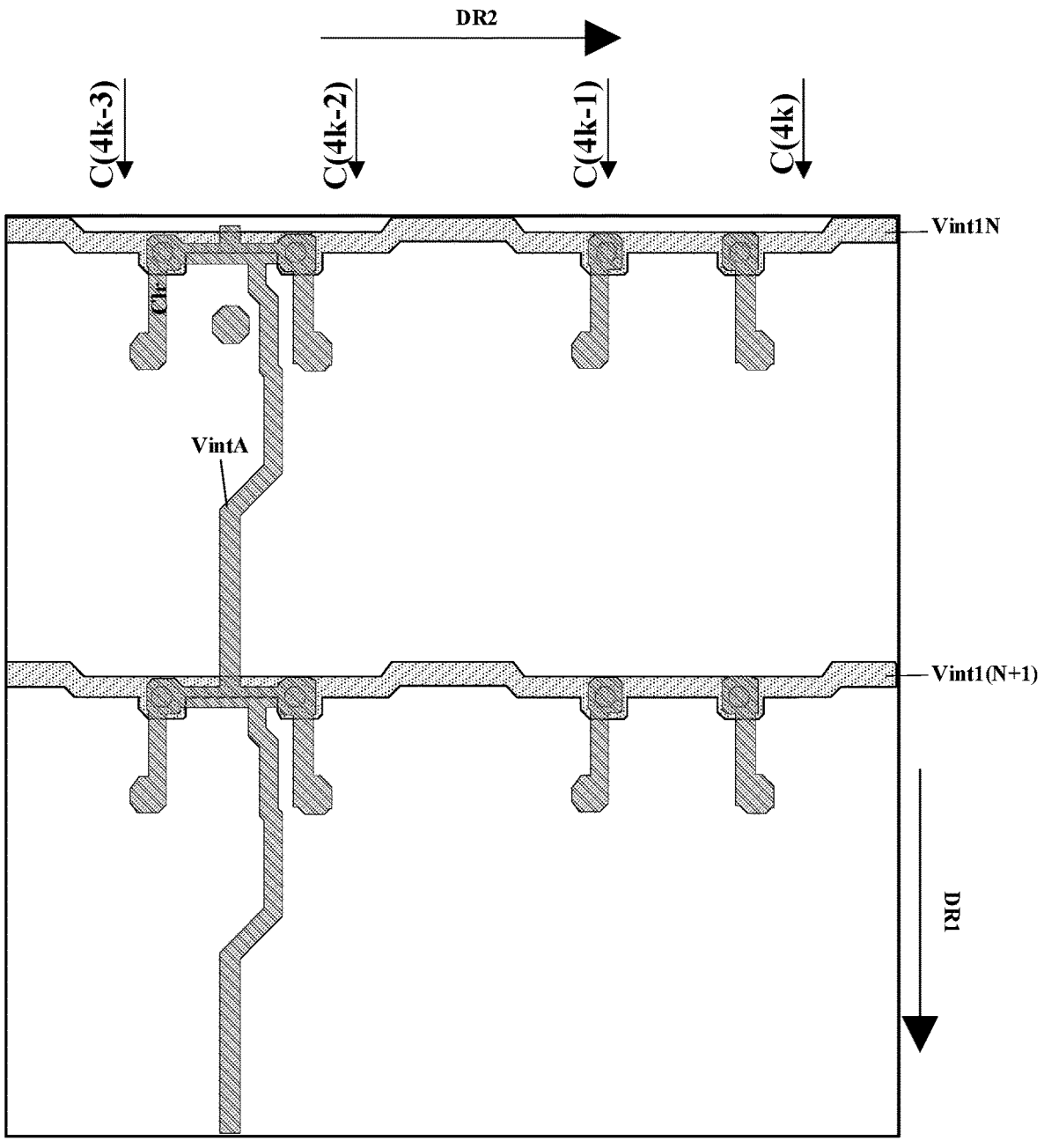
FIG. 8A is a diagram illustrating the structure of a first interconnected reset signal supply network in an array substrate in some embodiments according to the present disclosure.

FIG. 8A is a diagram illustrating the structure of a first interconnected reset signal supply network in an array substrate in some embodiments according to the present disclosure. The first interconnected reset signal supply network is configured to provide reset signals to source electrodes of first transistors in the array substrate, e.g., configured to reset N1 nodes in pixel driving circuits in the array substrate. Referring to FIG. 8A, the first interconnected reset signal supply network in some embodiments includes a plurality of first reset signal lines respectively extending along the second direction DR2 and a plurality of third reset signal lines respectively extending along the first direction DR1. A respective first reset signal line is connected to one or more (e.g., multiple ones, or optionally all) of the plurality of third reset signal lines. A respective third reset signal line is connected to one or more (e.g., multiple ones, or optionally all) of the plurality of first reset signal lines. The plurality of first reset signal lines respectively cross over the plurality of third reset signal lines.

Referring to FIG. 8A, in some embodiments, the first interconnected reset signal supply network further includes reset signal connecting lines (e.g., Clr) present in all of the (4k−3)-th column C(4k−3), the (4k−2)-th column C(4k−2), the (4k−1)-th column C(4k−1), and the (4k)-th column C(4k).

In some embodiments, a respective third reset signal line is shared between pixel driving circuits in the (4k−3)-th column C(4k−3) and the (4k−2)-th column C(4k−2), and is absent for the pixel driving circuits in the (4k−1)-th column C(4k−1) and the (4k)-th column C(4k). Optionally, the reset signal connecting lines (e.g., the reset signal connecting line Clr) is present in all of the (4k−3)-th column C(4k−3), the (4k−2)-th column C(4k−2), the (4k−1)-th column C(4k−1), and the (4k)-th column C(4k).

Figure 8B:
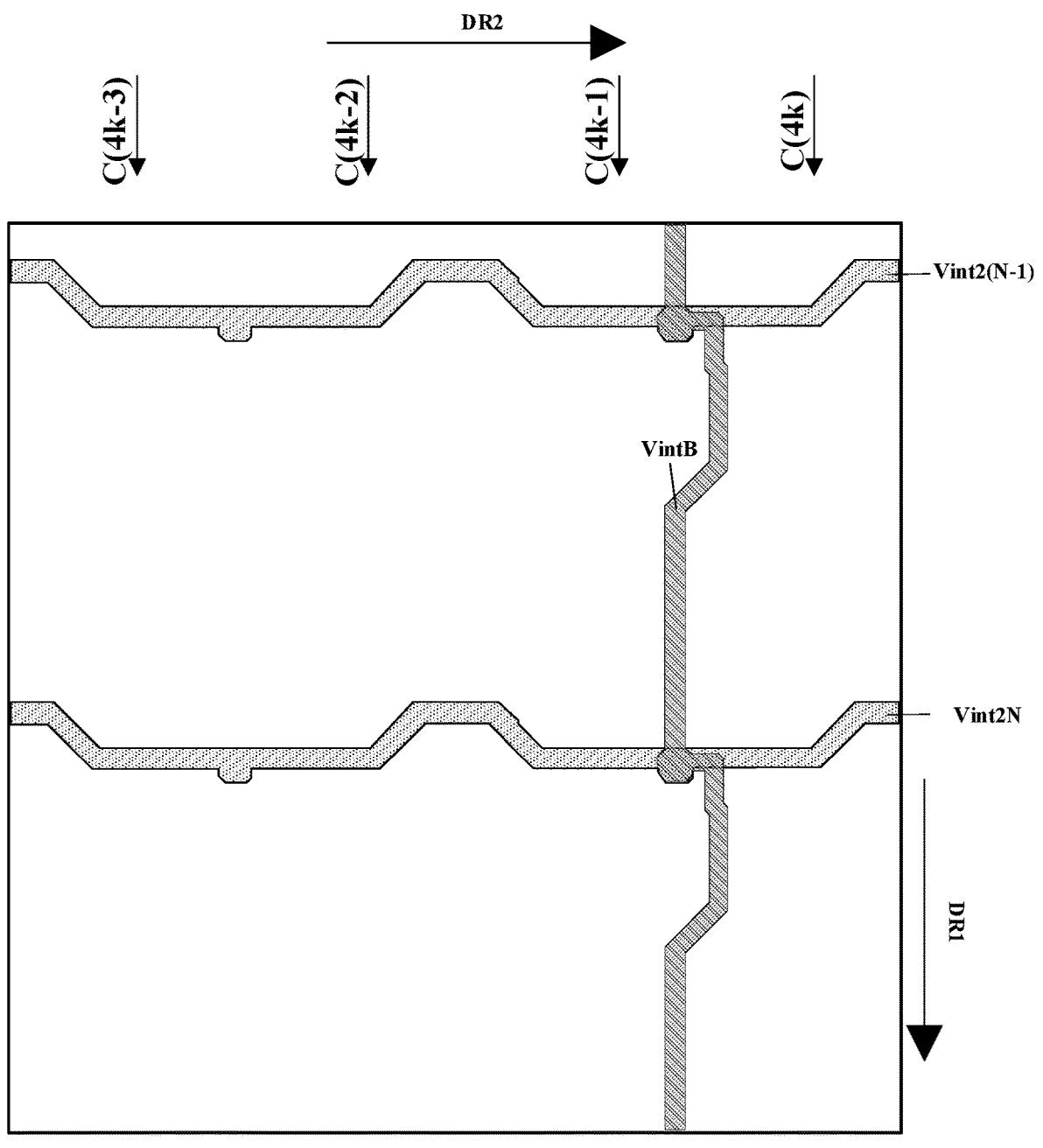
FIG. 8B is a diagram illustrating the structure of a second interconnected reset signal supply network in an array substrate in some embodiments according to the present disclosure.

FIG. 8B is a diagram illustrating the structure of a second interconnected reset signal supply network in an array substrate in some embodiments according to the present disclosure. The second interconnected reset signal supply network is configured to provide reset signals to source electrodes of sixth transistors in the array substrate, e.g., configured to reset N4 nodes in pixel driving circuits in the array substrate. Referring to FIG. 8B, the second interconnected reset signal supply network in some embodiments includes a plurality of second reset signal lines respectively extending along the second direction DR2 and a plurality of fourth reset signal lines respectively extending along the first direction DR1. A respective second reset signal line is connected to one or more (e.g., multiple ones, or optionally all) of the plurality of fourth reset signal lines. A respective fourth reset signal line is connected to one or more (e.g., multiple ones, or optionally all) of the plurality of second reset signal lines. The plurality of second reset signal lines respectively cross over the plurality of fourth reset signal lines.

In some embodiments, a respective fourth reset signal line is shared between pixel driving circuits in the (4k−1)-th column C(4k−1) and the (4k)-th column C(4k), and is absent for the pixel driving circuits in the (4k−3)-th column C(4k−3) and the (4k−2)-th column C(4k−2).

Referring to FIG. 5A, FIG. 5F, FIG. 8A, and FIG. 8B, in some embodiments, the plurality of first reset signal lines and the plurality of second reset signal lines are alternately arranged along the first direction DR1. Optionally, a respective first reset signal line in a present stage Vint1N, a respective second reset signal line in a previous adjacent stage Vint2(N−1), a respective first reset signal line in a next adjacent stage Vint1(N+1), and a respective second reset signal line in the present stage Vint2N are sequentially arranged along the first direction DR1. The respective first reset signal line in the present stage Vint1N and the respective second reset signal line in the present stage Vint2N are connected to a pixel driving circuit in the present stage. The respective second reset signal line in a previous adjacent stage Vint2(N−1) is connected to a pixel driving circuit in the previous adjacent stage. The respective first reset signal line in a next adjacent stage Vint1(N+1) is connected to a pixel driving circuit in the next adjacent stage.

In some embodiments, in a respective column of pixel driving circuit, a total number of pixel driving circuits (or a total number of subpixels) is P. Optionally, in two adjacent columns of pixel driving circuits, a total number of pixel driving circuits (or a total number of subpixels) is 2 P. At least in a respective pair of two adjacent columns of pixel driving circuits, a ratio of a total number of reset signal lines (e.g., VintA or VintB), a respective one of which extending along the first direction DR1 and through P number of rows of subpixels, to a total number of reset signal connecting lines (e.g., Clr), a respective one of which is limited to a single subpixel, is 1:2 P. In one example, in the (4k−3)-th column C(4k−3) and the (4k−2)-th column C(4k−2), a ratio of a total number of reset signal lines, a respective one of which extending along the first direction DR1 and through P number of rows of subpixels, to a total number of reset signal connecting lines, a respective one of which is limited to a single subpixel, is 1:2 P. In another example, in the (4k−1)-th column C(4k−1) and the (4k)-th column C(4k), a ratio of a total number of reset signal lines, a respective one of which extending along the first direction DR1 and through P number of rows of subpixels, to a total number of reset signal connecting lines, a respective one of which is limited to a single subpixel, is 1:2 P.

In some embodiments, in a respective column of pixel driving circuit, a total number of pixel driving circuits (or a total number of subpixels) is P. Optionally, in two adjacent columns of pixel driving circuits, a total number of pixel driving circuits (or a total number of subpixels) is 2 P. At least in a respective pair of two adjacent columns of pixel driving circuits, a ratio of a total number of voltage supply lines (e.g., Vdd), a respective one of which extending along the first direction DR1 and through P number of rows of subpixels, to a total number of reset signal connecting lines (e.g., Clr), a respective one of which is limited to a single subpixel, is 1:2 P. In one example, in the (4k−3)-th column C(4k−3) and the (4k−2)-th column C(4k−2), a ratio of a total number of voltage supply lines, a respective one of which extending along the first direction DR1 and through P number of rows of subpixels, to a total number of reset signal connecting lines, a respective one of which is limited to a single subpixel, is 1:2 P. In another example, in the (4k−1)-th column C(4k−1) and the (4k)-th column C(4k), a ratio of a total number of voltage supply lines, a respective one of which extending along the first direction DR1 and through P number of rows of subpixels, to a total number of reset signal connecting lines, a respective one of which is limited to a single subpixel, is 1:2 P.

In some embodiments, the array substrate may include dummy subpixels, which may include "dummy" pixel driving circuits that are not able to drive light emission in the dummy subpixels. In these dummy subpixels, reset signal connecting lines may not be present. In some embodiments, in a respective column of pixel driving circuits, the array substrate includes p number of dummy subpixels and (P-p) number of light emitting subpixels. Optionally, in a respective pair of two adjacent columns of pixel driving circuits, a ratio of a total number of reset signal lines (e.g., VintA or VintB), a respective one of which extending along the first direction DR1 and through P number of rows of subpixels, to a total number of reset signal connecting lines (e.g., Clr), a respective one of which is limited to a single subpixel, is 1:2(P-p). In one example, in the (4k−3)-th column C(4k−3) and the (4k−2)-th column C(4k−2), a ratio of a total number of reset signal lines, a respective one of which extending along the first direction DR1 and through P number of rows of subpixels, to a total number of reset signal connecting lines, a respective one of which is limited to a single subpixel, is 1:2(P-p). In another example, in the (4k−1)-th column C(4k−1) and the (4k)-th column C(4k), a ratio of a total number of reset signal lines, a respective one of which extending along the first direction DR1 and through P number of rows of subpixels, to a total number of reset signal connecting lines, a respective one of which is limited to a single subpixel, is 1:2(P-p).

In some embodiments, in a respective column of pixel driving circuits, the array substrate includes p number of dummy subpixels and (P-p) number of light emitting subpixels. Optionally, in a respective pair of two adjacent columns of pixel driving circuits, a ratio of a total number of voltage supply lines (e.g., Vdd), a respective one of which extending along the first direction DR1 and through P number of rows of subpixels, to a total number of reset signal connecting lines (e.g., Clr), a respective one of which is limited to a single subpixel, is 1:2(P-p). In one example, in the (4k–3)-th column C(4k–3) and the (4k–2)-th column C(4k–2), a ratio of a total number of voltage supply lines, a respective one of which extending along the first direction DR1 and through P number of rows of subpixels, to a total number of reset signal connecting lines, a respective one of which is limited to a single subpixel, is 1:2(P-p). In another example, in the (4k–1)-th column C(4k–1) and the (4k)-th column C(4k), a ratio of a total number of voltage supply lines, a respective one of which extending along the first direction DR1 and through P number of rows of subpixels, to a total number of reset signal connecting lines, a respective one of which is limited to a single subpixel, is 1:2(P-p).

The inventors of the present disclosure further discover that a degree of unevenness of anodes in an array substrate or a display panel could adversely affect image display. For example, color shift may result from the anodes being tilted. It is discovered in the present disclosure that signal lines underneath the anodes could significantly affect the degree the anodes being titled. In one example, underneath an anode, at one side a signal line is disposed while the other side is absent of a signal line. This results in an uneven surface of a planarization layer on top of the signal line. The uneven surface of the planarization layer in turn results in the anode on top of the planarization layer being tilted. The titled anode reflects more light toward one side of the array substrate or the display panel. In the array substrate or the display panel, titled anodes associated with subpixels of different colors have different titled angles, thus light reflected by anodes in subpixels of different colors reflect light of different colors respectively at different angles. The accumulated effect of this issue lead to color shift at a large viewing angle.

Figure 9:
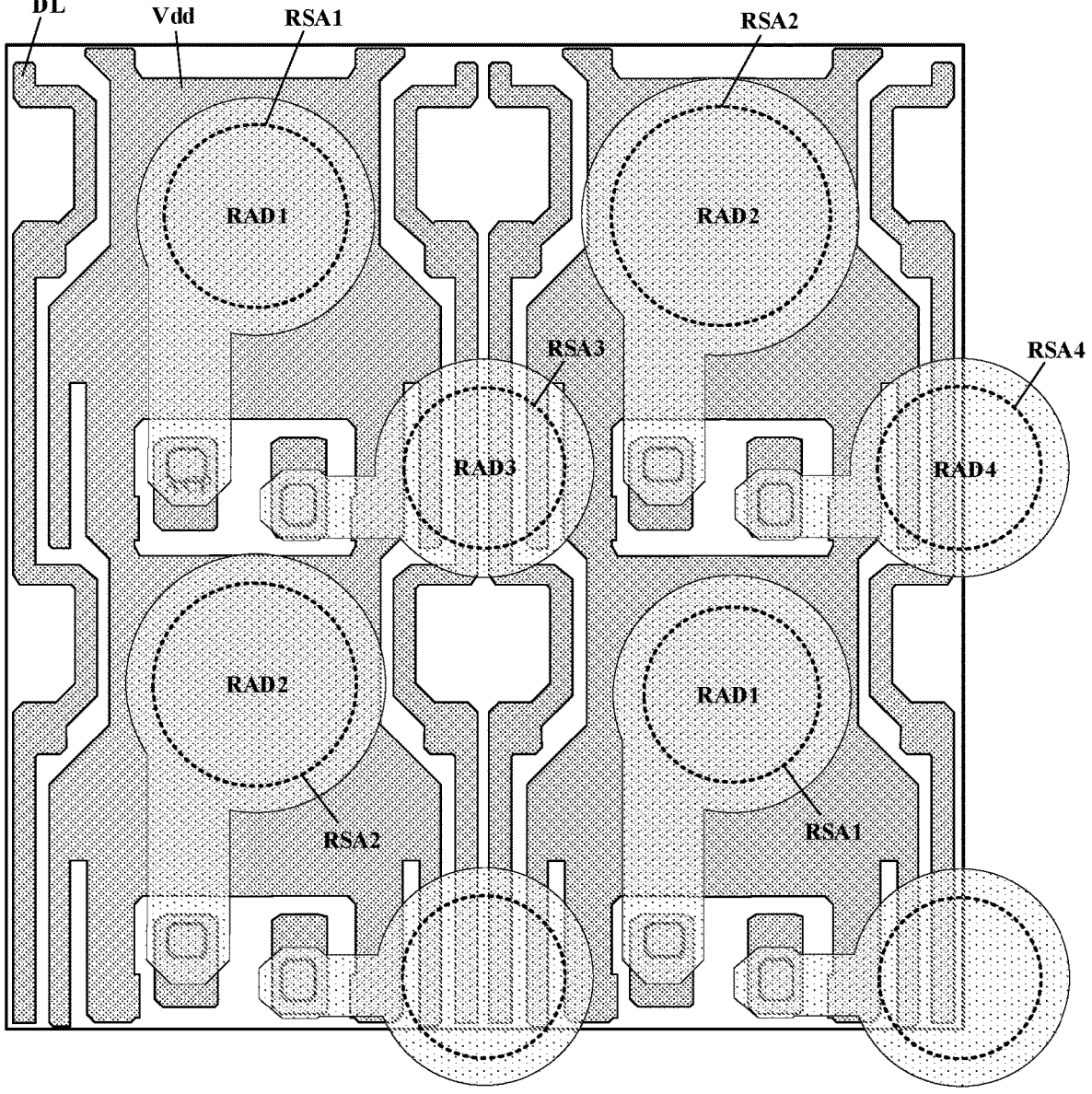
FIG. 9 is a diagram illustrating the structure of a second signal line layer and an anode layer in an array substrate depicted in FIG. 3A or FIG. 5A.

Accordingly, the present array substrate adopts an intricate structure of anodes and signal lines to achieve an even surface of the planarization layer underneath the anodes. As a result, color shift issue can be alleviated. FIG. 9 is a diagram illustrating the structure of a second signal line layer and an anode layer in an array substrate depicted in FIG. 3A or FIG. 5A. Referring to FIG. 9, in some embodiments, at least 50% (e.g., at least 55%, at least 60%, at least 65%, at least 70%, at least 75%, at least 80%, at least 85%, at least 90%, or at least 95%, at least 98%, at least 99%, at least 99.5%, or 100%) of an orthographic projection of all anodes on the base substrate overlaps with an orthographic projection of signal lines in the second signal line layer on the base substrate.

Optionally, at least 50% (e.g., at least 55%, at least 60%, at least 65%, at least 70%, at least 75%, at least 80%, at least 85%, at least 90%, or at least 95%, at least 98%, at least 99%, at least 99.5%, or 100%) of an orthographic projection of a respective anode on the base substrate overlaps with an orthographic projection of signal lines in the second signal line layer on the base substrate.

Optionally, at least 50% (e.g., at least 55%, at least 60%, at least 65%, at least 70%, at least 75%, at least 80%, at least 85%, at least 90%, or at least 95%, at least 98%, at least 99%, at least 99.5%, or 100%) of an orthographic projection of at least one anode on the base substrate overlaps with an orthographic projection of a respective voltage supply line of the plurality of voltage supply lines Vdd on the base substrate.

Optionally, referring to FIG. 9, an orthographic projection of at least one anode on the base substrate overlaps with an orthographic projection of a respective voltage supply line of the plurality of voltage supply lines Vdd on the base substrate and an orthographic projection of a respective data line of a plurality of data lines DL on the base substrate.

Optionally, at least 50% (e.g., at least 55%, at least 60%, at least 65%, at least 70%, at least 75%, at least 80%, at least 85%, at least 90%, or at least 95%, at least 98%, at least 99%, at least 99.5%, or 100%) of an orthographic projection of at least one anode on the base substrate overlaps with a combination of an orthographic projection of a respective voltage supply line of the plurality of voltage supply lines Vdd on the base substrate and an orthographic projection of a respective data line of a plurality of data lines DL on the base substrate.

Referring to FIG. 9, the anode layer in some embodiments includes a first respective anode RAD1, a second respective anode RAD2, a third respective anode RAD3, and a fourth respective anode RAD4. In one example, the first respective anode RAD1 is an anode for a subpixel of a first color (e.g., a red subpixel), the second respective anode RAD2 is an anode for a subpixel of a second color (e.g., a blue subpixel), and the third respective anode RAD3 and the fourth respective anode RAD4 are anodes for two subpixels of a third color (e.g., two green subpixels). In some embodiments, an array of the plurality of subpixels in the array substrate includes a R-G-B-G format repeating array, in which R stands for the red subpixel, B stands for the blue subpixel, and G stands for the green subpixel.

The pixel definition layer defines a plurality of subpixel apertures. In some embodiments, the plurality of subpixel apertures includes a first respective subpixel aperture RSA1 corresponding to the first respective anode RAD1, a second respective subpixel aperture RSA2 corresponding to the second respective anode RAD2, a third respective subpixel aperture RSA3 corresponding to the third respective anode RAD3, and a fourth respective subpixel aperture RSA2 corresponding to the fourth respective anode RAD2.

In some embodiments, an orthographic projection of the first respective anode RAD1 on the base substrate is completely covered by an orthographic projection of a respective voltage supply line of the plurality of voltage supply lines Vdd on the base substrate. Optionally, an orthographic projection of the first respective anode RAD1 on the base substrate is also completely covered by an orthographic projection of a respective voltage supply line of the plurality of voltage supply lines Vdd on the base substrate.

In some embodiments, an orthographic projection of the second respective anode RAD2 on the base substrate is partially (e.g., more than 90%) covered by an orthographic projection of a respective voltage supply line of the plurality of voltage supply lines Vdd on the base substrate. Optionally, an orthographic projection of the second respective anode RAD2 on the base substrate is completely covered by an orthographic projection of a respective voltage supply line of the plurality of voltage supply lines Vdd on the base substrate.

Optionally, an orthographic projection of the first respective subpixel aperture RSA1 on the base substrate is completely covered by an orthographic projection of a respective voltage supply line of the plurality of voltage supply lines Vdd on the base substrate. Optionally, an orthographic projection of an effective light emission area of the subpixel of the first color on the base substrate is completely covered by an orthographic projection of a respective voltage supply line of the plurality of voltage supply lines Vdd on the base substrate.

Optionally, an orthographic projection of the second respective subpixel aperture RSA2 on the base substrate is completely covered by an orthographic projection of a respective voltage supply line of the plurality of voltage supply lines Vdd on the base substrate. Optionally, an orthographic projection of an effective light emission area of the subpixel of the second color on the base substrate is completely covered by an orthographic projection of a respective voltage supply line of the plurality of voltage supply lines Vdd on the base substrate.

In some embodiments, an orthographic projection of the third respective anode RAD3 on the base substrate partially overlaps with orthographic projections of two adjacent data lines of the plurality of data lines DL on the base substrate, and partially overlaps with orthographic projections of two adjacent voltage supply lines of the plurality of voltage supply lines Vdd on the base substrate.

Optionally, an orthographic projection of the third respective subpixel aperture RSA3 on the base substrate partially overlaps with orthographic projections of two adjacent data lines of the plurality of data lines DL on the base substrate, and partially overlaps with orthographic projections of two adjacent voltage supply lines of the plurality of voltage supply lines Vdd on the base substrate.

Figure 10A:
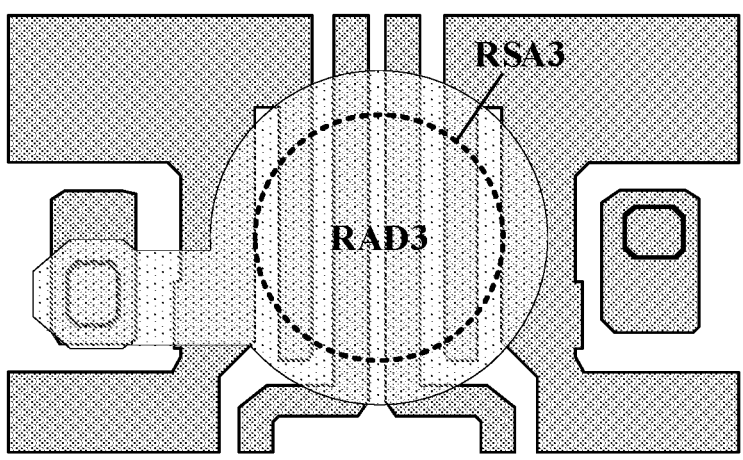
FIG. 10A is a diagram illustrating the structure of a third respective anode and a portion of a second signal line layer in an array substrate in some embodiments according to the present disclosure.
Figure 10B:
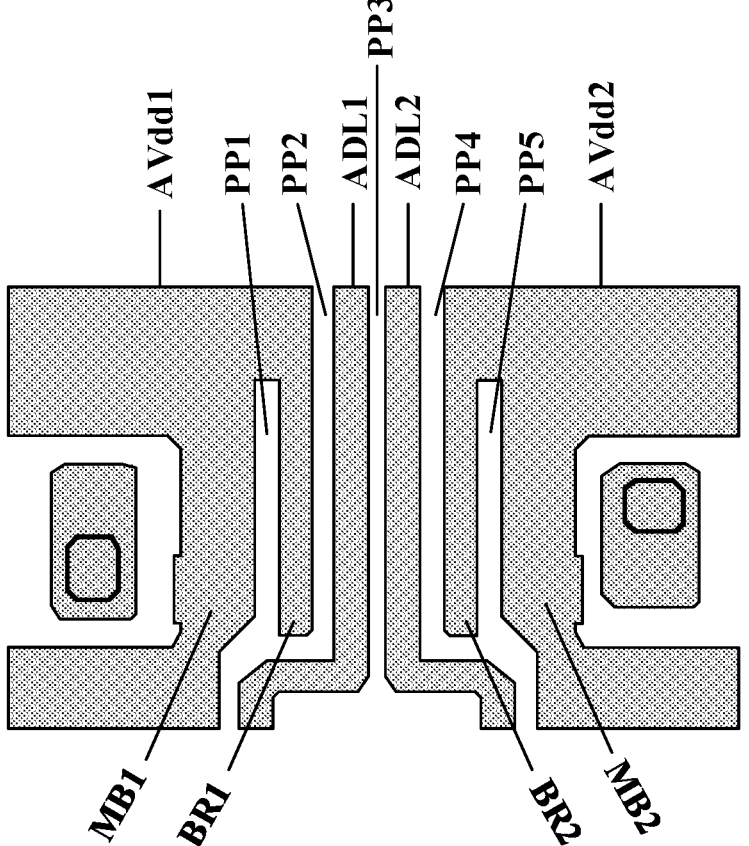
FIG. 10B is a diagram illustrating the structure of the portion of a second signal line layer in FIG. 10A.

FIG. 10A is a diagram illustrating the structure of a third respective anode and a portion of a second signal line layer in an array substrate in some embodiments according to the present disclosure. FIG. 10B is a diagram illustrating the structure of the portion of a second signal line layer in FIG. 10A. Referring to FIG. 10A and FIG. 10B, in some embodiments, an orthographic projection of the third respective anode RAD3 on a base substrate partially overlaps with orthographic projections of a first adjacent data line ADL1 and a second adjacent data line ADL2 of the plurality of data lines, and a first adjacent voltage supply line AVdd1 and a second adjacent voltage supply line AVdd2 of the plurality of voltage supply lines, on the base substrate. The first adjacent data line ADL1 and the second adjacent data line ADL2 are between the first adjacent voltage supply line AVdd1 and the second adjacent voltage supply line AVdd2.

In one example, the first adjacent data line ADL1 is configured to provide data signals to pixel driving circuits in the C(4k−2)-th column C(4k−2), the second adjacent data line ADL2 is configured to provide data signals to pixel driving circuits in the C(4k−1)-th column C(4k−1). In another example, the first adjacent voltage supply line AVdd1 is configured to provide a constant voltage (e.g., a high voltage) to pixel driving circuits in the C(4k−3)-th column C(4k−3) and in the C(4k−2)-th column C(4k−2), and the second adjacent voltage supply line AVdd2 is configured to provide a constant voltage (e.g., a high voltage) to pixel driving circuits in the C(4k−1)-th column C(4k−1) and in the C(4k)-th column C(4k).

In some embodiments, the first adjacent voltage supply line AVdd1 includes a first main body MB1 and a first branch BR1 extending away from the first main body MB1, the second adjacent voltage supply line AVdd2 includes a second main body MB2 and a second branch BR2 extending away from the second main body MB2. The first main body MB1, the first branch BR1, the first adjacent data line ADL1, the second adjacent data line ADL2, the second branch BR2, and the second main body MB2 are sequentially arranged along a second direction (see, e.g., DR2 in FIG. 5A).

In some embodiments, the array substrate includes multiple portions of the second planarization layer, including a first planarization portion PP1 spacing apart the first main body MB1 and the first branch BR1, a second planarization portion PP2 spacing apart the first branch BR1 and the first adjacent data line ADL1, a third planarization portion PP3 spacing apart the first adjacent data line ADL1 and the second adjacent data line ADL2, a fourth planarization portion PP4 spacing apart the second adjacent data line ADL2 and the second branch BR2, and a fifth planarization portion PP5 spacing apart the second branch BR2 and the second main body MB2. The first main body MB1, the first planarization portion PP1, the first branch BR1, the second planarization portion PP2, the first adjacent data line ADL1, the third planarization portion PP3, the second adjacent data line ADL2, the fourth planarization portion PP4, the second branch BR2, the fifth planarization portion PP5, and the second main body MB2 are sequentially arranged along a second direction (see, e.g., DR2 in FIG. 5A).

In some embodiments, an orthographic projection of the third respective anode RAD3 on a base substrate partially overlaps with orthographic projections of the first main body MB1, the first planarization portion PP1, the first branch BR1, the second planarization portion PP2, the first adjacent data line ADL1, the third planarization portion PP3, the second adjacent data line ADL2, the fourth planarization portion PP4, the second branch BR2, the fifth planarization portion PP5, and the second main body MB2, on the base substrate. The intricate structure achieves a highly even surface of the planarization layer underneath the third respective anode RAD3.

In some embodiments, a combination of the first main body MB1, the first planarization portion PP1, the first branch BR1, the second planarization portion PP2, the first adjacent data line ADL1, the third planarization portion PP3, the second adjacent data line ADL2, the fourth planarization portion PP4, the second branch BR2, the fifth planarization portion PP5, and the second main body MB2, have a substantially mirror symmetry with respect to each other, e.g., about a plane perpendicular to a main surface of the array substrate and substantially parallel to the first direction (e.g., DR1 in FIG. 5A).

In some embodiments, portions of orthographic projections of the first main body MB1, the first branch BR1, the first adjacent data line ADL1, the second adjacent data line ADL2, the second branch BR2, and the second main body MB2, on the base substrate that overlap with the orthographic projection of the third respective anode RAD3 on the base substrate are substantially equispaced.

In some embodiments, an orthographic projection of the fourth respective anode RAD4 on the base substrate partially overlaps with orthographic projections of two adjacent data lines of the plurality of data lines DL on the base substrate, and partially overlaps with orthographic projections of two adjacent voltage supply lines of the plurality of voltage supply lines Vdd on the base substrate.

Optionally, an orthographic projection of the fourth respective subpixel aperture RSA4 on the base substrate partially overlaps with orthographic projections of two adjacent data lines of the plurality of data lines DL on the base substrate, and partially overlaps with orthographic projections of two adjacent voltage supply lines of the plurality of voltage supply lines Vdd on the base substrate.

Figure 11A:
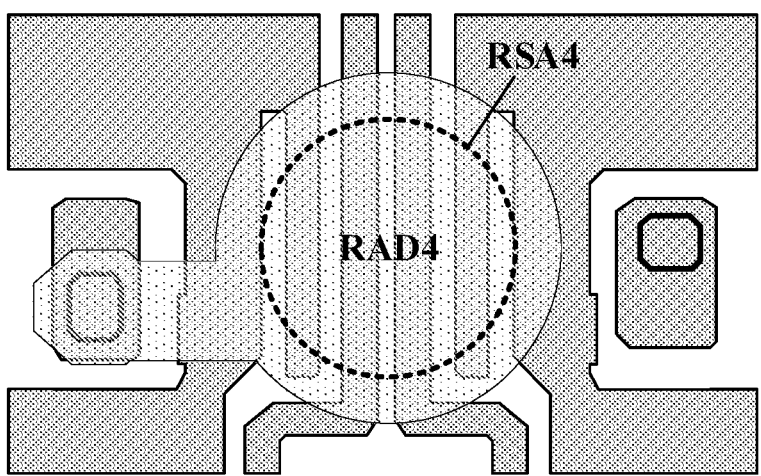
FIG. 11A is a diagram illustrating the structure of a fourth respective anode and a portion of a second signal line layer in an array substrate in some embodiments according to the present disclosure.
Figure 11B:
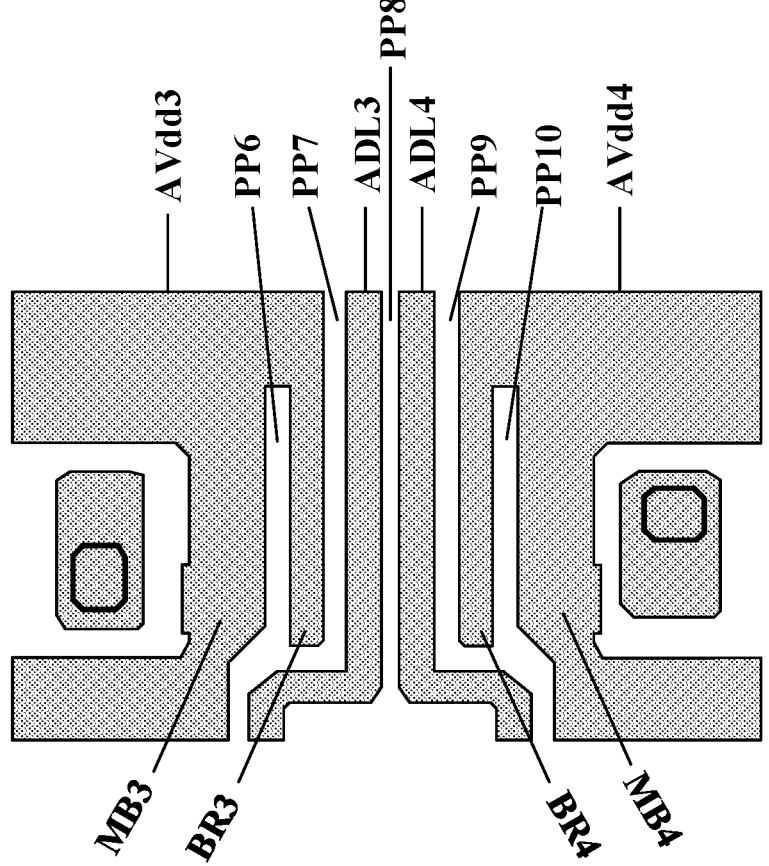
FIG. 11B is a diagram illustrating the structure of the portion of a second signal line layer in FIG. 11A.

FIG. 11A is a diagram illustrating the structure of a fourth respective anode and a portion of a second signal line layer in an array substrate in some embodiments according to the present disclosure. FIG. 11B is a diagram illustrating the structure of the portion of a second signal line layer in FIG. 11A. Referring to FIG. 11A and FIG. 11B, in some embodiments, an orthographic projection of the fourth respective anode RAD4 on a base substrate partially overlaps with orthographic projections of a third adjacent data line ADL3 and a fourth adjacent data line ADL4 of the plurality of data lines, and a third adjacent voltage supply line AVdd3 and a fourth adjacent voltage supply line AVdd4 of the plurality of voltage supply lines, on the base substrate. The third adjacent data line ADL3 and the fourth adjacent data line ADL4 are between the third adjacent voltage supply line AVdd3 and the fourth adjacent voltage supply line AVdd4.

In one example, the third adjacent data line ADL3 is configured to provide data signals to pixel driving circuits in the C(4k)-th column C(4k), the fourth adjacent data line ADL2 is configured to provide data signals to pixel driving circuits in the C(4k+1)-th column. In another example, the third adjacent voltage supply line AVdd3 is configured to provide a constant voltage (e.g., a high voltage) to pixel driving circuits in the C(4k−1)-th column C(4k−1) and in the C(4k)-th column C(4k), and the fourth adjacent voltage supply line AVdd4 is configured to provide a constant voltage (e.g., a high voltage) to pixel driving circuits in the C(4k+1)-th column and in the C(4k+2)-th column.

In some embodiments, the third adjacent voltage supply line AVdd3 includes a third main body MB3 and a third branch BR3 extending away from the third main body MB3, the fourth adjacent voltage supply line AVdd4 includes a fourth main body MB4 and a fourth branch BR4 extending away from the fourth main body MB4. The third main body MB3, the third branch BR3, the third adjacent data line ADL3, the fourth adjacent data line ADL4, the fourth branch BR4, and the fourth main body MB4 are sequentially arranged along a second direction (see, e.g., DR2 in FIG. 5A).

In some embodiments, the array substrate includes multiple portions of the second planarization layer, including a sixth planarization portion PP6 spacing apart the third main body MB3 and the third branch BR3, a seventh planarization portion PP7 spacing apart the third branch BR3 and the third adjacent data line ADL3, an eighth planarization portion PP8 spacing apart the third adjacent data line ADL3 and the fourth adjacent data line ADL4, a ninth planarization portion PP9 spacing apart the fourth adjacent data line ADL4 and the fourth branch BR4, and a tenth planarization portion PP10 spacing apart the fourth branch BR4 and the fourth main body MB4. The third main body MB3, the sixth planarization portion PP6, the third branch BR3, the seventh planarization portion PP7, the third adjacent data line ADL3, the eighth planarization portion PP8, the fourth adjacent data line ADL4, the ninth planarization portion PP9, the fourth branch BR4, the tenth planarization portion PP10, and the fourth main body MB4 are sequentially arranged along a second direction (see, e.g., DR2 in FIG. 5A).

In some embodiments, an orthographic projection of the fourth respective anode RAD4 on a base substrate partially overlaps with orthographic projections of the third main body MB3, the sixth planarization portion PP6, the third branch BR3, the seventh planarization portion PP7, the third adjacent data line ADL3, the eighth planarization portion PP8, the fourth adjacent data line ADL4, the ninth planarization portion PP9, the fourth branch BR4, the tenth planarization portion PP10, and the fourth main body MB4, on the base substrate. The intricate structure achieves a highly even surface of the planarization layer underneath the fourth respective anode RAD4.

In some embodiments, a combination of the third main body MB3, the sixth planarization portion PP6, the third branch BR3, the seventh planarization portion PP7, the third adjacent data line ADL3, the eighth planarization portion PP8, the fourth adjacent data line ADL4, the ninth planarization portion PP9, the fourth branch BR4, the tenth planarization portion PP10, and the fourth main body MB4, have a substantially mirror symmetry with respect to each other, e.g., about a plane perpendicular to a main surface of the array substrate and substantially parallel to the first direction (e.g., DR1 in FIG. 5A).

In some embodiments, portions of orthographic projections of the third main body MB3, the third branch BR3, the third adjacent data line ADL3, the fourth adjacent data line ADL4, the fourth branch BR4, and the fourth main body MB4, on the base substrate that overlap with the orthographic projection of the fourth respective anode RAD4 on the base substrate are substantially equispaced.

Referring to FIG. 3A to FIG. 3M, and FIG. 5A to FIG. 5M, in some embodiments, an orthographic projection of the plurality of light transmissive apertures LTA on a base substrate is substantially non-overlapping with orthographic projections of semiconductor material layers and conductive layers of the array substrate. As used herein, the term "substantially non-overlapping" refers to two orthographic projections being at least 50 percent (e.g., at least 60 percent, at least 70 percent, at least 80 percent, at least 90 percent, at least 95 percent, at least 99 percent, and 100 percent) non-overlapping. Optionally, the orthographic projection of the plurality of light transmissive apertures LTA on the base substrate is substantially non-overlapping with orthographic projections of the semiconductor material layer SML, the first conductive layer CT1, the second conductive layer CT2, the first signal line layer SL1, the second signal line layer SL2, and the anode layer AD.

Figure 12:
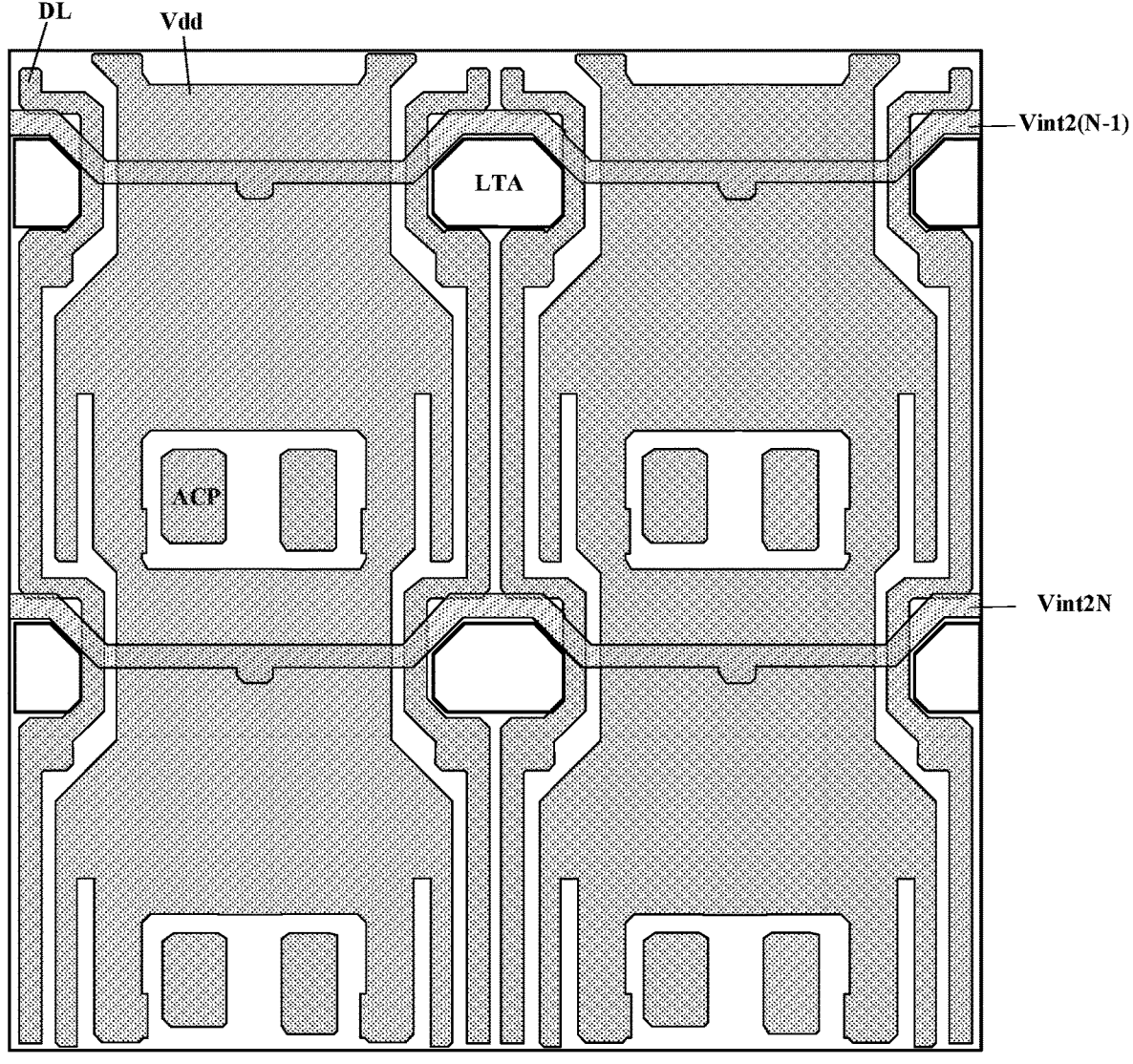
FIG. 12 is a diagram illustrating a signal line layout surrounding a plurality of light transmissive apertures in an array substrate in some embodiments according to the present disclosure.

FIG. 12 is a diagram illustrating a signal line layout surrounding a plurality of light transmissive apertures in an array substrate in some embodiments according to the present disclosure. Referring to FIG. 12, a respective light transmissive aperture of the plurality of light transmissive apertures LTA is in a region surrounded by two adjacent data lines of the plurality of data lines DL, and a respective second reset signal line (e.g., Vint2(N−1)) of the plurality of second reset signal lines. Extension directions of the signal lines surrounding the respective light transmissive aperture conform to the shape of the respective light transmissive aperture. At least portions of orthographic projections of the two adjacent data lines on the base substrate and at least portions of orthographic projections of the respective second reset signal line on the base substrate are along an edge of an orthographic projection of the respective light transmissive aperture on the base substrate.

Figure 13:
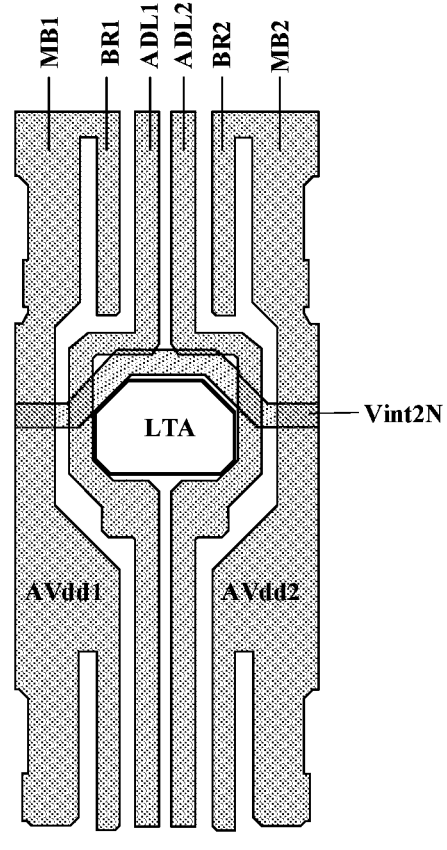
FIG. 13 is a zoom-in view of a region surrounding a respective light transmissive aperture in FIG. 12.

FIG. 13 is a zoom-in view of a region surrounding a respective light transmissive aperture in FIG. 12. Referring to FIG. 12 and FIG. 13, in a region surrounding the respective light transmissive aperture, the array substrate includes, sequentially arranged, a first main body MB1 of a first adjacent voltage supply line AVdd1, a first adjacent data line ADL1, a second adjacent data line ADL2, a second main body MB2 of a second adjacent voltage supply line AVdd2. A respective second reset signal line (e.g., Vint2N) crosses over the first main body MB1, the first adjacent data line ADL1, the second adjacent data line ADL2, and the second main body MB2. The respective light transmissive aperture is in a region surrounded by the respective second reset signal line, the first adjacent data line ADL1, and the second adjacent data line ADL2. An orthographic projection of the respective second reset signal line on the base substrate partially overlaps with each of orthographic projections of the first main body MB1, the first adjacent data line ADL1, the second adjacent data line ADL2, and the second main body MB2 on the base substrate.

Figure 14:
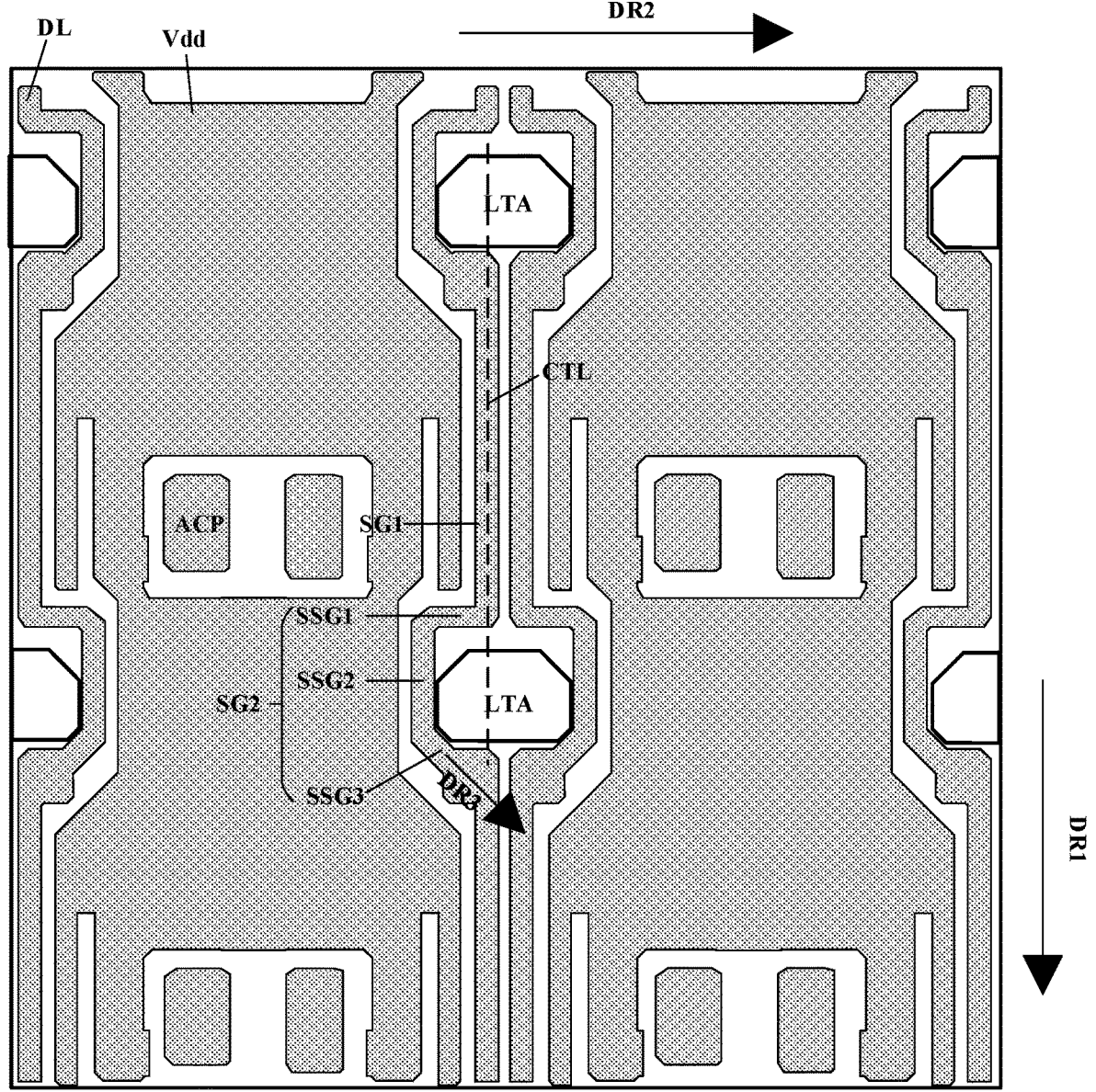
FIG. 14 is a diagram illustrating a signal line layout surrounding a plurality of light transmissive apertures in an array substrate in some embodiments according to the present disclosure.

FIG. 14 is a diagram illustrating a signal line layout surrounding a plurality of light transmissive apertures in an array substrate in some embodiments according to the present disclosure. Referring to FIG. 14, at least one of the plurality of signal lines (e.g., a respective data line of a plurality of data lines DL) includes a first segment SG1 extending along a first direction DR1, and a second segment SG2. An orthographic projection of a central line (the dotted line denoted as "CTL" in FIG. 14) of the first segment SG1 extending along the first direction DR1 on the base substrate intersects with an orthographic projection of at least one light transmissive aperture of the plurality of light transmissive apertures LTA on the base substrate. The second segment SG2 is displaced along a second direction DR2 relative to the first segment SG1, the second direction DR2 intersecting the first direction DR1.

In some embodiments, the first segment SG1 and the second segment SG2 are parts of a respective data line of a plurality of data lines DL.

In some embodiments, an orthographic projection of the second segment SG2 on the base substrate is spaced apart from orthographic projections of the plurality of light transmissive apertures LTA on the base substrate.

In some embodiments, the second segment SG2 includes a first sub-segment SSG1 extending along the second direction DR2, a second sub-segment SSG2 extending along the first direction DR1, and a third sub-segment SSG3 extending along a third direction DR3. The third direction DR3 intersects the first direction DR1 and the second direction DR2. The first segment SG1, the first sub-segment SSG1, the second sub-segment SSG2, the third sub-segment SSG3 are sequentially arranged in the at least one of the plurality of signal lines. In one particular example, the first sub-segment SSG1 connects the first segment SG1 to the second sub-segment SSG2. In another example, the second sub-segment SSG2 connects first sub-segment SSG1 to the third sub-segment SSG3.

Figure 15:
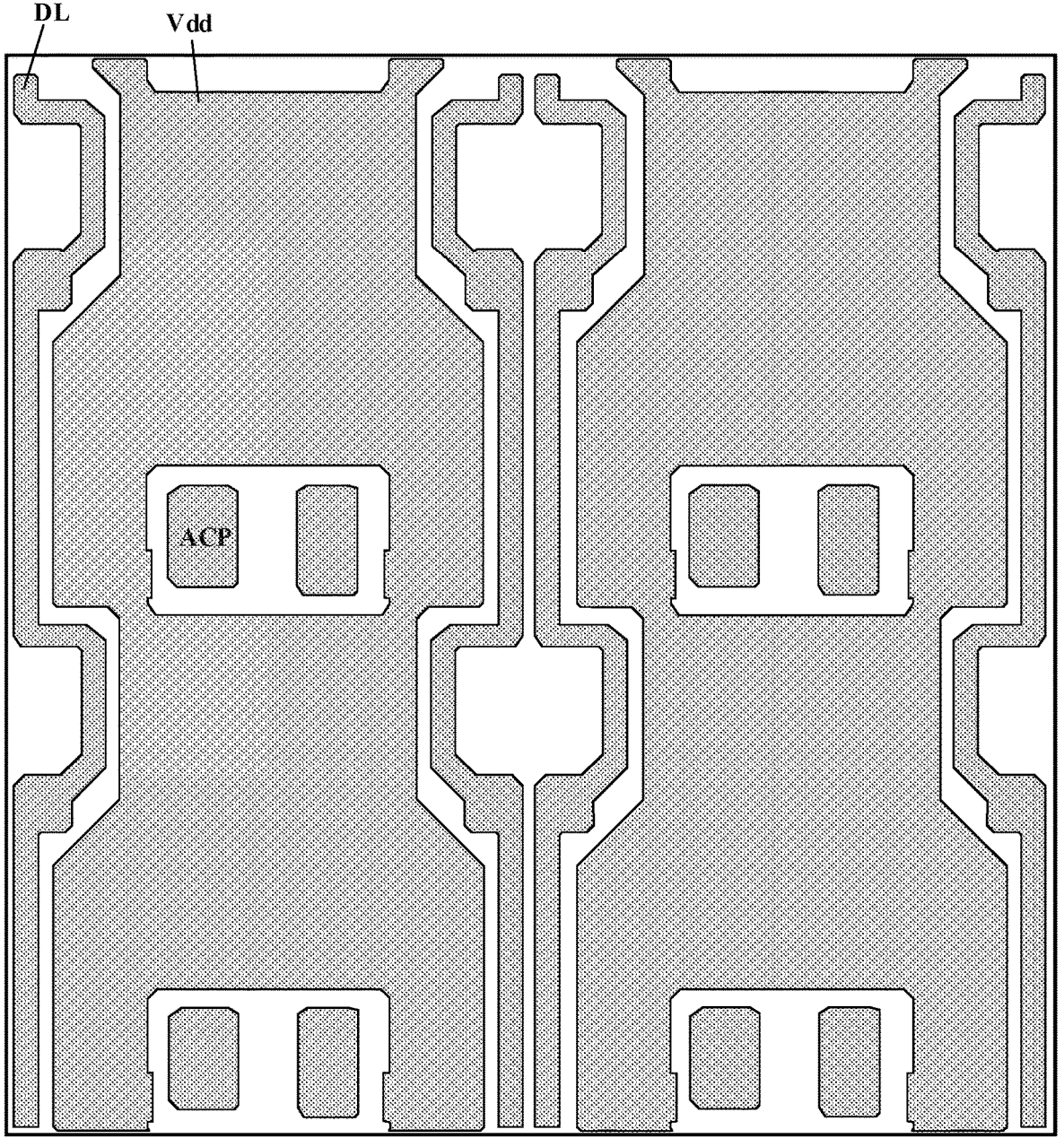
FIG. 15 is a diagram illustrating the structure of a second signal line layer in an array substrate in some embodiments according to the present disclosure.

FIG. 15 is a diagram illustrating the structure of a second signal line layer in an array substrate in some embodiments according to the present disclosure. Referring to FIG. 15, in some embodiments, the respective voltage supply line of the plurality of voltage supply lines Vdd does not include branches (e.g., BR1 or BR2 in FIG. 10B) spaced apart from the main body (e.g., MB1 or MB2 in FIG. 10B) of the respective voltage supply line by the planarization portions (e.g., PP1 or PP5 in FIG. 10B).

Figure 16:
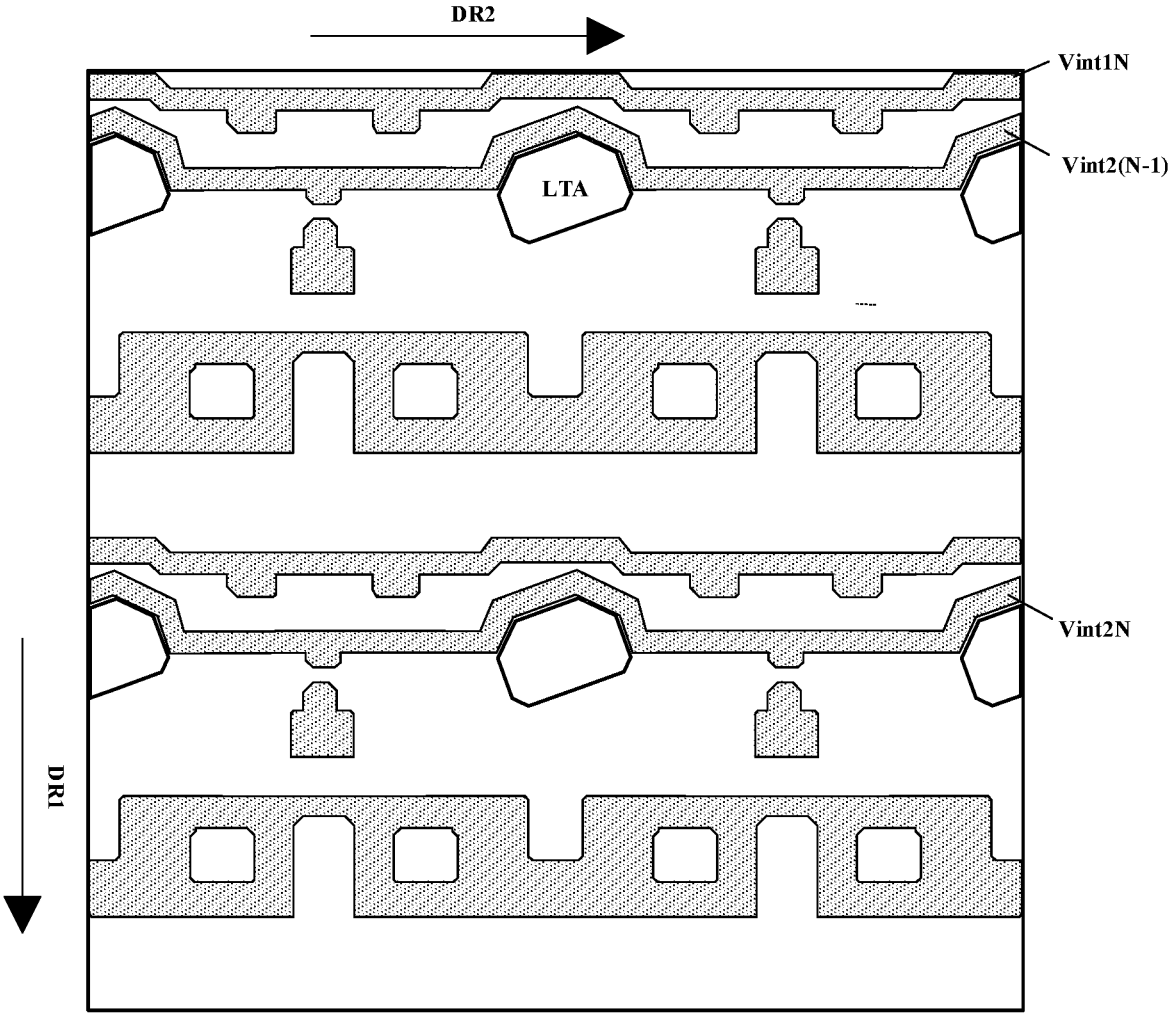
FIG. 16 is a diagram illustrating a signal line layout surrounding a plurality of light transmissive apertures in an array substrate in some embodiments according to the present disclosure.

FIG. 16 is a diagram illustrating a signal line layout surrounding a plurality of light transmissive apertures in an array substrate in some embodiments according to the present disclosure. Referring to FIG. 16, in some embodiments, the plurality of light transmissive apertures LTA do not have a substantially mirror symmetry with respect to each other, e.g., about a plane perpendicular to a main surface of the array substrate and substantially parallel to extension directions of the plurality of data lines DL. Optionally, a respective light transmissive aperture of the plurality of light transmissive apertures LTA has a mirror symmetry about a plane perpendicular to a main surface of the array substrate and non-parallel to extension directions of the plurality of data lines DL. The respective light transmissive aperture is rotated relative to the plane perpendicular to a main surface of the array substrate and substantially parallel to extension directions of the plurality of data lines DL.

As shown in FIG. 16, in some embodiments, at least a portion of an orthographic projection of a respective second reset signal line of the plurality of second reset signal lines (e.g., Vint2N, Vint2(N−1)) on the base substrate is along an edge of an orthographic projection of the respective light transmissive aperture on the base substrate.

Figure 17:
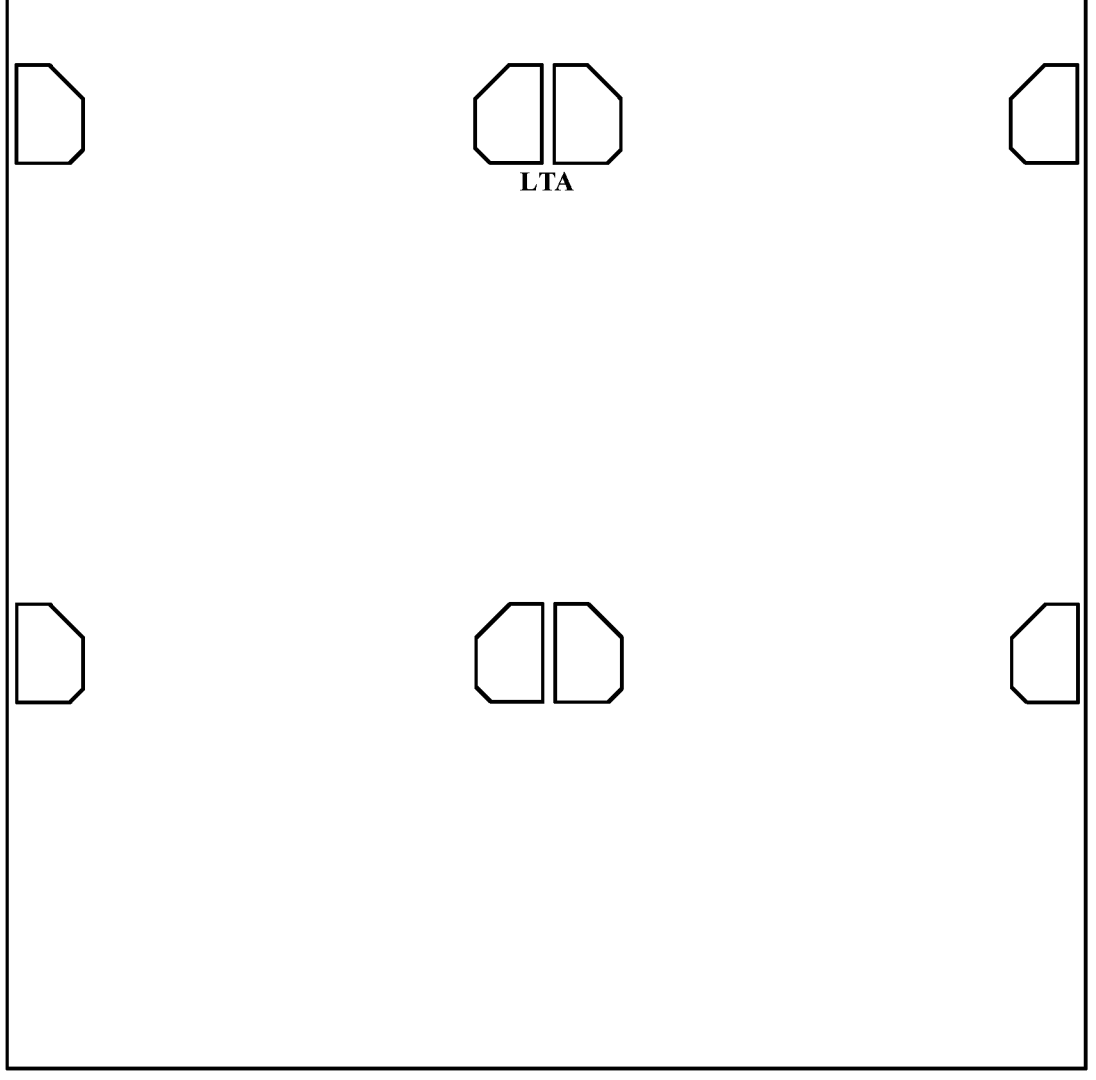
FIG. 17 is a diagram illustrating the structure of a plurality of light transmissive apertures in an array substrate in some embodiments according to the present disclosure.

FIG. 17 is a diagram illustrating the structure of a plurality of light transmissive apertures in an array substrate in some embodiments according to the present disclosure. Referring to FIG. 17, in some embodiments, a respective light transmissive aperture of the plurality of plurality of light transmissive apertures LTA includes multiple sub-apertures spaced apart from each other. The multiple sub-apertures of the respective light transmissive aperture are in a same region surrounded by two adjacent data lines of the plurality of data lines DL, and a respective second reset signal line (e.g., Vint2(N−1)) of the plurality of second reset signal lines.

Figure 18:
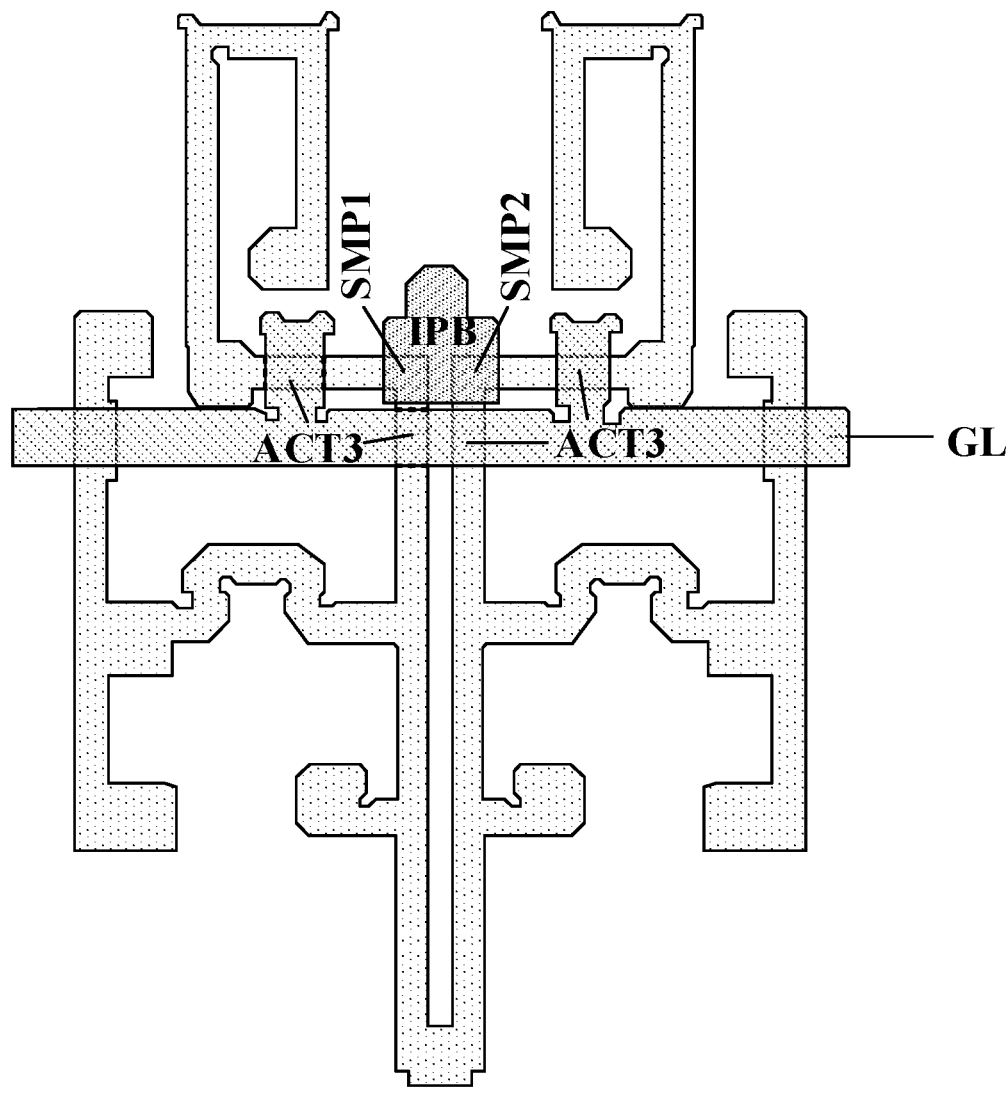
FIG. 18 is a diagram illustrating the structure surrounding an interference preventing block in an array substrate in some embodiments according to the present disclosure.

FIG. 18 is a diagram illustrating the structure surrounding an interference preventing block in an array substrate in some embodiments according to the present disclosure. Referring to FIG. 18, in some embodiments, the orthographic projection of the interference preventing block IPB on the base substrate BS at least partially overlaps with orthographic projections of two semiconductor material portions of the semiconductor material layer, the two semiconductor material portions comprising a first semiconductor material portion SMP1 and a second semiconductor material portion SMP2. An orthographic projection of the first semiconductor material portion SMP1 on the base substrate is between orthographic projections of double gates of a compensating transistor (e.g., the third transistor T3) in a first adjacent pixel driving circuit on the base substrate. The first semiconductor material portion SMP1 connects two channel parts of the compensating transistor in the first adjacent pixel driving circuit. An orthographic projection of the second semiconductor material portion SMP2 on the base substrate is between orthographic projections of double gates of a compensating transistor (e.g., the third transistor T3) in a second adjacent pixel driving circuit on the base substrate. The second semiconductor material portion SMP2 connects two channel parts of the compensating transistor in the second adjacent pixel driving circuit. The first adjacent pixel driving circuit and the second adjacent pixel driving circuit are configured to drive light emission of a first adjacent subpixel and a second adjacent subpixel.

As discussed above, a respective voltage supply line of the plurality of voltage supply lines Vdd is connected to the interference preventing block IPB through the first voltage signal connecting pad VCP1.

Figure 19A:
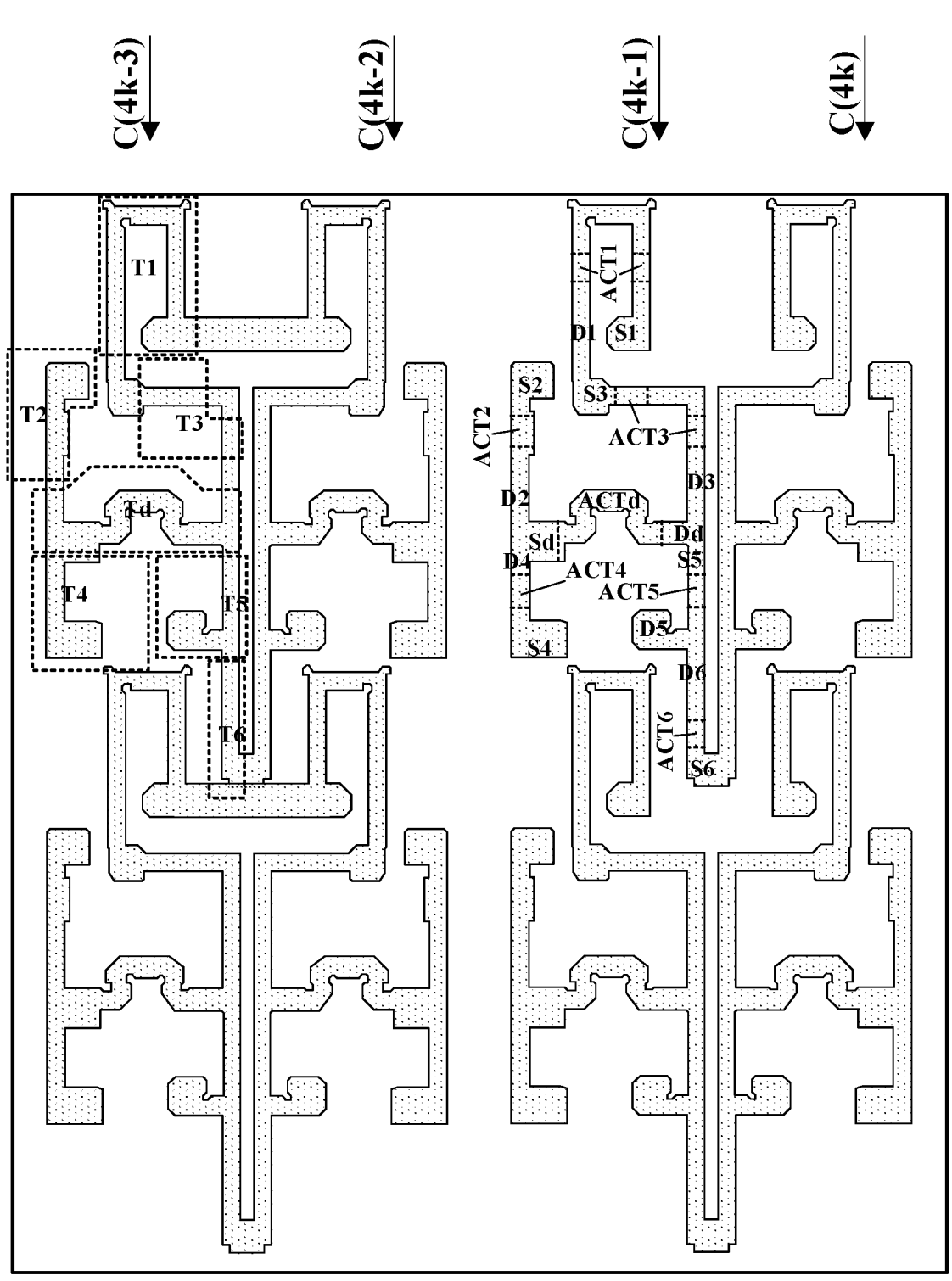
FIG. 19A is a diagram illustrating the structure of a semiconductor material layer in an array substrate in some embodiments according to the present disclosure.
Figure 19B:
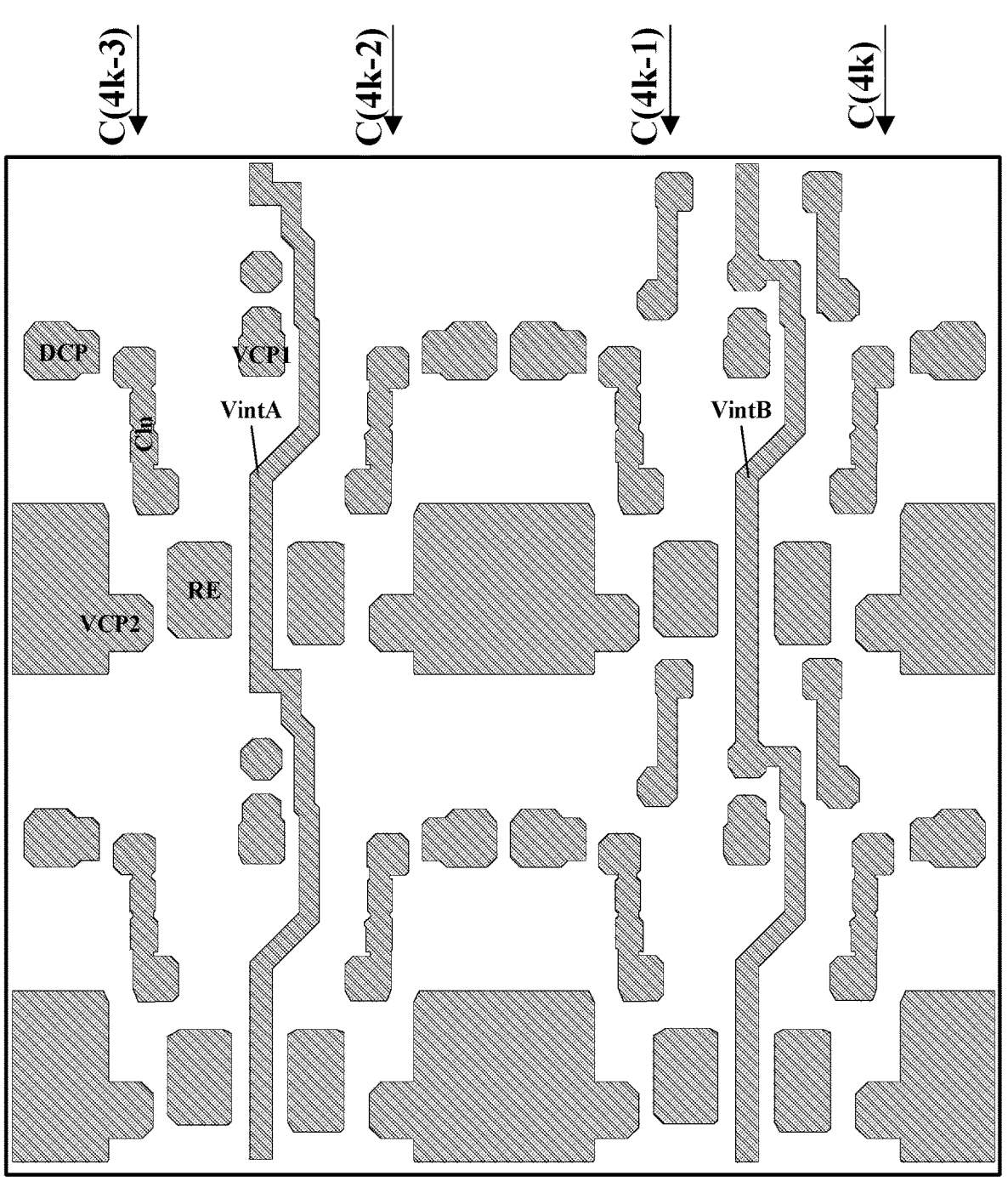
FIG. 19B is a diagram illustrating the structure of a first signal line layer in an array substrate in some embodiments according to the present disclosure.
Figure 19C:
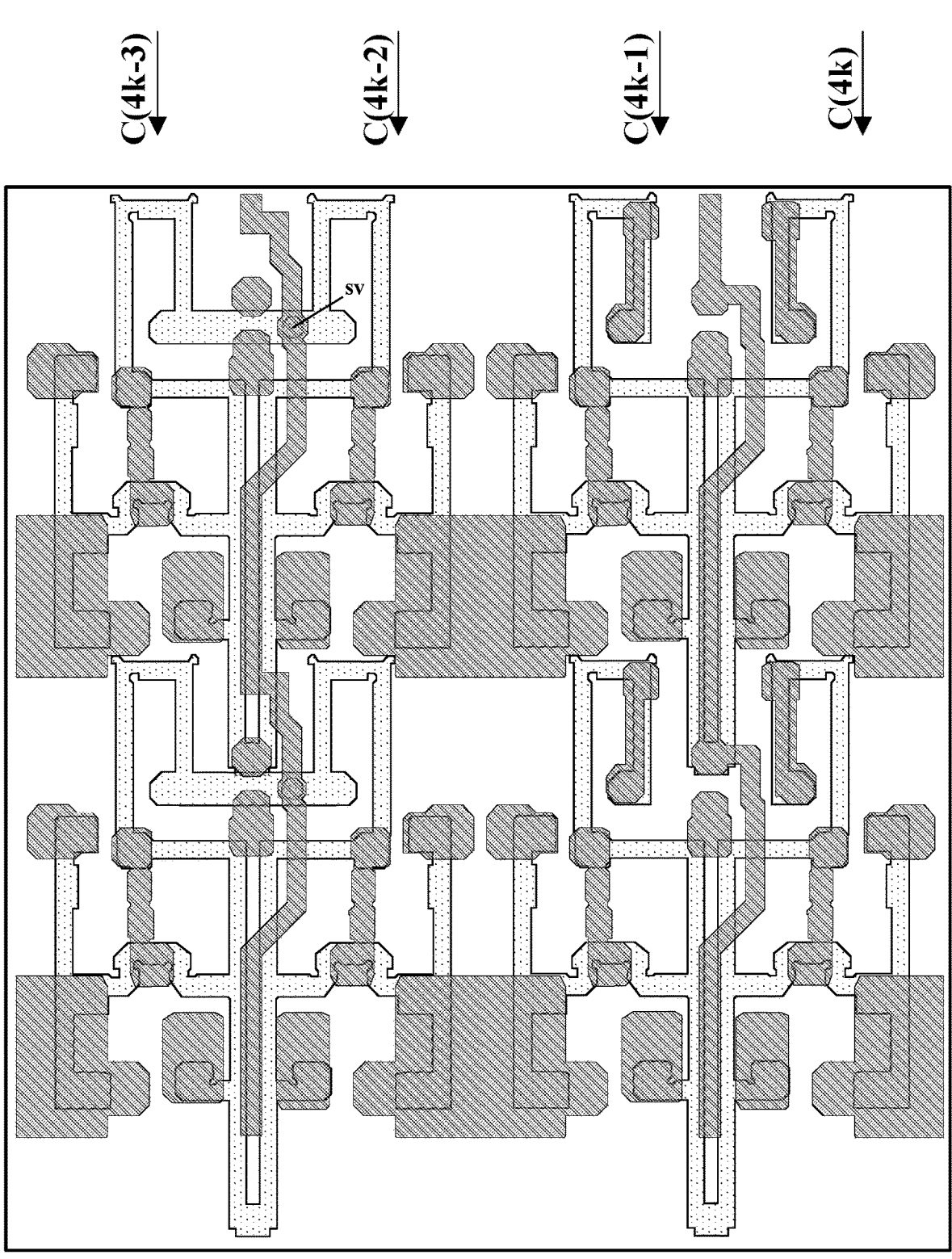
FIG. 19C is a diagram illustrating the structure of a semiconductor material layer and a first signal line layer in an array substrate in some embodiments according to the present disclosure.

FIG. 19A is a diagram illustrating the structure of a semiconductor material layer in an array substrate in some embodiments according to the present disclosure. Referring to FIG. 19A, in some embodiments, source electrodes of first transistors from (4k−3)-th columns C(4k−3) and (4k−2)-th columns C(4k−2) are parts of an integral structure, and are directly connected to each other. FIG. 19B is a diagram illustrating the structure of a first signal line layer in an array substrate in some embodiments according to the present disclosure. FIG. 19C is a diagram illustrating the structure of a semiconductor material layer and a first signal line layer in an array substrate in some embodiments according to the present disclosure. Referring to FIG. 19A to FIG. 19C, in some embodiments, the source electrodes of first transistors from (4k–3)-th columns C(4k–3) and (4k–2)-th columns C(4k–2) are connected to a respective third reset signal line VintA. Optionally, the respective third reset signal line VintA extends through a single via sv to connect to a portion of the semiconductor material layer that connects the source electrodes of first transistors from (4k–3)-th columns C(4k–3) and (4k–2)-th columns C(4k–2) together.

Figure 20:
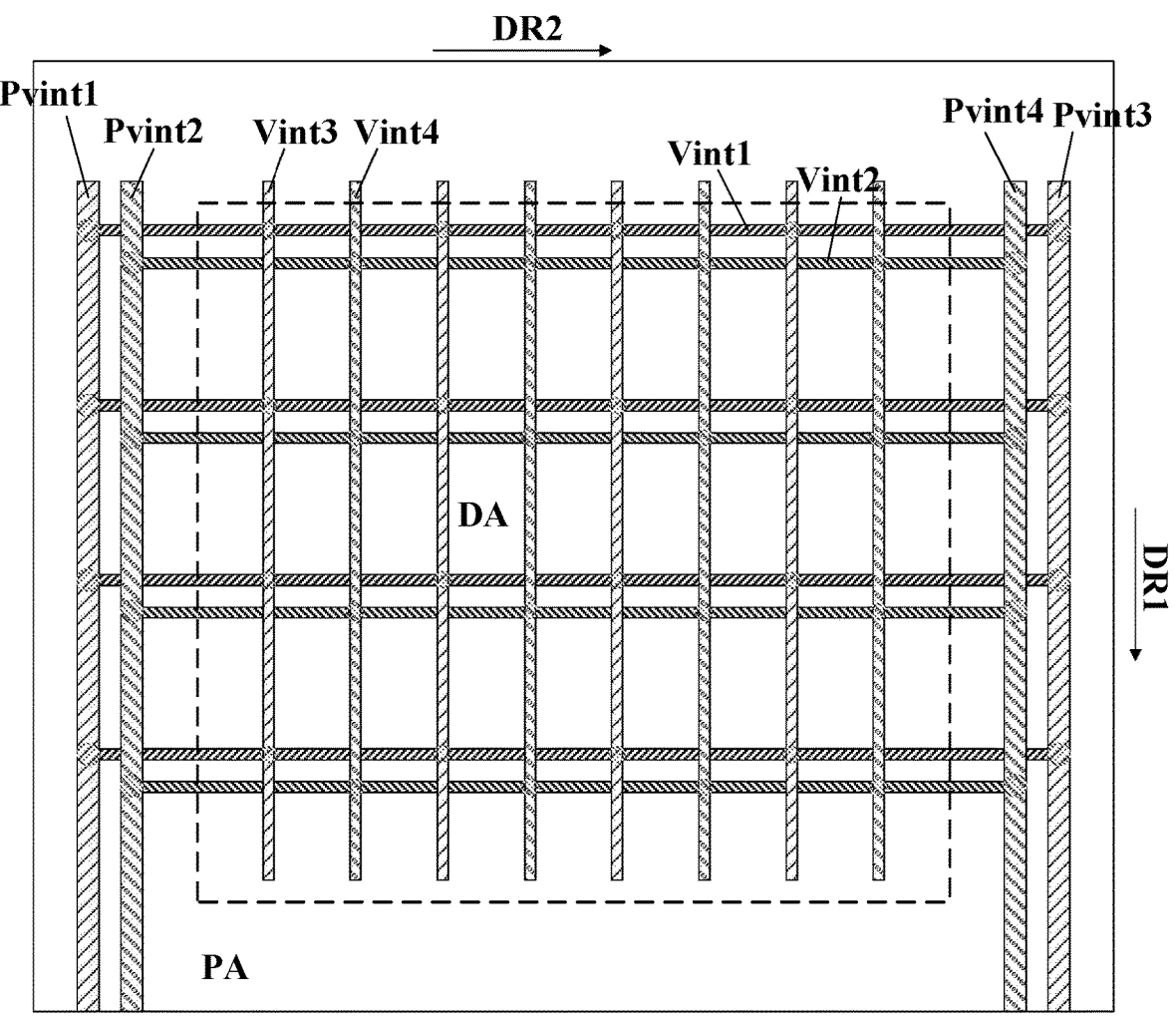
FIG. 20 is a schematic diagram illustrating layout of reset signal lines in an array substrate in some embodiments according to the present disclosure.

FIG. 20 is a schematic diagram illustrating layout of reset signal lines in an array substrate in some embodiments according to the present disclosure. Referring to FIG. 20, the array substrate includes a reset signal supply network. The reset signal supply network includes a first interconnected reset signal supply network and a second interconnected reset signal supply network. The array substrate includes a display area DA and a peripheral area PA. In the display area DA, the first interconnected reset signal supply network includes a plurality of first reset signal lines Vint1 respectively extending along the second direction DR2 and a plurality of third reset signal lines VintA respectively extending along the first direction DR1; the second interconnected reset signal supply network includes a plurality of second reset signal lines Vint2 respectively extending along the second direction DR2 and a plurality of fourth reset signal lines Vint4 respectively extending along the first direction DR1. In the peripheral area PA, the array substrate further includes a first peripheral reset signal supply line Pvint1 and a second peripheral reset signal supply line Pvint2. Optionally, the first peripheral reset signal supply line Pvint1 and the second peripheral reset signal supply line Pvint2 extend along the first direction DR1, respectively. The first peripheral reset signal supply line Pvint1 is connected to the plurality of first reset signal lines Vint1; and the second peripheral reset signal supply line Pvint2 is connected to the plurality of second reset signal lines Vint2. Optionally, in the peripheral area PA, the array substrate further includes a third peripheral reset signal supply line Pvint3 and a fourth peripheral reset signal supply line Pvint4. The third peripheral reset signal supply line Pvint3 is connected to the plurality of first reset signal lines Vint1; and the fourth peripheral reset signal supply line Pvint4 is connected to the plurality of second reset signal lines Vint2.

In another aspect, the present invention provides a display apparatus, including the array substrate described herein or fabricated by a method described herein, and one or more integrated circuits connected to the array substrate. Examples of appropriate display apparatuses include, but are not limited to, an electronic paper, a mobile phone, a tablet computer, a television, a monitor, a notebook computer, a digital album, a GPS, etc. Optionally, the display apparatus is an organic light emitting diode display apparatus. Optionally, the display apparatus is a micro light emitting diode display apparatus. Optionally, the display apparatus is a mini light emitting diode display apparatus.

In another aspect, the present disclosure provides a method of fabricating an array substrate. In some embodiments, the method includes forming a second signal line layer on a base substrate; forming an anode layer on a side of the second signal line layer away from the base substrate; forming a pixel definition layer on a side of the anode layer away from the second signal line layer; and forming a plurality of light transmissive apertures extending through the pixel definition layer, the plurality of light transmissive apertures spaced apart from each other. Optionally, forming the second signal line layer comprises forming a plurality of signal lines. Optionally, forming at least one of the plurality of signal lines comprises forming a first segment extending along a first direction, and forming a second segment. Optionally, an orthographic projection of a central line of the first segment extending along the first direction on the base substrate intersects with an orthographic projection of at least one light transmissive aperture of the plurality of light transmissive apertures on the base substrate. Optionally, the second segment is displaced along a second direction relative to the first segment, the second direction intersecting the first direction.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, comprising:

a second signal line layer on a base substrate;

an anode layer on a side of the second signal line layer away from the base substrate;

a pixel definition layer on a side of the anode layer away from the second signal line layer; and a plurality of light transmissive apertures extending through the pixel definition layer, the plurality of light transmissive apertures spaced apart from each other;

wherein the second signal line layer comprises a plurality of signal lines;

at least one of the plurality of signal lines comprises a first segment extending along a first direction, and a second segment;

an orthographic projection of a central line of the first segment extending along the first direction on the base substrate intersects with an orthographic projection of at least one light transmissive aperture of the plurality of light transmissive apertures on the base substrate; and the second segment is displaced along a second direction relative to the first segment, the second direction intersecting the first direction;

wherein the anode layer comprises a plurality of anodes respectively in a plurality of subpixels;

the second signal line layer comprises a plurality of voltage supply lines and a plurality of data lines configured to provide signals to the plurality of subpixels; and an orthographic projection of the plurality of anodes on a base substrate at least partially overlaps with an orthographic projection of the plurality of voltage supply lines or the plurality of data lines on the base substrate;

wherein the plurality of anodes comprise a third respective anode of a subpixel of a third color;

the second signal line layer comprises a plurality of voltage supply lines and a plurality of data lines; and an orthographic projection of the third respective anode on the base substrate partially overlaps with orthographic projections of two adjacent data lines of the plurality of data lines on the base substrate, and partially overlaps with orthographic projections of two adjacent voltage supply lines of the plurality of voltage supply lines on the base substrate.

2. The array substrate of claim 1, wherein the first segment and the second segment are parts of a respective data line of a plurality of data lines; and an orthographic projection of the second segment on the base substrate is spaced apart from orthographic projections of the plurality of light transmissive apertures on the base substrate.

3. The array substrate of claim 1, wherein the second segment comprises a first sub-segment extending along the second direction, a second sub-segment extending along first direction, and a third sub-segment extending along a third direction;

the third direction intersecting the first direction and the second direction; and the first segment, the first sub-segment, the second sub-segment, the third sub-segment are sequentially arranged in the at least one of the plurality of signal lines.

4. The array substrate of claim 1, wherein the plurality of anodes comprise a first respective anode of a subpixel of a first color and a second respective anode of a subpixel of a second color;

an orthographic projection of the first respective anode on the base substrate is at least 90% covered by an orthographic projection of a respective voltage supply line of the plurality of voltage supply lines on the base substrate; and an orthographic projection of the second respective anode on the base substrate is at least 90% covered by an orthographic projection of the respective voltage supply line of the plurality of voltage supply lines on the base substrate.

5. The array substrate of claim 4, wherein an orthographic projection of an effective light emission area of the subpixel of the first color on the base substrate is completely covered by an orthographic projection of a respective voltage supply line of the plurality of voltage supply lines on the base substrate.

6. The array substrate of claim 1, wherein the plurality of voltage supply lines comprise a first adjacent voltage supply line and a second adjacent voltage supply line;

the plurality of data lines comprise a first adjacent data line and a second adjacent data line;

the first adjacent voltage supply line comprises a first main body and a first branch extending away from the first main body;

the second adjacent voltage supply line comprises a second main body and a second branch extending away from the second main body;

the first main body, the first branch, the first adjacent data line, the second adjacent data line, the second branch, and the second main body are sequentially arranged along a second direction; and the orthographic projection of the third respective anode on the base substrate partially overlaps with orthographic projections of the first main body, the first branch, the first adjacent data line, the second adjacent data line, the second branch, and the second main body on the base substrate.

7. The array substrate of claim 1, wherein an orthographic projection of the plurality of light transmissive apertures on the base substrate is substantially non-overlapping with orthographic projections of semiconductor material layers and conductive layers of the array substrate.

8. The array substrate of claim 7, comprising, in a region surrounding a respective light transmissive aperture of the plurality of light transmissive apertures, a first main body of a first adjacent voltage supply line, a first adjacent data line, a second adjacent data line, a second main body of a second adjacent voltage supply line, sequentially arranged;

wherein the respective light transmissive apertures is in a region surrounded by a respective second reset signal line, the first adjacent data line, and the second adjacent data line; and an orthographic projection of the respective second reset signal line on the base substrate partially overlaps with each of orthographic projections of the first main body, the first adjacent data line, the second adjacent data line, and the second main body on the base substrate.

9. The array substrate of claim 1, wherein corresponding layers of a first pixel driving circuit and corresponding layers of a second pixel driving circuit directly adjacent to each other and in a same row have a substantially mirror symmetry with respect to each other about a plane perpendicular to a main surface of the array substrate and substantially parallel to extension directions of a plurality of data lines.

10. A display apparatus, comprising the array substrate of claim 1, and one or more integrated circuits connected to the array substrate.

11. An array substrate, comprising:

a second signal line layer on a base substrate;

an anode layer on a side of the second signal line layer away from the base substrate;

a pixel definition layer on a side of the anode layer away from the second signal line layer;

a plurality of light transmissive apertures extending through the pixel definition layer, the plurality of light transmissive apertures spaced apart from each other; and a first conductive layer comprising a plurality of second reset signal lines, the first conductive layer on a side of the second signal line layer closer to the base substrate;

wherein the second signal line layer comprises a plurality of signal lines;

at least one of the plurality of signal lines comprises a first segment extending along a first direction, and a second segment;

an orthographic projection of a central line of the first segment extending along the first direction on the base substrate intersects with an orthographic projection of at least one light transmissive aperture of the plurality of light transmissive apertures on the base substrate;

the second segment is displaced along a second direction relative to the first segment, the second direction intersecting the first direction; and an orthographic projection of the plurality of light transmissive apertures on the base substrate is substantially non-overlapping with orthographic projections of semiconductor material layers and conductive layers of the array substrate;

wherein the second signal line layer comprises a plurality of data lines;

a respective light transmissive aperture of the plurality of light transmissive apertures is in a region surrounded by two adjacent data lines of the plurality of data lines, and a respective second reset signal line of a plurality of second reset signal lines; and at least portions of orthographic projections of the two adjacent data lines on the base substrate and at least portions of orthographic projections of the respective second reset signal line on the base substrate are along an edge of an orthographic projection of the respective light transmissive aperture on the base substrate.

12. An array substrate, comprising:

a second signal line layer on a base substrate;

an anode layer on a side of the second signal line layer away from the base substrate;

a pixel definition layer on a side of the anode layer away from the second signal line layer;

a plurality of light transmissive apertures extending through the pixel definition layer, the plurality of light transmissive apertures spaced apart from each other;

wherein the second signal line layer comprises a plurality of signal lines;

at least one of the plurality of signal lines comprises a first segment extending along a first direction, and a second segment;

an orthographic projection of a central line of the first segment extending along the first direction on the base substrate intersects with an orthographic projection of at least one light transmissive aperture of the plurality of light transmissive apertures on the base substrate; and the second segment is displaced along a second direction relative to the first segment, the second direction intersecting the first direction;

wherein the display substrate further comprises:

a plurality of first reset signal lines and a plurality of second reset signal lines extending along the second direction; and a plurality of third reset signal lines and a plurality of fourth reset signal lines extending along the first direction;

wherein the plurality of third reset signal lines and the plurality of fourth reset signal lines are in a layer different from the plurality of first reset signal lines and the plurality of second reset signal lines.

13. The array substrate of claim 12, comprising a plurality of pixel driving circuits arranged in columns, including (4k−3)-th columns, (4k−2)-th columns, (4k−1)-th columns, and (4k)-th columns of K columns, K and k being positive integers, $1 \leq k \leq (K/4)$;

a respective third reset signal line of the plurality of third reset signal lines is configured to provide reset signals to a (4k−3)-th column of pixel driving circuits and a (4k−2)-th column of pixel driving circuits; and a respective fourth reset signal line of the plurality of fourth reset signal lines is configured to provide reset signals to a (4k−1)-th column of pixel driving circuits and a (4k)-th column of pixel driving circuit.

14. The array substrate of claim 13, wherein the respective third reset signal line and reset signal connecting lines of pixel driving circuits in the (4k−3)-th column and the (4k−2)-th column are part of a unitary structure; and the respective third reset signal line is electrically connected to sources electrodes of first reset transistors of pixel driving circuits in the (4k−3)-th column and the (4k−2)-th column.

15. The array substrate of claim 13, wherein the respective third reset signal line comprises multiple first parts and multiple second parts alternately arranged;

a respective first part of the multiple first parts connects two adjacent second parts of the multiple second parts together;

a respective second part of the multiple second parts connects two adjacent first parts of the multiple first parts together; and the respective first part connects two adjacent reset signal connecting lines respectively from two adjacent pixel driving circuits in the (4k−3)-th column and the (4k−2)-th column together.

16. The array substrate of claim 13, wherein the respective fourth reset signal line is electrically connected to sources electrodes of second reset transistors of pixel driving circuits in the (4k−1)-th column and the (4k)-th column; and the respective fourth reset signal line is disconnected from reset signal connecting lines of pixel driving circuits in the (4k−1)-th column and the (4k)-th column.

17. The array substrate of claim 12, wherein a respective third reset signal line of the plurality of third reset signal lines is electrically connected to the plurality of first reset signal lines, and is electrically isolated from the plurality of second reset signal lines; and a respective fourth reset signal line of the plurality of fourth reset signal lines is electrically connected to the plurality of second reset signal lines, and is electrically isolated from the plurality of first reset signal lines.

18. The array substrate of claim 12, wherein a respective third reset signal line of the plurality of third reset signal lines and a respective fourth reset signal line of the plurality of fourth reset signal lines have different line patterns.

* * * * *